(12) United States Patent
Yamazaki et al.

(10) Patent No.: US 8,787,073 B2
(45) Date of Patent: Jul. 22, 2014

(54) SIGNAL PROCESSING CIRCUIT AND METHOD FOR DRIVING THE SAME

(75) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 137 days.

(21) Appl. No.: 13/215,302

(22) Filed: Aug. 23, 2011

(65) Prior Publication Data

US 2012/0051117 A1    Mar. 1, 2012

(30) Foreign Application Priority Data

Aug. 26, 2010 (JP) .................................. 2010-189214
May 20, 2011 (JP) .................................. 2011-113178

(51) Int. Cl.
  *G11C 11/00* (2006.01)
  *G11C 14/00* (2006.01)
(52) U.S. Cl.
  CPC ........................................ *G11C 14/00* (2013.01)
  USPC .......................................................... 365/154
(58) Field of Classification Search
  CPC ........................................................ G11C 14/00
  USPC .......................................................... 365/154
  See application file for complete search history.

(56) References Cited

U.S. PATENT DOCUMENTS

| | | |
|---|---|---|
| 4,809,225 A | 2/1989 | Dimmler et al. |
| 5,731,856 A | 3/1998 | Kim et al. |
| 5,744,864 A | 4/1998 | Cillessen et al. |
| 6,294,274 B1 | 9/2001 | Kawazoe et al. |
| 6,385,120 B1 | 5/2002 | Steiss |
| 6,563,174 B2 | 5/2003 | Kawasaki et al. |
| 6,727,522 B1 | 4/2004 | Kawasaki et al. |
| 6,738,281 B2 | 5/2004 | Yokozeki |
| 6,788,567 B2 | 9/2004 | Fujimori |

(Continued)

FOREIGN PATENT DOCUMENTS

| | | |
|---|---|---|
| EP | 0 297 777 A2 | 1/1989 |
| EP | 0 530 928 A2 | 3/1993 |

(Continued)

OTHER PUBLICATIONS

European Search Report (European Patent Application No. 11179033.3-1233) dated Feb. 2, 2012 (7 pages).

(Continued)

*Primary Examiner* — Hoai V Ho
*Assistant Examiner* — Min Huang
(74) *Attorney, Agent, or Firm* — Fish & Richardson P.C.

(57) ABSTRACT

An object is to provide a signal processing circuit which can be manufactured without a complex manufacturing process and suppress power consumption. A storage element includes two logic elements (referred to as a first phase-inversion element and a second phase-inversion element) which invert a phase of an input signal and output the signal, a first selection transistor, and a second selection transistor. In the storage element, two pairs each having a transistor in which a channel is formed in an oxide semiconductor layer and a capacitor (a pair of a first transistor and a first capacitor, and a pair of a second transistor and a second capacitor) are provided. The storage element is used in a storage device such as a register or a cache memory included in a signal processing circuit.

12 Claims, 35 Drawing Sheets

(56) References Cited

U.S. PATENT DOCUMENTS

| | | | |
|---|---|---|---|
| 6,934,178 B2* | 8/2005 | Yokozeki et al. | 365/145 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,141,835 B2 | 11/2006 | Kihara | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,516,171 B2 | 4/2009 | Uehara | |
| 7,674,650 B2 | 3/2010 | Akimoto et al. | |
| 7,732,819 B2 | 6/2010 | Akimoto et al. | |
| 8,199,594 B2 | 6/2012 | Takeda | |
| 8,314,637 B2 | 11/2012 | Kato et al. | |
| 8,410,838 B2 | 4/2013 | Kato et al. | |
| 2001/0028059 A1 | 10/2001 | Emma et al. | |
| 2001/0046027 A1 | 11/2001 | Tai et al. | |
| 2002/0056838 A1 | 5/2002 | Ogawa | |
| 2002/0089471 A1 | 7/2002 | Murata et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0019460 A1 | 1/2007 | Kang et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0223275 A1* | 9/2007 | Nakajima et al. | 365/185.08 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197414 A1 | 8/2008 | Hoffman et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002044 A1 | 1/2009 | Kobayashi | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0200851 A1* | 8/2010 | Oikawa et al. | 257/43 |
| 2011/0101332 A1 | 5/2011 | Yamazaki et al. | |
| 2011/0148463 A1 | 6/2011 | Kato et al. | |
| 2011/0175081 A1 | 7/2011 | Goyal et al. | |
| 2011/0176357 A1 | 7/2011 | Koyama et al. | |
| 2012/0099360 A1 | 4/2012 | Takemura | |

FOREIGN PATENT DOCUMENTS

| | | |
|---|---|---|
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-078836 A | 3/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

(56) References Cited

OTHER PUBLICATIONS

Osada, T et al., "Development of Driver-Integrated Panel Using Amorphous In—Ga—Zn-Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium-Gallium-Zinc Oxide TFTS and Their Application for Large Size AMOLED," AM-FPD '08 Digest of Technical Papers, Jul. 2, 2008, pp. 275-278.
Park, S et al., "Challenge to Future Displays: Transparent AM-OLED Driven by Peald Grown ZNO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga-Zn-Oxide TFTS," IDW '09 : Proceedings of the 16th International Display Workshops, 2009, pp. 689-692.
Son, K et al., "42.4L: Late-News Paper: 4 Inch QVGA AMOLED Driven by the Threshold Voltage.Controlled Amorphous GIZO (Ga2O3—In2O3—ZnO) TFT," SID Digest '08 : SID International Symposium Digest of Technical Papers, May 20, 2008, vol. 39, pp. 633-636.
Takashi, M et al., "Theoretical Analyis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.
Hirao, T et al., "Novel Top-Gate Zinc Oxide Thin-Film Transistors ZNO TFTS) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.

(56) References Cited

OTHER PUBLICATIONS

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film.Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTS With a Novel Passivation Layer," SID Digest '09 : SID International Symposium Digest of Technical Papers, May 31, 2009, pp. 284-287.

Toshio Kamiya et al., "Carrier transport properties and electronic structures of amorphous oxide semiconductors: the present status," Solid State Physics, Sep. 1, 2009, vol. 44, No. 9, pp. 621-633, Agne Gijutsu Center, with full English translation.

* cited by examiner 628  450a  437

450b

453 c-axis direction charge 0 charge +1 charge 0 ab plane charge −1 charge 0

FIG. 20A    FIG. 20B
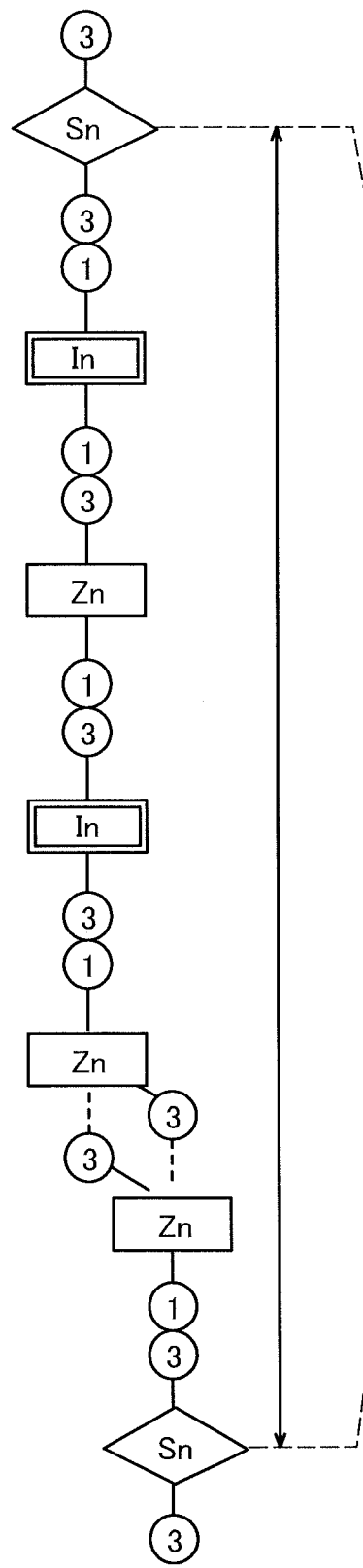
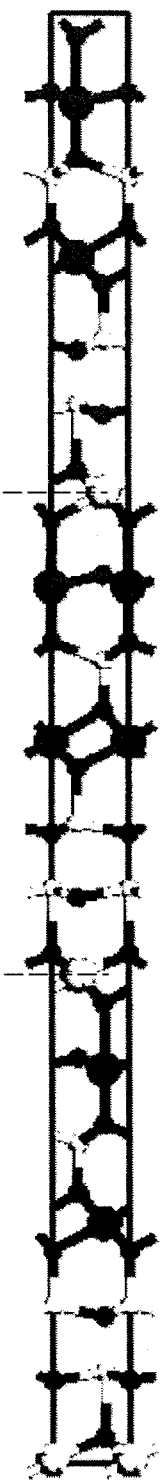
FIG. 20C
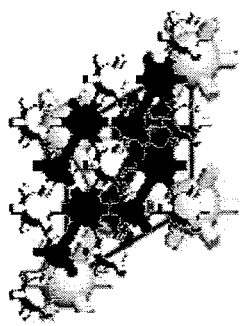
● In
☾ Sn
☽ Zn
● O

SIGNAL PROCESSING CIRCUIT AND METHOD FOR DRIVING THE SAME

BACKGROUND OF THE INVENTION

1. Field of the Invention

An embodiment of the present invention relates to a nonvolatile storage device which can keep a stored logic state even when power is turned off and also relates to a signal processing circuit including the nonvolatile storage device. Further, an embodiment of the present invention relates to methods for driving the storage device and the signal processing circuit. Furthermore, an embodiment of the present invention relates to an electronic device including the signal processing circuit.

2. Description of the Related Art

A signal processing circuit such as a central processing unit (CPU) has a variety of configurations depending on its application but is generally provided with some kinds of storage devices such as a register and a cache memory as well as a main memory for storing data or a program. A register has a function of temporarily holding data for carrying out arithmetic processing, holding a program execution state, or the like. In addition, a cache memory is located between an arithmetic circuit and a main memory in order to reduce low-speed access to the main memory and speed up the arithmetic processing.

In a storage device such as a register or a cache memory, writing of data needs to be performed at higher speed than in a main memory. Thus, in general, a flip-flop or the like is used as a register, and a static random access memory (SRAM) or the like is used as a cache memory. That is, for such a register, a cache memory, or the like, a volatile storage device in which data is erased when supply of a power voltage is stopped.

In order to reduce consumed power, a method for temporarily stopping a supply of a power-supply voltage to a signal processing circuit in a period during which data is not input and output has been suggested. In the method, a nonvolatile storage device is located in the periphery of a volatile storage device such as a register or a cache memory, so that the data is temporarily stored in the nonvolatile storage device. Thus, the register, the cache memory, or the like holds data even while a supply of power voltage is stopped in the signal processing circuit (for example, see Patent Document 1).

In addition, in the case where a supply of the power-supply voltage is stopped for a long time in a signal processing circuit, data in a volatile storage device is transferred to an external storage device such as a hard disk or a flash memory before the supply of the power-supply voltage is stopped, so that the data can be prevented from being erased.

REFERENCE

[Patent Document 1] Japanese Published Patent Application No. H10-078836

SUMMARY OF THE INVENTION

In the case where data of a volatile storage device is stored in a nonvolatile storage device located in the periphery of the volatile storage device while the supply of power-supply voltage is stopped in a signal processing circuit, such a nonvolatile storage device is mainly formed using a magnetic element or a ferroelectric; thus, the manufacturing process of the signal processing circuit is complex. In addition, in such a nonvolatile storage device, there is a limitation on the number of data rewriting operations because of deterioration of a storage element due to a repeat of writing data and erasing data.

In the case where data of the volatile storage device is stored in the external storage device while a supply of power-supply voltage is stopped in the signal processing circuit, it takes a long time for returning data from the external storage device to the volatile storage device. Therefore, back up of data using the external storage device is not suitable in the case where the power supply is stopped for a short time so as to reduce consumed power.

In view of the above-described problems, it is an object of one embodiment of the present invention to provide a signal processing circuit whose consumed power can be suppressed and a method for driving the signal processing circuit. In particular, it is an object to provide a signal processing circuit whose consumed power can be suppressed by stopping the power supply for a short time and a method for driving the signal processing circuit.

An embodiment of the present invention is a storage element including two logic elements (hereinafter, the logic elements are referred to as phase-inversion elements, i.e., a first phase-inversion element and a second phase-inversion element) which invert a phase of an input signal and output the signal, a first selection transistor, and a second selection transistor. In the storage element, two pairs each having a transistor in which a channel is formed in an oxide semiconductor layer and a capacitor (a pair of a first transistor and a first capacitor, and a pair of a second transistor and a second capacitor) are provided.

For the oxide semiconductor layer, for example, an In—Ga—Zn—O-based oxide semiconductor material can be used.

A potential of an output terminal of a first phase-inversion element is supplied to an input terminal of a second phase-inversion element via a first transistor which is on, and a potential of an output terminal of a second phase-inversion element is supplied to an input terminal of the first phase-inversion element via a second transistor which is on. One of a pair of electrodes of the first capacitor is electrically connected to the first transistor and the input terminal of the second phase-inversion element. In other words, even when the first transistor is off, the first capacitor holds the potential of the input terminal of the second phase-inversion element. One of a pair of electrodes of the second capacitor is electrically connected to the second transistor and the input terminal of the first phase-inversion element. In other words, even when the second transistor is off, the second capacitor holds the potential of the input terminal of the first phase-inversion element.

A constant potential is supplied to the other electrode of the first capacitor and the other electrode of the second capacitor. For example, a reference potential (GND) is supplied.

A potential of a signal (data) input to the storage element is supplied to the input terminal of the first phase-inversion element via the first selection transistor and the second transistor which are on. A potential of the output terminal of the first phase-inversion element is output as an output signal of the storage element via the second selection transistor which is on.

The first transistor and the second transistor are controlled so that when one of the transistors is on, the other is also on. For example, in the case where the first transistor and the second transistor have the same conductivity, a first control signal input to a gate of the first transistor and a second control signal input to a gate of the second transistor are the same signal.

In the above storage element, in the case where in order to reduce consumed power in data holding, after a supply of power-supply voltage, the supply of the power-supply voltage is stopped and then the power-supply voltage is supplied again, a driving method can be as follows.

First, the case where the power-supply voltage is supplied to the storage element is described. That is, the case where the power-supply voltage is supplied to the first phase-inversion element and the second phase-inversion element is described. The first selection transistor is turned on in the state where the first transistor and the second transistor are on. Thus, the input signal (data) is input to the input terminal of the first phase-inversion element. Then, the first selection transistor is turned off, whereby the data is held by a feedback loop formed with the first phase-inversion element and the second phase-inversion element. The potential of the input terminal of the second phase-inversion element is held by the first capacitor, and the potential of the input terminal of the first phase-inversion element is held by the second capacitor. Note that the second transistor is off while the data is being input and held. The second transistor is turned on after the holding data is completed, whereby the data can be read out from the storage element.

The case where the supply of power-supply voltage to the storage element is stopped after the data holding is completed is described. That is, the case where the supply of the power-supply voltage to the first phase-inversion element and the second phase-inversion element is described. Before the supply of the power-supply voltage is stopped, the first transistor and the second transistor are turned off. Here, the potential of the input terminal of the second phase-inversion element is held by the first capacitor, and the potential of the input terminal of the first phase-inversion element is held by the second capacitor. Therefore, even when the supply of the power-supply voltage to the first phase-inversion element and the second phase-inversion element is stopped, data can be continuously held in the storage element. While the supply of the power-supply voltage to the first phase-inversion element and the second phase-inversion element is stopped, the first transistor and the second transistor are off. During the period where the supply of the power-supply voltage to the first phase-inversion element and the second phase-inversion element is stopped, an output signal cannot be output from the storage element, and another input signal (data) cannot be input to nor held in the storage element.

Next, the case where the power-supply voltage is supplied to the storage element again is described. After the power-supply voltage is supplied to the first phase-inversion element and the second phase-inversion element, the first transistor and the second transistor are turned on. Thus, the storage element is in a state where an output signal can be output and another input signal (data) can be held.

That is the driving method of the above storage element in the case where the supply of the power-supply voltage is stopped in order to reduce power consumed in data holding after the supply of the power-supply voltage, and then the power-supply voltage is supplied again.

Note that as the first phase-inversion element and the second phase-inversion element, for example, an inverter, a clocked inverter, or the like can be used.

The above storage element is used for a storage device included in the signal processing circuit. The storage device can be formed with at least one storage element. For example, the above storage element is used for a storage device such as a register or a cache memory included in the signal processing circuit.

Further, the signal processing circuit may include some kinds of logic circuits such as an arithmetic circuit which transmits/receives data to/from the storage device in addition to the storage device. Not only the supply of power-supply voltage to the storage device but also the supply of power-supply voltage to the arithmetic circuit which transmits/receives data to/from the storage device may be stopped.

The storage device may have a switching element which controls the supply of power-supply voltage to a storage element. In the case where the supply of power-supply voltage to the arithmetic circuit is stopped, the arithmetic circuit may include a switching element which controls the supply of power-supply voltage.

The off-state current of a transistor in which a channel is formed in an oxide semiconductor layer is extremely low. For example, the off-state current of the transistor in which a channel is formed in an oxide semiconductor layer is significantly lower than that of a transistor in which a channel is formed in silicon having crystallinity. Thus, when the transistor including an oxide semiconductor is used for the first transistor and the second transistor, potentials held in the first capacitor and the second capacitor are held while the power-supply voltage is not supplied to the storage element. The storage element can accordingly hold the stored content while the supply of the power-supply voltage is stopped.

In the storage element, even while the supply of power-supply voltage is stopped, a potential of the input terminal of the second phase-inversion element is held by the potential held in the first capacitor, and a potential of the input terminal of the first phase-inversion element is held by the potential held in the second capacitor. That is, both the potential of the input terminal of the first phase-inversion element and the potential of the input terminal of the second phase-inversion element are held.

On the other hand, for example, the case where the storage element includes the first capacitor and the first transistor but does not include the second capacitor and the second transistor is considered. That is, the case where the output terminal of the second phase-inversion element is directly connected to the input terminal of the first phase-inversion element is considered. In such a structure, the potential of the input terminal of the second phase-inversion element is held by the potential held in the first capacitor, but the potential of the input terminal of the first phase-inversion element is not held. Thus, by turning the first transistor on after a supply of the power-supply voltage is resumed, electric charges transfer so that the potential of the input terminal of the first phase-inversion element is set to a predetermined potential (a potential determined by an output of the second phase-inversion element). The storage element cannot output data until transfer of the electric charges is completed. Thus, a time elapsing before the storage element can output data again (hereinafter, referred to as a rising time) is long. That is, it takes a long time for the storage element to return to the state same as that before the supply of the power is stopped.

In the storage element according to the present invention, while the supply of the power-supply voltage is stopped, both the potential of the input terminal of the first phase-inversion element and the potential of the input terminal of the second phase-inversion element are held. Thus, when the first transistor and the second transistor are turned on after the supply of the power-supply voltage to the storage element is resumed, the electrical charges do not need to transfer so that the potential of the input terminal of the second phase-inversion element and the potential of the input terminal of the first phase-inversion element are to be the predetermined potential, and accordingly the rising time can be short.

By applying such a storage element to a storage device such as a register or a cache memory included in a signal processing circuit, data in the storage device can be prevented from being erased owing to the stop of the supply of the power-supply voltage. In addition, after the supply of the power-supply voltage is resumed, the storage element can return to the state same as that before the power-supply voltage is stopped in a short time. Therefore, the power supply can be stopped even for a short time in the signal processing circuit or one or a plurality of logic circuits included in the signal processing circuit. Accordingly, it is possible to provide a signal processing circuit whose consumed power can be suppressed and a method for driving the signal processing circuit whose consumed power can be suppressed.

BRIEF DESCRIPTION OF THE DRAWINGS

FIGS. 20A to 20C illustrate a structure of an oxide material.

DETAILED DESCRIPTION OF THE INVENTION

Figure 1A:
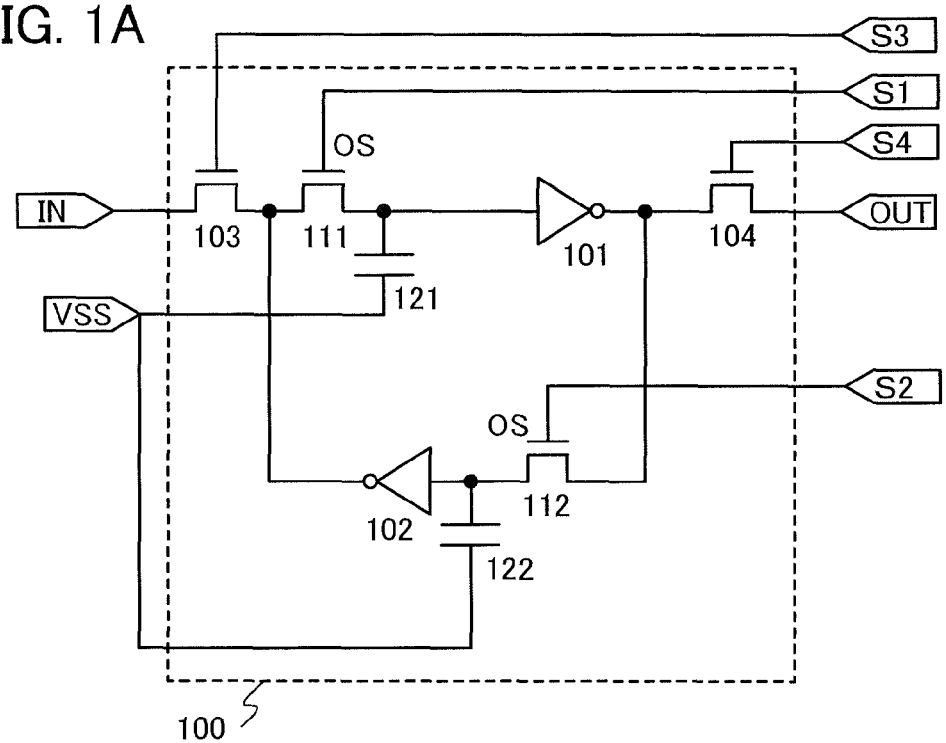
FIGS. 1A and 1B are circuit diagrams of a storage element.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Note that functions of the "source" and "drain" may be switched in the case where transistors of different polarities are employed or in the case where the direction of a current flow changes in a circuit operation, for example. Therefore, the terms "source" and "drain" can be used to denote the drain and the source, respectively, in this specification.

Note that in this specification and the like, the term "electrically connected" includes the case where components are connected through an "object having any electric function". There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In addition, even when a circuit diagram shows independent components as if they are electrically connected to each other, there is actually a case where one conductive film has functions of a plurality of components such as a case where part of a wiring also functions as an electrode. The "electrical connection" in this specification includes in its category such a case where one conductive film has functions of a plurality of components.

In this specification and the like, the terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

Note that the position, size, range, or the like of each component illustrated in drawings and the like is not accurately represented in some cases for easy understanding.

Therefore, the disclosed invention is not necessarily limited to the position, size, range, or the like as disclosed in the drawings and the like.

The ordinal number such as "first", "second", and "third" are used in order to avoid confusion among components.

Embodiment 1

A signal processing circuit includes a storage device. The storage device includes one or a plurality of storage elements which can store 1-bit data.

Note that a CPU, a large scale integrated circuit (LSI) such as a microprocessor, an image processing circuit, a digital signal processor (DSP), or a field programmable gate array (FPGA), and the like are included in the signal processing circuit of the preset invention in its category.

FIG. 1A illustrates an example of a circuit diagram of a storage element. A storage element 100 illustrated in FIGS. 1A and 1B includes a phase-inversion element 101 and a phase-inversion element 102 each of which inverts a phase of an input signal and outputs the signal, a selection transistor 103, a selection transistor 104, a transistor 111, a transistor 112, a capacitor 121, and a capacitor 122. In each of the transistor 111 and the transistor 112, a channel is formed in an oxide semiconductor layer. Note that the storage element 100 may further include another circuit element such as a diode, a resistor, or an inductor, as needed. In the circuit diagram of FIG. 1A, "OS" is written beside a transistor in order to indicate that the transistor 111 and the transistor 112 have a structure in which a channel is formed in an oxide semiconductor layer.

A signal IN including data input to the storage element 100 is supplied to an input terminal of the phase-inversion element 101 via the selection transistor 103 and the transistor 111 which are on. Further, the potential of an output terminal of the phase-inversion element 101 is output as an output signal OUT of the storage element via the selection transistor 104 which is on. The signal OUT is output to a storage element of a subsequent stage or another circuit.

The potential of the output terminal of the phase-inversion element 101 is supplied to an input terminal of the phase-inversion element 102 via the transistor 112 which is on, and the potential of an output terminal of the phase-inversion element 102 is supplied to the input terminal of the phase-inversion element 101 via the transistor 111 which is on. One of a pair of electrodes of the capacitor 122 is electrically connected to the transistor 112 and the input terminal of the phase-inversion element 102. In other words, even when the transistor 112 is off, the capacitor 122 holds the potential of the input terminal of the phase-inversion element 102. One of a pair of electrodes of the capacitor 121 is electrically connected to the transistor 111 and the input terminal of the phase-inversion element 101. In other words, even when the transistor 111 is off, the capacitor 121 holds the potential of the input terminal of the phase-inversion element 101.

Note that the other electrode of the capacitor 121 and the other electrode of the capacitor 122 are supplied with the constant potential VSS. For example, the potential VSS can be the reference potential (GND).

A control signal S1 is input to a gate of the transistor 111, a control signal S2 is input to a gate of the transistor 112, a control signal S3 is input to a gate of the selection transistor 103, and a control signal S4 is input to a gate of the selection transistor 104. For example, in the case where the transistor 111 and the transistor 112 have the same conductivity, the control signal S1 and the control signal S2 can be the same signal. That is, the transistor 111 and the transistor 112 are controlled so that when one of them is on, the other is also on.

Note that FIG. 1A illustrates an example in which inverters are used as the phase-inversion element 101 and the phase-inversion element 102. However, any of elements may be employed as the phase-inversion element 101 and the phase-inversion element 102 as long as the element inverts a phase of an input signal and outputs the signal. A clocked inverter or the like can be used.

Figure 1B:
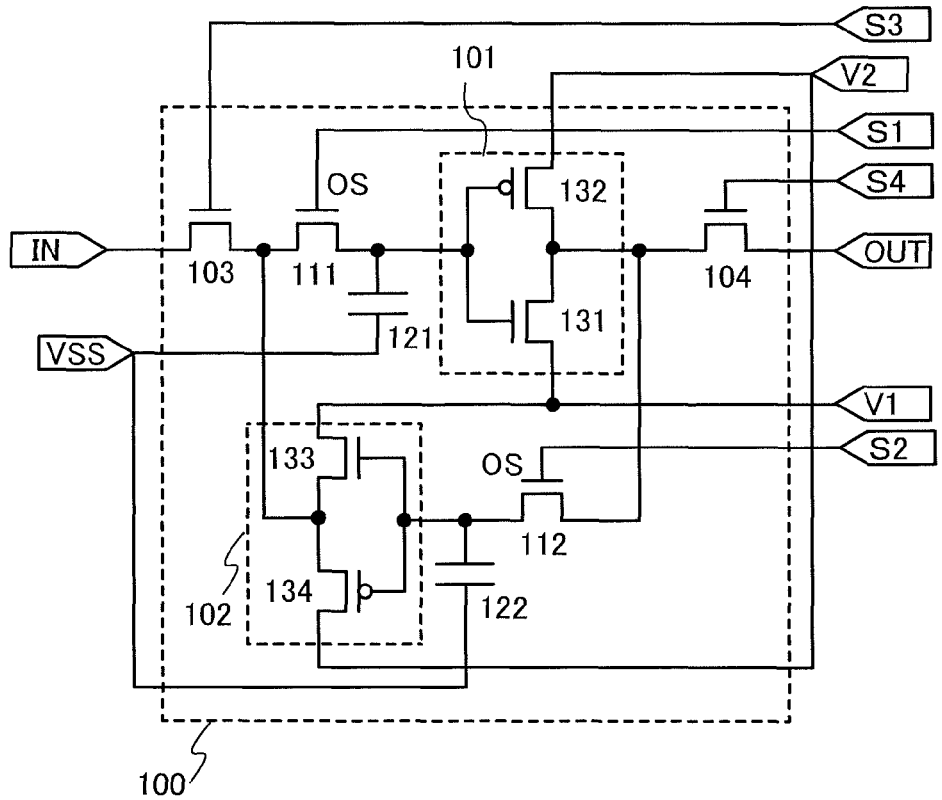

FIG. 1B illustrates an example in which inverters including an n-channel transistor and a p-channel transistor are used as the phase-inversion element 101 and the phase-inversion element 102 of FIG. 1A. The phase-inversion element 101 includes an n-channel transistor 131 and a p-channel transistor 132, and the phase-inversion element 102 includes an n-channel transistor 133 and a p-channel transistor 134.

A potential V1 is supplied to one of a source and a drain of the n-channel transistor 131, and a potential V2 is supplied to one of a source and a drain of the p-channel transistor 132. The other of the source and the drain of the n-channel transistor 131 and the other of the source and the drain of the p-channel transistor 132 are electrically connected to each other. A gate of the n-channel transistor 131 and a gate of the p-channel transistor 132 are the input terminal of the phase-inversion element 101. The other of the source and the drain of the n-channel transistor 131 and the other of the source and the drain of the p-channel transistor 132 are the output terminal of the phase-inversion element 101.

The potential V1 is supplied to one of a source and a drain of the n-channel transistor 133, and the potential V2 is supplied to one of a source and a drain of the p-channel transistor 134. The other of the source and the drain of the n-channel transistor 133 and the other of the source and the drain of the p-channel transistor 134 are electrically connected to each other. A gate of the n-channel transistor 133 and a gate of the p-channel transistor 134 are the input terminal of the phase-inversion element 102. The other of the source and the drain of the n-channel transistor 133 and the other of the source and the drain of the p-channel transistor 134 are the output terminal of the phase-inversion element 102.

In the phase-inversion element 101 and the phase-inversion element 102, when the power-supply voltage is supplied, the potential V2 is higher than the potential V1. The difference between the potential V1 and the potential V2 is the power-supply voltage of the phase-inversion element 101 and the phase-inversion element 102. For example, in the phase-inversion element 101 and the phase-inversion element 102, when the power-supply voltage is supplied, the potential V2 can be the potential VDD, and the potential V1 can be the potential VSS. Further, the potential VSS can be the reference potential (GND). On the other hand, in the phase-inversion element 101 and the phase-inversion element 102, when the supply of the power-supply voltage is stopped, the stop of supply corresponds to the case where supply of one of the potential V1 and the potential V2 or the both is stopped, for example. Alternatively, the stop of supply corresponds to the case where both the potential V1 and the potential V2 are the reference potential (GND), for example.

Further, in one embodiment of the present invention, at least the transistor 111 and the transistor 112 are transistors in which a channel is formed in an oxide semiconductor layer. Thus, the selection transistor 103, the selection transistor 104, the transistors used in the phase-inversion element 101 and the phase-inversion element 102 can be transistors in which a channel is formed in a semiconductor layer or a semiconductor substrate including a semiconductor other than an oxide semiconductor. For the oxide semiconductor layer, for example, an In—Ga—Zn—O-based oxide semiconductor material can be used. A semiconductor other than an oxide semiconductor can be an amorphous semiconductor, a microcrystalline semiconductor, a polycrystalline semiconductor, or a single crystal semiconductor. Silicon or germanium can be used.

The transistors used as the transistor 111 and the transistor 112 can be transistors in which a channel is formed in a highly purified oxide semiconductor layer.

The off-state current density of such a transistor can be less than or equal to 100 zA/μm, preferably less than or equal to 10 zA/μm, further preferably less than or equal to 1 zA/μm. Thus, the off-state current of the transistor is extremely lower than that of the transistor including silicon with crystallinity. As a result, when the transistor 111 and the transistor 112 are off, the electric charges stored in the capacitor 121 and the capacitor 122 are hardly discharged, and thus the data of the storage element 100 can be held.

A material which can realize the off-state current characteristics equivalent to those of the oxide semiconductor material, such as a wide gap material like silicon carbide (more specifically, a semiconductor material with an energy gap Eg of greater than 3 eV) may be used instead of the oxide semiconductor material.

Next, an example of the operation of the storage element 100 illustrated in FIGS. 1A and 1B is described. Is described the operation of the storage element 100 in the case where after the power-supply voltage is supplied, the supply of the power supply voltage is stopped in order to reduce power consumed in data holding and then the power-supply voltage is supplied again, with reference to a timing chart of FIG. 2.

Note that the timing chart shows, as an example, the case where all of the selection transistor 103, the selection transistor 104, the transistor 111, and the transistor 112 are n-channel transistors. In addition, an example in which the transistors are turned on when a high-level potential is input to the gates, and the transistors are turned off when the low-level potential is input to the gates. However, the operation of the storage element is not limited to the above. The selection transistor 103, the selection transistor 104, the transistor 111, and the transistor 112 may be n-channel transistors or p-channel transistors. A potential of each signal may be determined so that states of the transistors (the on state or the off state) are similar to those in the following description.

An example in which the case where the signal IN is at high level corresponds to data "1" and the case where the signal IN is at low level corresponds to data "0" is shown; however, the data is not limited to the above. The case where the signal IN is at low level may correspond to data "1", and the case where the signal IN is at high level may correspond to data "0".

First, the case where a power-supply voltage (indicated as V in FIG. 2) is supplied to the storage element 100 is described. That is, the case where the power-supply voltage is supplied to the phase-inversion element 101 and the phase-inversion element 102 is described. This case corresponds to a period 1 in FIG. 2. The control signal S1 and the control signal S2 are set to a high level, and the transistor 111 and the transistor 112 are on. In that state, the control signal S3 is set to a high level, whereby the selection transistor 103 is turned on. Thus, the signal IN is input to the input terminal of the phase-inversion element 101. The signal IN has a potential corresponding to data stored while the selection transistor 103 is on (that is, while the control signal S3 is at high level). Here, for example, the potential is a high-level potential corresponding to data "1". Such a high-level potential is input to the input terminal of the phase-inversion element 101. Then, the control signal S3 is set to a low level, and the selection transistor 103 is turned off, whereby the input data is held by a feedback loop formed with the phase-inversion element 101 and the phase-inversion element 102. The potential of the input terminal of the phase-inversion element 102 is held in the capacitor 122, and the potential of the input terminal of the phase-inversion element 101 is held in the capacitor 121. Note that while the data is being input and held, the control signal S4 is at low level, and the selection transistor 104 is off. After the holding data is completed, the control signal S4 is set to a high level, and the selection transistor 104 is turned on, whereby the signal OUT is output. The data held by the phase-inversion element 101 and the phase-inversion element 102 is reflected to the signal OUT. Therefore, by reading the potential of the signal OUT, the data can be read out from the storage element 100. In the period 1 of the timing chart in FIG. 2, the data "1" is held by the phase-inversion element 101 and the phase-inversion element 102; thus, while the control signal S4 is at high level and the selection transistor 104 is on, the signal OUT is at low level.

Next, the case where after the holding data is completed, the supply of the power-supply voltage to the storage element 100 is stopped in order to reduce power consumed in the data holding is described. That is, the case where the supply of the power-supply voltage to the phase-inversion element 101 and the phase-inversion element 102 is stopped is described. This case corresponds to a period 2 in FIG. 2.

Figure 2:
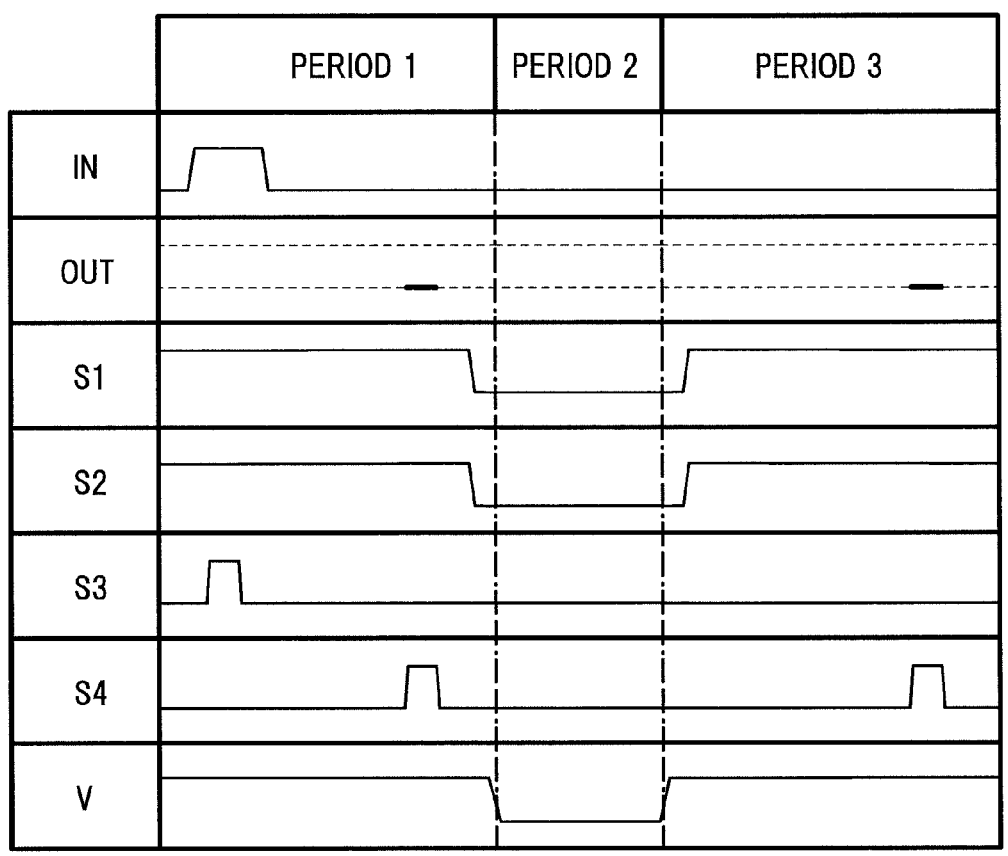
FIG. 2 is a timing chart showing the operation of a storage element.

Before the supply of the power-supply voltage is stopped, the control signal S1 and the control signal S2 are set to a low level, and the transistor 111 and the transistor 112 are turned off (see an instant before the period 2 of FIG. 2). Since the off-state currents of the transistor 111 and the transistor 112 are extremely low, the potential of the input terminal of the phase-inversion element 102 is held in the capacitor 122, and the potential of the input terminal of the phase-inversion element 101 is held in the capacitor 121. Thus, even when the supply of the power-supply voltage to the phase-inversion element 101 and the phase-inversion element 102 is stopped, the storage element 100 can continuously hold data. While the supply of the power-supply voltage to the phase-inversion element 101 and the phase-inversion element 102 is stopped, the control signal S1 and the control signal S2 are at low level, and the transistor 111 and the transistor 112 are off. While the supply of the power-supply voltage to the phase-inversion element 101 and the phase-inversion element 102 is stopped, the signal OUT cannot be output from the storage element 100, and another signal IN cannot be input to nor held in the storage element 100.

Note that when the supply of the power-supply voltage to the storage element 100 is stopped, the transistor 111 and the transistor 112 should be turned off before the supply of the power-supply voltage to the storage element 100 is stopped. If the transistor 111 and the transistor 112 were turned off after the supply of the power-supply voltage to the storage element 100 is stopped, the following problem occurs. By the stop of the supply of the power-supply voltage to the storage element 100, data cannot be held by the feedback loop formed with the phase-inversion element 101 and the phase-inversion element 102. Thus, when the transistor 111 and the transistor 112 are turned off after the supply of the power-supply voltage to the storage element 100 is stopped, data cannot be held in the capacitor 121 and the capacitor 122. Therefore, in the case where the supply of the power-supply voltage to the storage element 100 is stopped, the transistor 111 and the transistor 112 should be turned off before the supply of the power-supply voltage to the storage element 100 is stopped.

Note that FIG. 2 shows the example in which operation of the period 2 is performed after data is held in the storage element 100 and the data is read out in the period 1 is shown; however, the operation is not limited thereto. Data is held in the storage element 100 in the period 1, and the operation of the period 2 is performed before the data is read out.

Next, the case where the power-supply voltage is supplied to the storage element again is described. This case corresponds to a period 3 in FIG. 2. After the power-supply voltage is supplied to the phase-inversion element 101 and the phase-inversion element 102, the control signal S1 and the control signal S2 are set to a high level, and the transistor 111 and the transistor 112 are turned on. The potential of the input terminal of the phase-inversion element 102 is held in the capacitor 122, and the potential of the input terminal of the phase-inversion element 101 is held in the capacitor 121; thus, a state same as that before the supply of the power-supply voltage to the storage element is stopped can be provided. Here, by setting the control signal S4 to a high level, the signal OUT is at low level. In such a manner, even when the supply of the power-supply voltage to the storage element is stopped, data can be held. After that, by operation similar to the operation in the period 1, data can be input, held, and output.

Note that in the case where the supply of the power-supply voltage to the storage element 100 is resumed, the transistor 111 and the transistor 112 should be turned on after the supply of the power-supply voltage to the storage element 100 is resumed. If the transistor 111 and the transistor 112 were turned on before the supply of the power-supply voltage to the storage element 100 is resumed, the following problem occurs. Since the supply of the power-supply voltage to the storage element 100 is not resumed even if the transistor 111 and the transistor 112 were turned on, data cannot be held by the feedback loop formed with the phase-inversion element 101 and the phase-inversion element 102. Thus, in the case where the supply of the power-supply voltage to the storage element 100 is resumed, the transistor 111 and the transistor 112 should be turned on after the supply of the power-supply voltage to the storage element 100 is resumed.

The above is the driving method of the storage element 100 in the case where the power-supply voltage is supplied, the supply of the power-supply voltage is stopped, and the power-supply voltage is supplied again.

The off-state current of the transistor in which a channel is formed in an oxide semiconductor layer is extremely low. For example, the off-state current of the transistor in which a channel is formed in an oxide semiconductor layer is significantly lower than that of a transistor in which a channel is formed in silicon having crystallinity. Thus, when such a transistor including an oxide semiconductor is used for the first transistor 111 and the second transistor 112, potentials held in the capacitor 121 and the capacitor 122 are held while the power-supply voltage is not supplied to the storage element 100. The storage element 100 can accordingly hold the stored content while the supply of the power-supply voltage is stopped.

In the storage element 100, even while the supply of the power-supply voltage is stopped, the potential of the input terminal of the phase-inversion element 102 is held by the potential held in the capacitor 122, and the potential of the input terminal of the phase-inversion element 101 is held by the potential held in the capacitor 121. That is, both the potential of the input terminal of the phase-inversion element 101 and the potential of the input terminal of the phase-inversion element 102 are held.

On the other hand, for example, the case where the storage element 100 includes the capacitor 122 and the transistor 112 but does not include the capacitor 121 and the transistor 111 is considered. That is, the case where the output terminal of the phase-inversion element 102 is directly connected to the input terminal of the phase-inversion element 101 is considered. In such a structure, the potential of the input terminal of the phase-inversion element 102 is held by the potential held in the capacitor 122, but the potential of the input terminal of the phase-inversion element 101 is not held. Thus, by turning the transistor 112 on after the supply of the power-supply voltage to the storage element 100 is resumed, electric charges transfer so that the potential of the input terminal of the phase-inversion element 101 is set to a predetermined potential (a potential determined by an output of the phase-inversion element 102). The storage element 100 cannot output data until transfer of the electric charges is completed. Thus, a time elapsing before the storage element 100 can output data again (hereinafter, referred to as a rising time) is long. That is, it takes a long time to for the storage element to return to the state same as that before the supply of the power is stopped.

With the structures illustrated in FIGS. 1A and 1B, the storage element 100 holds both the potential of the input terminal of the phase-inversion element 101 and the potential of the input terminal of the phase-inversion element 102 even after the supply of the power-supply voltage is stopped. Thus, when the transistor 111 and the transistor 112 are turned on after the supply of the power-supply voltage to the storage element 100 is resumed, electric charges do not need to transfer so that the potential of the input terminal of the phase-inversion element 102 and the potential of the input terminal of the phase-inversion element 101 are to be the predetermined potential, and accordingly the rising time can be short.

This embodiment can be combined as appropriate with any of the other embodiments.

Embodiment 2

In this embodiment, a structure of a storage device including a plurality of storage elements described in Embodiment 1 will be described.

Figure 3A:
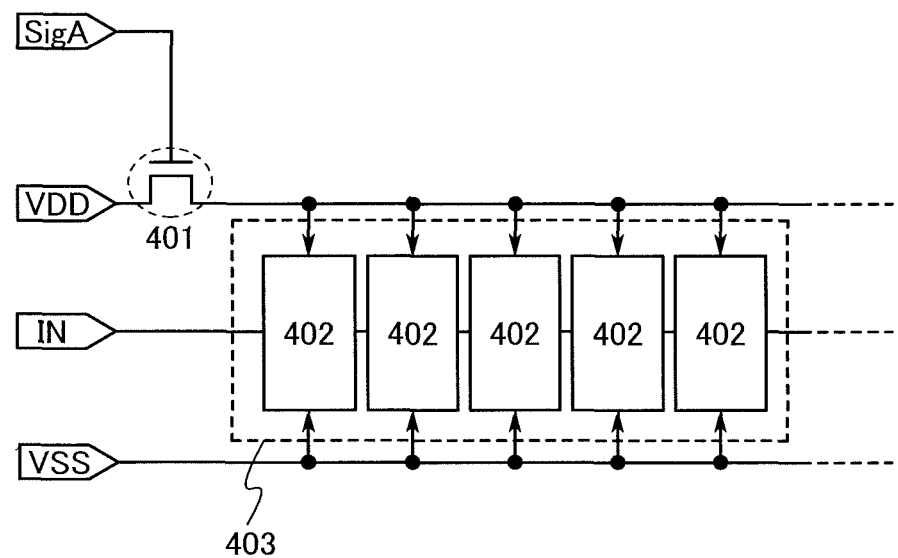
FIGS. 3A and 3B each illustrate a structure of a storage device.

FIG. 3A illustrates a structural example of a storage device of this embodiment. The storage device illustrated in FIG. 3A includes a switching element 401 and a storage element group 403 including a plurality of storage elements 402. Specifically, as each of the storage elements 402, the storage element 100 whose structure is described in Embodiment 1 can be used. Each of the storage elements 402 included in the storage element group 403 is supplied with the high-level power supply potential VDD via the switching element 401. Further, each of the storage elements 402 included in the storage element group 403 is supplied with a potential of the signal IN and the low-level power supply potential VSS.

In FIG. 3A, a transistor is used for the switching element 401, and the switching of the transistor is controlled by a control signal Sig A supplied to a gate electrode thereof.

Note that in FIG. 3A, a structure in which the switching element 401 includes only one transistor is illustrated; however, the present invention is not limited to this structure. In one embodiment of the present invention, the switching element 401 may include a plurality of transistors. In the case where the plurality of transistors which serve as switching elements are included in the switching element 401, the plurality of transistors may be electrically connected to each other in parallel, in series, or in combination of parallel connection and series connection.

Figure 3B:
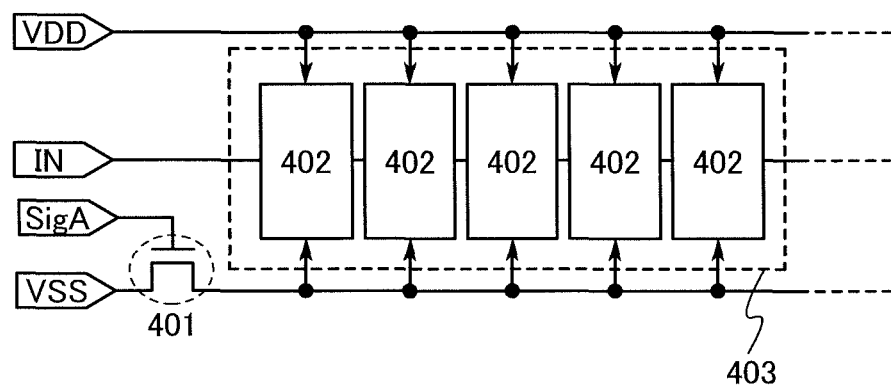

Although the switching element 401 controls the supply of the high-level power supply potential VDD to each of the storage elements 402 included in the storage element group 403 in FIG. 3A, the switching element 401 may control the supply of the low-level power supply potential VSS. In FIG. 3B, an example of a storage device in which each of the storage elements 402 included in the storage element group 403 is supplied with the low-level power supply potential VSS via the switching element 401 is illustrated. The supply of the low-level power supply potential VSS to each of the storage elements 402 included in the storage element group 403 can be controlled by the switching element 401.

This embodiment can be combined as appropriate with any of the other embodiments.

Embodiment 3

In this embodiment, a structure of a signal processing circuit including the storage device described in Embodiment 2 or the storage element described in Embodiment 1 will be described.

Figure 4:
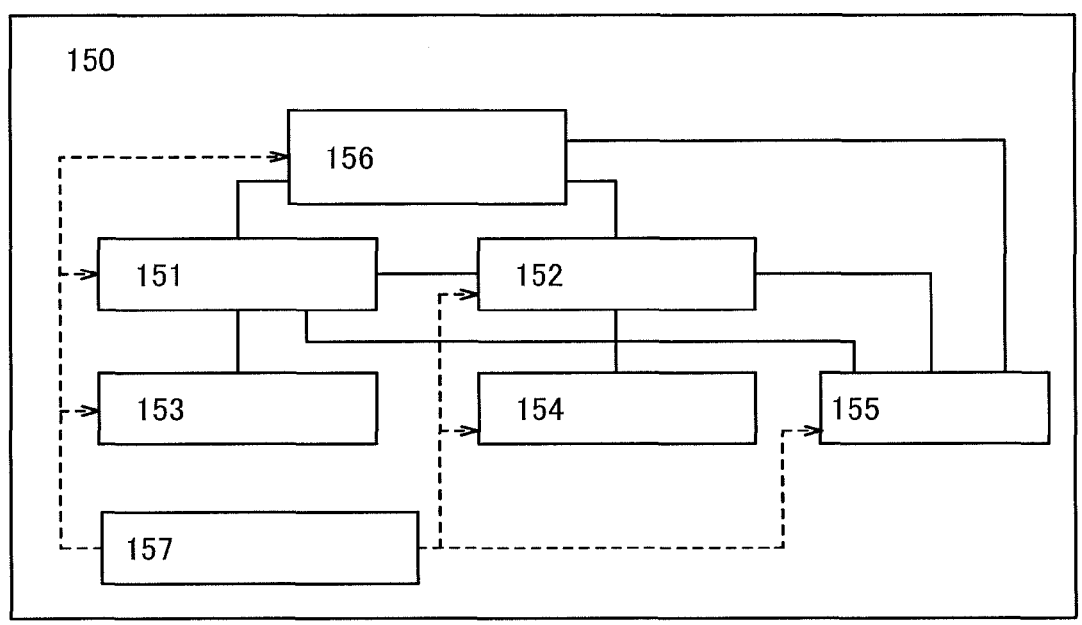
FIG. 4 is a block diagram of a signal processing circuit.

FIG. 4 illustrates an example of a signal processing circuit according to an embodiment of the present invention. The signal processing circuit at least includes one or a plurality of arithmetic circuits and one or a plurality of storage devices. Specifically, a signal processing circuit 150 illustrated in FIG. 4 includes an arithmetic circuit 151, an arithmetic circuit 152, a storage device 153, a storage device 154, a storage device 155, a control device 156, and a power supply control circuit 157.

The arithmetic circuits 151 and 152 each include, as well as a logic circuit which carries out simple logic arithmetic processing, an adder, a multiplier, and various arithmetic circuits. The storage device 153 functions as a register for temporarily holding data when the arithmetic processing is carried out in the arithmetic circuit 151. The storage device 154 functions as a register for temporarily holding data when the arithmetic processing is carried out in the arithmetic circuit 152.

In addition, the storage device 155 can be used as a main memory and can store a program executed by the control device 156 as data or can store data from the arithmetic circuit 151 and the arithmetic circuit 152.

The control device 156 is a circuit which collectively controls operations of the arithmetic circuit 151, the arithmetic circuit 152, the storage device 153, the storage device 154, and the storage device 155 included in the signal processing circuit 150. Note that in FIG. 4, a structure in which the control device 156 is provided in the signal processing circuit 150 as a part thereof is illustrated, but the control device 156 may be provided outside the signal processing circuit 150.

By using the storage element described in Embodiment 1 or the storage device described in Embodiment 2 for the storage device 153, the storage device 154, and the storage device 155, data can be held even when the supply of power-supply voltage to the storage device 153, the storage device 154, and the storage device 155 is stopped.

In the above manner, the supply of the power-supply voltage to the entire signal processing circuit 150 can be stopped, whereby power consumption can be suppressed. Alternatively, the supply of the power-supply voltage to one or a plurality of the storage device 153, the storage device 154, and the storage device 155 can be stopped, whereby power consumed by the signal processing circuit 150 can be suppressed. After the supply of the power-supply voltage is resumed, a state same as that before the supply of power is stopped can be provided for a short time.

In addition, as well as stop of the supply of the power-supply voltage to the storage device, the supply of the power-supply voltage to the control circuit or the arithmetic circuit which transmits/receives data to/from the storage device may be stopped. For example, when the arithmetic circuit 151 and the storage device 153 do not operate, the supply of the power-supply voltage to the arithmetic circuit 151 and the storage device 153 may be stopped.

In addition, the power supply control circuit 157 controls the level of the power-supply voltage which is supplied to the arithmetic circuit 151, the arithmetic circuit 152, the storage device 153, the storage device 154, the storage device 155, and the control device 156 included in the signal processing circuit 150. Further, in the case where the supply of the power-supply voltage is stopped, a switching element for stopping the supply of the power-supply voltage may be provided for the power supply control circuit 157, or for each of the arithmetic circuit 151, the arithmetic circuit 152, the storage device 153, the storage device 154, the storage device 155, and the control device 156. In the latter case, the power supply control circuit 157 is not necessarily provided in the signal processing circuit according to the present invention.

A storage device which functions as a cache memory may be provided between the storage device 155 that is a main memory and each of the arithmetic circuit 151, the arithmetic circuit 152, and the control device 156. By providing the cache memory, low-speed access to the main memory can be reduced and the speed of the signal processing such as arithmetic processing can be higher. By applying the above-described storage element also to the storage device functioning as a cache memory, power consumption of the signal processing circuit 150 can be suppressed. Further, after the supply of the power-supply voltage is resumed, a state same as that before the supply of power is stopped can be provided for a short time.

This embodiment can be combined as appropriate with any of the other embodiments.

Embodiment 4

In this embodiment, a configuration of a CPU, which is one of signal processing circuits according to one embodiment of the present invention, will be described.

Figure 5:
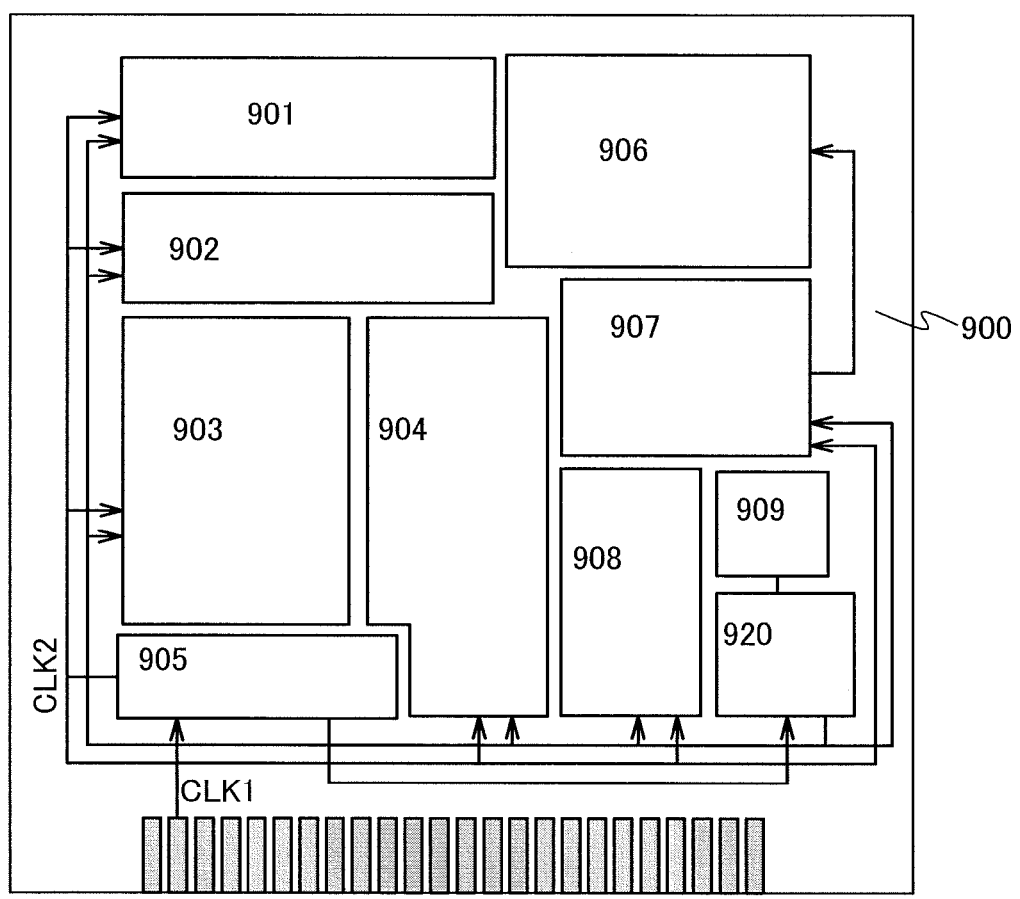
FIG. 5 is a block diagram of a CPU in which a storage device is used.

FIG. 5 illustrates a configuration of the CPU in this embodiment. The CPU illustrated in FIG. 5 mainly includes an arithmetic logic unit (ALU) 901, an ALU controller 902, an instruction decoder 903, an interrupt controller 904, a timing controller 905, a register 906, a register controller 907, a bus interface (Bus I/F) 908, a rewritable ROM 909, and a ROM interface (ROM I/F) 920, over a substrate 900. Further, the ROM 909 and the ROM I/F 920 may be provided over different chips. Naturally, the CPU illustrated in FIG. 5 is only an example with a simplified configuration, and an actual CPU may employ a variety of configurations depending on the application.

An instruction which is input to the CPU through the Bus I/F 908 is input to the instruction decoder 903 and decoded therein, and then, input to the ALU controller 902, the interrupt controller 904, the register controller 907, and the timing controller 905.

The ALU controller 902, the interrupt controller 904, the register controller 907, and the timing controller 905 conduct various controls in accordance with the decoded instruction. Specifically, the ALU controller 902 generates signals for controlling the drive of the ALU 901. While the CPU is executing a program, the interrupt controller 904 judges an interrupt request from an external input/output device or a peripheral circuit on the basis of its priority or a mask state, and processes the request. The register controller 907 generates an address of the register 906, and reads/writes data from/to the register 906 in accordance with the state of the CPU.

The timing controller 905 generates signals for controlling a drive timing of the ALU 901, the ALU controller 902, the instruction decoder 903, the interrupt controller 904, and the register controller 907. For example, the timing controller 905 is provided with an internal clock generator for generating an internal clock signal CLK2 on the basis of a reference clock signal CLK1, and supplies the clock signal CLK2 to the above circuits.

In the CPU of this embodiment, a storage element having the structure described in any of the above embodiments is provided in the register 906. The register controller 907 judges whether data is held by the feedback loop of the phase-inversion element (which corresponds to a case where the transistor 111 and the transistor 112 are on) or data is held in the capacitor (which corresponds to a case where the transistor 111 and the transistor 112 are off) in the storage element in the register 906. When holding data by the feedback loop of the phase-inversion element is selected, a power-supply voltage is supplied to the storage element in the register 906. When holding data in the capacitor is selected, the supply of the power-supply voltage to the storage element in the register 906 can be stopped. The power supply can be stopped by providing a switching element between a storage element group and a node to which the power supply potential VDD or the power supply potential VSS is supplied, as illustrated in FIG. 3A or FIG. 3B.

In such a manner, even in the case where the operation of the CPU is temporally stopped and the supply of the power-supply voltage is stopped, data can be held and power consumption can be reduced. Specifically, for example, while a user of a personal computer does not input data to an input device such as a keyboard, the operation of the CPU can be stopped, so that the power consumption can be reduced.

Although the example of the CPU is described in this embodiment, the signal processing circuit of the present invention is not limited to the CPU and can be applied to an LSI such as a microprocessor, an image processing circuit, a digital signal processor (DSP), or a field programmable gate array (FPGA).

This embodiment can be combined as appropriate with any of the other embodiments.

Embodiment 5

In this embodiment, a structure of a transistor or the like included in a signal processing circuit will be described with reference to FIG. 6, FIG. 7, FIG. 8, FIG. 9, and FIGS. 17A and 17B.

Figure 6:
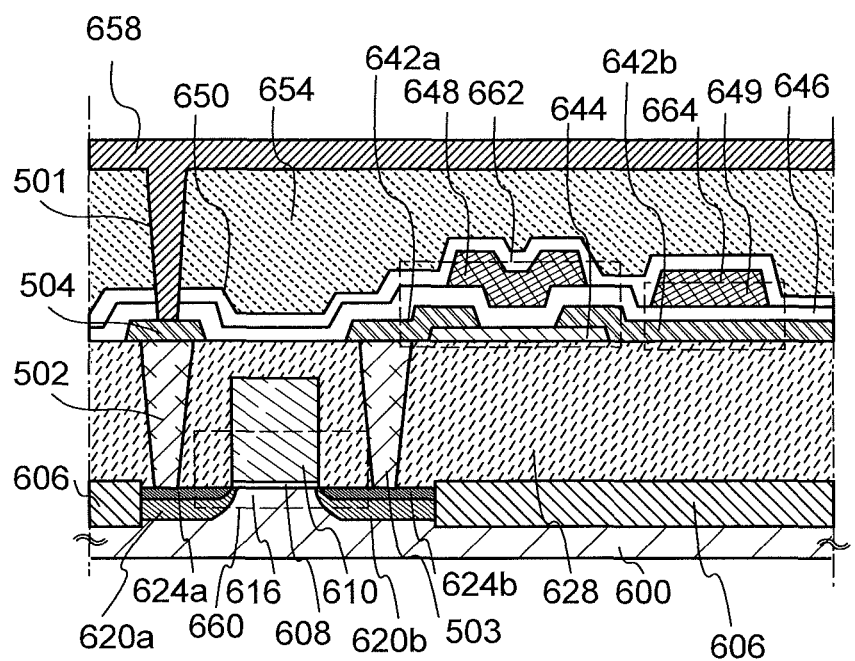
FIG. 6 is a cross-sectional view illustrating a structure of a storage element.

FIG. 6 illustrates an example of a structure of the storage element 100 illustrated in the circuit diagram of FIG. 1A or FIG. 1B. FIG. 6 is a cross-sectional view of two transistors (a transistor 660 and a transistor 662) and a capacitor 664 which are components included in the storage element 100. The transistor 662 is a transistor in which a channel is formed in an oxide semiconductor layer. The transistor 662 can correspond to the transistor 111 or the transistor 112 in FIGS. 1A and 1B. The transistor 660 is a transistor in which a channel is formed in a semiconductor (e.g., silicon or the like) other than the oxide semiconductor. The transistor 660 can correspond to the selection transistor 103, the selection transistor 104, or a transistor included in the phase-inversion element (the n-channel transistor 131, the p-channel transistor 132, the n-channel transistor 133, or the p-channel transistor 134 in FIG. 1B). The capacitor 664 can correspond to the capacitor 121 or the capacitor 122 in FIGS. 1A and 1B.

In the example of the structure illustrated in FIG. 6, one of a source and a drain of the transistor 660 is connected to one of a source and the drain of the transistor 662, and the other of the source and the drain of the transistor 662 is connected to one of a pair of electrodes of the capacitor 664. As an example of such a structure, the case where the transistor 660, the transistor 662, and the capacitor 664 correspond to the selection transistor 103, the transistor 111, and the capacitor 121 in FIGS. 1A and 1B, respectively, is described.

Although both the transistor 660 and the transistor 662 are n-channel transistors here, it is needless to say that p-channel transistors can be used.

The transistor 660 illustrated in FIG. 6 includes a channel formation region 616 provided over a substrate 600 including a semiconductor material (e.g., silicon), impurity regions 620a and 620b between which the channel formation region 616 is sandwiched, metal compound regions 624a and 624b in contact with the impurity regions 620a and 620b, a gate insulating layer 608 provided over the channel formation region 616, and a gate electrode 610 provided over the gate insulating layer 608. In addition, an element separation insulating layer 606 is provided over the substrate 600.

Note that a transistor whose source electrode and drain electrode are not explicitly illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". In other words, in this specification, the term "source electrode" may include a source region and the term "drain electrode" may include a drain region.

Note that in this specification, the impurity region 620a and the impurity region 620b are collectively referred to as impurity regions 620 in some cases. Further, in this specification, the metal compound region 624a and the metal compound region 624b are collectively referred to as metal compound regions 624 in some cases.

An insulating layer 628 is provided over the transistor 660. For high integration, as illustrated in FIG. 6, it is preferable that the transistor 660 do not include a sidewall insulating layer. On the other hand, in the case where the characteristics of the transistor 660 have priority, sidewall insulating layers may be provided on side surfaces of a gate electrode 610, and the impurity regions 620 including a plurality of regions with different impurity concentrations may be provided. Here, the insulating layer 628 preferably has a surface with favorable flatness; for example, the surface of the insulating layer 628 preferably has a root-mean-square (RMS) roughness of 1 nm or less. In this manner, a channel formation region (an oxide semiconductor layer 644) of the transistor 662 is provided in an extremely flat region having a root-mean-square (RMS) roughness of 1 nm or less, whereby the transistor 662 which can prevent a malfunction such as a short-channel effect and has favorable characteristics can be provided even when the transistor 662 is miniaturized.

The transistor 662 in FIG. 6 includes the oxide semiconductor layer 644 formed over the insulating layer 628, an electrode 642a and an electrode 642b which are partly in contact with the oxide semiconductor layer 644, a gate insulating layer 646 covering the oxide semiconductor layer 644 and the electrodes 642a and 642b, and a gate electrode 648 provided over the gate insulating layer 646 to overlap with the oxide semiconductor layer 644. The electrode 642a is connected to the metal compound region 624b of the transistor 660 with an electrode 503 formed in an opening portion provided in the insulating layer 628.

Note that in this specification, the electrode 642a and the electrode 642b are collectively referred to as an electrode 642.

Here, it is preferable that the oxide semiconductor layer 644 be a highly purified oxide semiconductor layer by sufficiently removing impurities such as hydrogen or sufficiently supplying oxygen. Specifically, the concentration of hydrogen in the oxide semiconductor layer 644 is lower than or equal to $5\times10^{19}$ atoms/cm$^3$, preferably lower than or equal to $5\times10^{18}$ atoms/cm$^3$, further preferably lower than or equal to $5\times10^{17}$ atoms/cm$^3$, for example. In addition, the concentration of an alkali metal element in the oxide semiconductor layer 644 is preferably reduced. For example, the concentration of sodium (Na) may be lower than or equal to $5\times10^{16}$ atoms/cm$^3$, preferably lower than or equal to $1\times10^{16}$ atoms/cm$^3$, further preferably lower than or equal to $1\times10^{15}$ atoms/cm$^3$; the concentration of lithium (Li) may be lower than or equal to $5\times10^{15}$ atoms/cm$^3$, preferably lower than or equal to $1\times10^{15}$ atoms/cm$^3$; and the concentration of potassium (K) may be lower than or equal to $5\times10^{15}$ atoms/cm$^3$, preferably lower than or equal to $1\times10^{15}$ atoms/cm$^3$.

Note that it has been pointed out that an oxide semiconductor is insensitive to impurities, there is no problem when a considerable amount of metal impurities is contained in the film, and therefore, soda-lime glass which is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. An alkali metal and an alkaline earth metal are unfavorable impurities for the oxide semiconductor layer 644 and should be contained as little as possible. When an insulating film in contact with the oxide semiconductor layer is an oxide, an alkali metal, in particular, Na diffuses into the oxide and becomes Na$^+$. In addition, Na cuts a bond between metal and oxygen or enters the bond in the oxide semiconductor layer. As a result, transistor characteristics deteriorate (e.g., the transistor becomes normally-on (the shift of a threshold voltage to a negative side) or the mobility is decreased). Additionally, this also causes variation in characteristics of the transistor. Such a problem is significant especially in the case where the hydrogen concentration in the oxide semiconductor layer is extremely low. Therefore, the concentration of an alkali metal is strongly required to set in the above range in the case where the concentration of hydrogen contained in the oxide semiconductor is lower than or equal to $5\times10^{19}$ atoms/cm$^{-3}$, particularly lower than or equal to $5\times10^{18}$ atoms/cm$^{-3}$.

Note that the hydrogen concentration and the alkali metal element concentration in the oxide semiconductor layer 644 are measured by secondary ion mass spectroscopy (SIMS). Here, the oxide semiconductor layer 644 is purified by sufficiently reducing the concentrations of alkali metal element and hydrogen, and sufficiently supplied with oxygen so that defect states in an energy gap due to oxygen deficiency are reduced. The density of carriers generated due to a donor such as hydrogen and an alkali metal element in such an oxide semiconductor layer 644 is lower than $1\times10^{12}$/cm$^3$, preferably lower than $1\times10^{11}$/cm$^3$, or further preferably lower than $1.45\times10^{19}$/cm$^3$. In addition, for example, the off-state current (per unit channel width (1 μm), here) at room temperature (25° C.) is 100 zA (1 zA (zeptoampere) is $1\times10^{-21}$ A) or less or 10 zA or less. With use of such an oxide semiconductor that is highly purified to be intrinsic (i-type) or substantially intrinsic, the transistor 662 can have excellent off-state current characteristics.

The capacitor 664 in FIG. 6 includes the electrode 642b formed over the insulating layer 628, the gate insulating layer 646, and an electrode 649. That is, in the capacitor 664, the electrode 642b functions as one of electrodes, the electrode 649 functions as the other electrode, and the gate insulating layer 646 functions as a dielectric.

An insulating layer 650 is formed over the transistor 662, and an insulating layer 654 is formed over the insulating layer 650. Over the insulating layer 654, a wiring 658 is formed. Here, the wiring 658 can be a wiring to which the signal IN in the circuit illustrated in FIGS. 1A and 1B is input.

The wiring 658 can be connected to an electrode 504 through an opening portion 501 formed in the insulating layer 654, the insulating layer 650, and the gate insulating layer 646. Further, the electrode 504 is connected to the metal compound region 624a of the transistor 660 with an electrode 502 formed in an opening portion provided in the insulating layer 628. Thus, the wiring 658 is electrically connected to one of the source and the drain of the transistor 660.

Note that the structure of the storage device according to an embodiment of the disclosed invention is not limited to that illustrated in FIG. 6. The details such as connection relations of the electrode and the like in the structure illustrated in FIG. 6 can be changed as appropriate.

Figure 7:
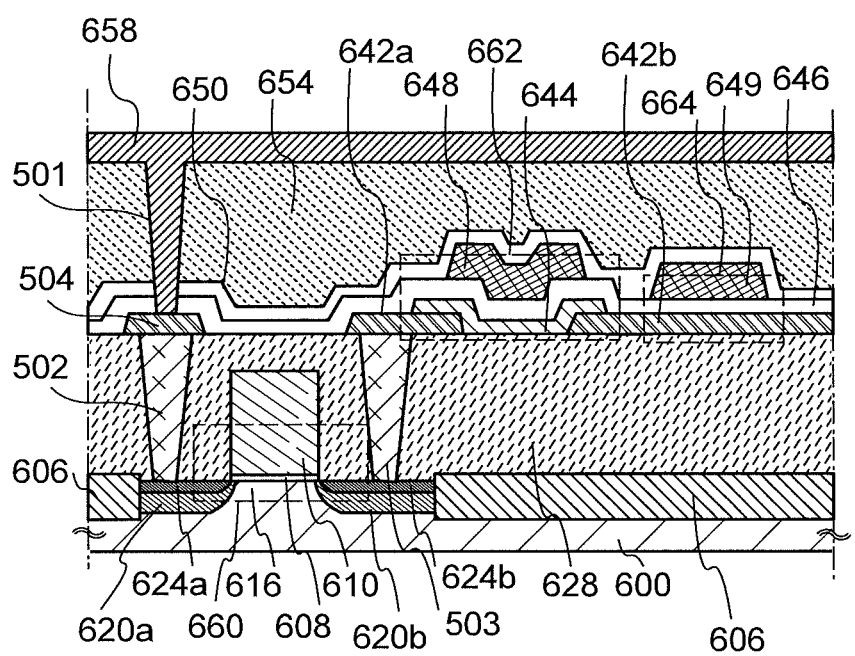
FIG. 7 is a cross-sectional view illustrating a structure of a storage element.

For example, the structure illustrated in FIG. 6 is an example in which the oxide semiconductor layer 644 is provided below the electrode 642. However, the structure of the transistor is not limited thereto. The oxide semiconductor layer 644 may be provided over the electrode 642. FIG. 7 illustrates an example in which the oxide semiconductor layer 644 is provided over the electrode 642. Note that the same portions in FIG. 7 as those in FIG. 6 are denoted by the same reference numerals.

In the structure illustrated in FIG. 7, end portions of the electrode 642a and the electrode 642b preferably have tapered shapes. When the end portions of the electrode 642a and the electrode 642b have tapered portions, coverage with the oxide semiconductor layer 644 can be improved and disconnection can be prevented, which is preferable. Here, a taper angle is, for example, greater than or equal to 30° and less than or equal to 60°. Note that the "taper angle" means an angle formed between the side surface and the bottom surface of a layer having a tapered shape (for example, the electrode 642a) when observed from a direction perpendicular to a cross section of the layer (a plane perpendicular to the substrate surface).

With a structure in which the whole of the oxide semiconductor layer 644 overlaps with the gate electrode 648 or the wiring 658 (i.e., be covered with the gate electrode 648 or the wiring 658), entry of light from the above into the oxide semiconductor layer 644 can be suppressed. Thus, light deterioration of the oxide semiconductor layer 644 can be suppressed.

Figure 8:
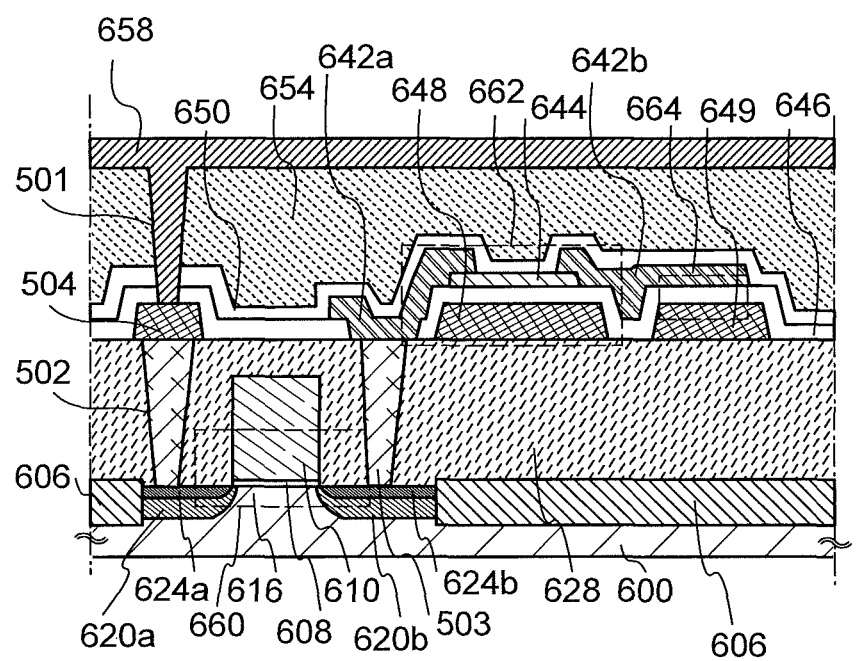
FIG. 8 is a cross-sectional view illustrating a structure of a storage element.

Further, in the structures each illustrated in FIG. 6 and FIG. 7, the gate electrode 648 is provided over the oxide semiconductor layer 644. However, the structure is not limited thereto. The gate electrode 648 may be provided below the oxide semiconductor layer 644. FIG. 8 illustrates an example in which the gate electrode 648 is provided below the oxide semiconductor layer 644. Note that in FIG. 8, the same portions as those in FIG. 6 or FIG. 7 are denoted by the same reference numerals.

In FIG. 8, the electrode 642a is connected to the electrode 503 in the opening portion provided in the gate insulating layer 646.

In the structure illustrated in FIG. 8, end portions of the gate electrode 648 and the electrode 649 preferably have tapered shapes. When the end portions the gate electrode 648 and the electrode 649 have tapered shapes, coverage with the gate insulating layer 646 is improved, which results in prevention of short circuit between the electrode 642a and the gate electrode 648, short circuit between the electrode 642b and the gate electrode 648, short circuit between the electrode 642b and the electrode 649, and the like. Here, a taper angle is, for example, greater than or equal to 30° and less than or equal to 60°.

Figure 9:
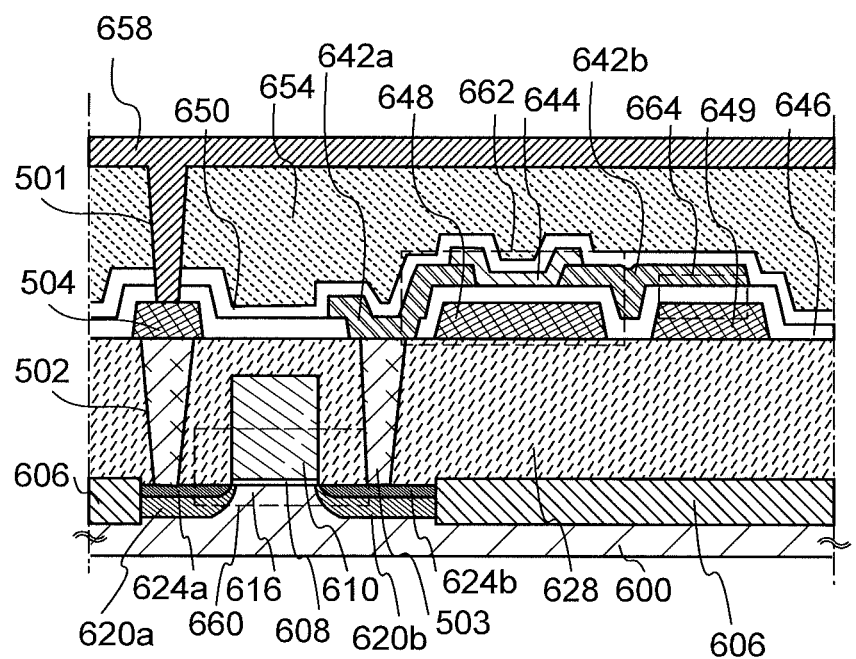
FIG. 9 is a cross-sectional view illustrating a structure of a storage element.

Further, in the structure illustrated in FIG. 8, the oxide semiconductor layer 644 may be provided over the electrode 642. FIG. 9 illustrates an example of a structure different from that of FIG. 8, in that the oxide semiconductor layer 644 is provided over the electrode 642. Note that in FIG. 9, the same portions as those in FIG. 6 to FIG. 8 are denoted by the same reference numerals.

In the structures of each of FIG. 8 and FIG. 9, the gate electrode 648 is provided below the oxide semiconductor layer 644. In such structures, the whole of the oxide semiconductor layer 644 overlaps with the gate electrode 648, whereby entry of light from the lower portion into the oxide semiconductor layer 644 can be suppressed. Thus, light deterioration of the oxide semiconductor layer 644 can be suppressed. Furthermore, with a structure in which the whole of the oxide semiconductor layer 644 overlaps with the wiring 658 (i.e., be covered with the wiring 658), entry of light from the above into the oxide semiconductor layer 644 can be suppressed. Thus, light deterioration of the oxide semiconductor layer 644 can further be suppressed.

Figure 17A:
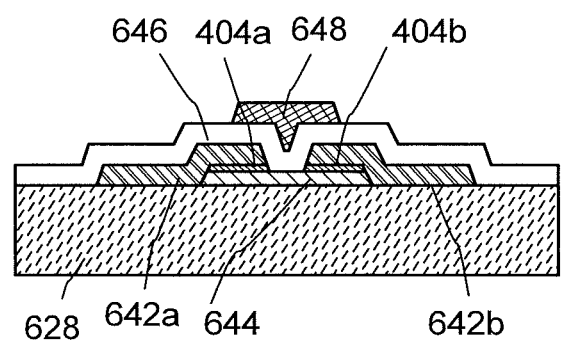
FIGS. 17A and 17B are cross-sectional views each illustrating a structure of a transistor.
Figure 17B:
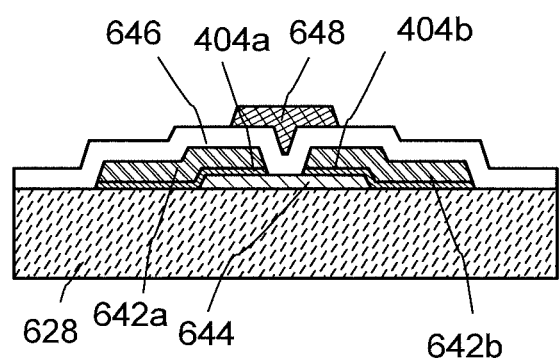

Further, in each of the structures illustrated in FIG. 6 and FIG. 8 (the structure in which the electrode 642a and the electrode 642b are provided over the oxide semiconductor layer 644), an oxide conductive layer to be a source region and a drain region may be provided between the oxide semiconductor layer 644 and the electrodes 642a and 642b. FIGS. 17A and 17B illustrate structures in which an oxide conductive layer is further provided in the transistor 662 of FIG. 6. Note that in FIGS. 17A and 17B, components other than those included in the transistor 662 are not illustrated.

In each of the transistors illustrated in FIGS. 17A and 17B, an oxide conductive layer 404a and an oxide conductive layer 404b which functions as a source region and a drain region are formed between the oxide semiconductor layer 644 and the electrodes 642a and 642b. Shapes of the oxide semiconductor layer 404a and the oxide semiconductor layer 404b in FIG. 17A are different from those of FIG. 17B in accordance with a manufacturing process.

In the transistor of FIG. 17A, a stack of an oxide semiconductor film and an oxide conductive film is formed, and then the stack of an oxide semiconductor film and an oxide conductive film is processed through a photography step, so that the island-shaped oxide semiconductor layer 644 and an island-shaped oxide conductive film are concurrently formed. The electrode 642a and the electrode 642b are formed over the oxide semiconductor layer and the oxide conductive film, and then, with use of the electrode 642a and the electrode 642b as a mask, the island-shaped oxide conductive layer is etched, so that the oxide conductive layer 404a and the oxide conductive layer 404b which are to be a source region and a drain region are formed.

In the transistor of FIG. 17B, the island-shaped oxide semiconductor layer 644 is formed, an oxide conductive film is formed thereover, a metal conductive film is formed over the oxide conductive film, and the oxide conductive film and the metal conductive film are concurrently processed through one photolithography step, so that the oxide conductive layer 404a, the oxide conductive layer 404b, the electrode 642a, and the electrode 642b are formed.

In order to prevent excessive etching of the oxide semiconductor layer 644 in etching treatment for formation of the oxide conductive layer 404a and the oxide conductive layer 404b, etching conditions (such as the kind of etchant, the concentration, and the etching time) are adjusted as appropriate.

A material of the oxide conductive layer preferably contains zinc oxide as a component and preferably does not contain indium oxide. For such an oxide conductive layer, zinc oxide, zinc aluminum oxide, zinc aluminum oxynitride, gallium zinc oxide, or the like can be used.

Contact resistance in the case where a metal electrode (such as a molybdenum electrode, a tungsten electrode, or the like) is in contact with the oxide conductive layer can be lower than contact resistance in the case where a metal electrode (such as a molybdenum electrode, a tungsten electrode, or the like) is in contact with the oxide semiconductor layer. Thus, provision of the above oxide conductive layer between the oxide semiconductor layer 644 and the electrodes 642a and 642b enables reduction in contact resistance between the electrodes 642a and 642b and the oxide conductive layer. Therefore, the resistance of the source and the drain can be reduced, so that high operation of the transistor 662 can be achieved. In addition, the withstand voltage of the transistor 662 can be improved.

Further, in each of the structures illustrated in FIG. 6 to FIG. 9, the gate insulating layer 646 of the transistor 662 is used as a dielectric layer of the capacitor 664; however, the structure is not limited thereto. As the dielectric layer of the capacitor 664, an insulating layer different from the gate insulating layer 646 may be used. In addition, in each of the structures illustrated in FIG. 6 to FIG. 9, the electrode 642b functioning as the source electrode or the drain electrode of the transistor 662 is used as one of a pair of electrodes of the capacitor 664; however, the structure is not limited thereto. As one of a pair of electrodes of the capacitor 664, an electrode different from the electrode 642b, for example, an electrode formed in a layer different from that of the electrode 642b, may be used. Moreover, in each of the structures illustrated in FIG. 6 to FIG. 9, the electrode 649 formed in the same layer as the gate electrode 648 of the transistor 662 is used as the other electrode of the capacitor 664; however, the structure is not limited thereto. As the other electrode of the capacitor 664, an electrode formed in a layer different from that of the gate electrode 648 may be used.

In each of the structures illustrated in FIG. 6 to FIG. 9, the transistor 660 is formed in the semiconductor substrate. However, the structure is not limited thereto. The transistor 660 may be formed using an SOI substrate. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Further, the transistor 660 may include a semiconductor layer formed using silicon or the like formed over a substrate having an insulating surface. The semiconductor layer may be formed by crystallizing a thin layer of an amorphous semiconductor formed over an insulating surface.

The methods, structures, and the like described in this embodiment can be combined as appropriate with any of the methods and structures described in the other embodiments.

Embodiment 6

In this embodiment, a method for manufacturing a storage element according to one embodiment of the disclosed invention will be described with reference to FIGS. 10A to 10E, FIGS. 11A to 11C, FIGS. 12A to 12D, FIGS. 13A to 13D, FIGS. 14A to 14D, and FIGS. 15A to 15D.

An example of a manufacturing method of a storage element illustrated in FIG. 6 is described. In the description below, first, a method for manufacturing the transistor 660 in the lower portion is described with reference to FIGS. 10A to 10E and FIGS. 11A to 11C, and then, a method for manufacturing the transistor 662 in the upper portion and the capacitor 664 are described with reference to FIGS. 12A to 12D, FIGS. 13A to 13D, FIGS. 14A to 14D, and FIGS. 15A to 15D.

<Manufacturing Method of Lower Transistor>

Figure 10A:
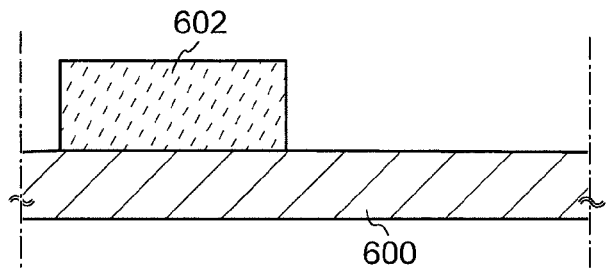
FIGS. 10A to 10E illustrate a method for manufacturing a storage element.

First, the substrate 600 including a semiconductor material is prepared (see FIG. 10A). As the substrate 600 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 600 including a semiconductor material is described. As the substrate 600 including a semiconductor material, in particular, a single crystal semiconductor substrate of silicon or the like is preferable because the speed of the read operation of the storage element can be increased.

Note that an impurity element imparting conductivity type may be added to a region which later functions as the channel formation region 616 of the transistor 660, in order to control the threshold voltage of the transistor. Here, an impurity element imparting conductivity is added so that the threshold voltage of the transistor 660 becomes positive. When the semiconductor material is formed using silicon, as the impurity imparting conductivity, for example, boron, aluminum, gallium, or the like can be used. Note that it is preferable to perform heat treatment after adding an impurity element imparting conductivity, in order to activate the impurity element or reduce defects generated in the substrate 600 during addition of the impurity element.

A protective layer 602 serving as a mask used for forming an element-isolation insulating layer is formed over the substrate 600 (see FIG. 10A). As the protective layer 602, an insulating layer formed using silicon oxide, silicon nitride, silicon oxynitride, or the like can be used, for example.

Figure 10B:
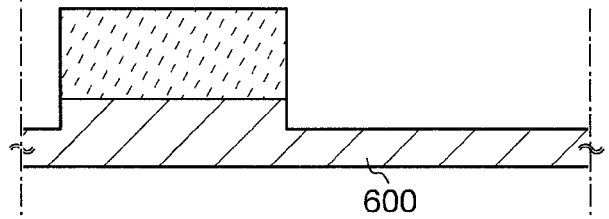

Next, etching of the substrate 600 is performed using the protective layer 602 as a mask, whereby part of the substrate 600 which is not covered with the protective layer 602 (i.e., in an exposed region), is removed (see FIG. 10B). As the etching, dry etching is preferably performed, but wet etching may be performed. An etching gas and an etchant can be selected as appropriate depending on a material of layers to be etched.

Figure 10C:
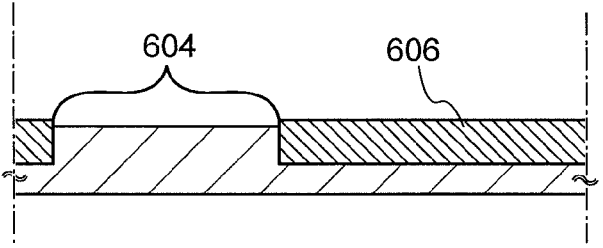

Then, an insulating layer is formed so as to cover the substrate 600, and the insulating layer is selectively removed, so that an element-isolation insulating layer 606 is formed (see FIG. 10C). The insulating layer is formed using silicon oxide, silicon nitride, silicon oxynitride or the like. As a method for removing the insulating layer, any of etching treatment, polishing treatment such as chemical mechanical polishing (CMP) treatment, and the like can be employed. Thus, a semiconductor region 604 which is isolated from other semiconductor regions is formed. Note that after the etching of the substrate 600 using the protective layer 602 as a mask or after the formation of the element-isolation insulating layer 606, the protective layer 602 is removed.

Next, an insulating layer is formed over a surface of the semiconductor region 604, and a layer including a conductive material is formed over the insulating layer.

The insulating layer serves as a gate insulating layer later, and can be formed by heat treatment (thermal oxidation treatment, thermal nitridation treatment, or the like) of the surface of the semiconductor region 604, for example. Instead of heat treatment, high-density plasma treatment may be employed. The high-density plasma treatment can be performed using, for example, a mixed gas of a rare gas such as He, Ar, Kr, or Xe and a gas such as oxygen, nitrogen oxide, ammonia, nitrogen, or hydrogen. Needless to say, the insulating layer may be formed using a CVD method, a sputtering method, or the like. The insulating layer preferably has a single-layer structure or a stacked-layer structure including a film which contains any of silicon oxide, silicon oxynitride, silicon nitride, hafnium oxide, aluminum oxide, tantalum oxide, yttrium oxide, hafnium silicate ($HfSi_xO_y$ ($x>0$, $y>0$)), hafnium silicate ($HfSi_xO_y$ ($x>0$, $y>0$)) to which nitrogen is added, hafnium aluminate ($HfAl_xO_y$ ($x>0$, $y>0$)) to which nitrogen is added, and the like. The insulating layer can have a thickness, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on a method for forming the layer including a conductive material, and any of a variety of film formation methods such as an evaporation method, a CVD method, a sputtering method, or a spin coating method can be employed. Note that this embodiment shows an example of the case where the layer including a conductive material is formed using a metal material.

Figure 10D:
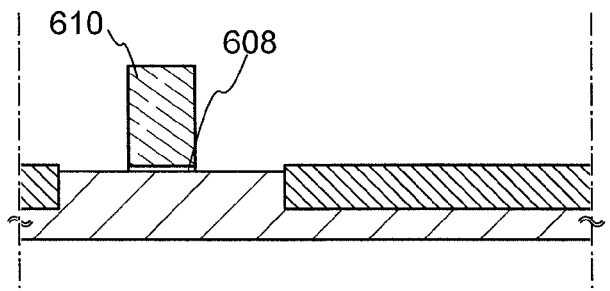

After that, the insulating layer and the layer including a conductive material are selectively etched, so that the gate insulating layer 608 and the gate electrode 610 are formed (see FIG. 10D).

Figure 10E:
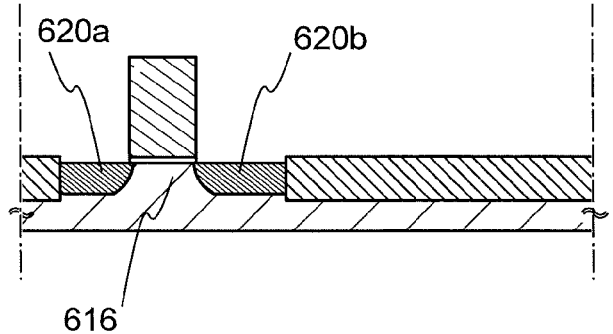

Next, the channel formation region 616 and the impurity regions 620a and 620b are formed by adding phosphorus (P), arsenic (As), or the like to the semiconductor region 604 (see FIG. 10E). Here, the transistor 660 is an n-channel transistor. In order to form an n-channel transistor, an impurity element imparting conductivity type such as phosphorus or arsenic is added to the semiconductor region 604. If the transistor 660 is a p-channel transistor, an impurity element imparting conductivity type such as boron (B) or aluminum (Al) may be added to the semiconductor region 604, so that the channel formation region 616 and the impurity regions 620a and 620b are formed. The concentration of the impurity element imparting conductivity type to be added can be set as appropriate. In the case of the transistor 660 is highly miniaturized, the concentration is preferably set to high.

Note that a sidewall insulating layer may be formed on the periphery of the gate electrode 610, so that a plurality of impurity regions which have different concentrations of an added impurity element imparting conductivity (e.g., a high-concentration impurity region which does not overlap with the sidewall insulating layer and a low-concentration impurity region which overlaps with the sidewall insulating layer) are formed in the semiconductor region 604.

Figure 11A:
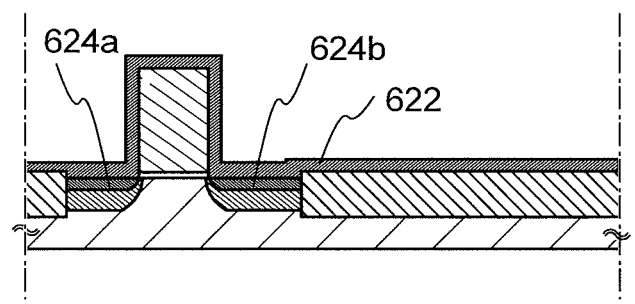
FIGS. 11A to 11C illustrate the method for manufacturing a storage element.

Then, a metal layer 622 is formed so as to cover the gate electrode 610, and the impurity regions 620a and 620b (see FIG. 11A). Any of a variety of film formation methods such as a vacuum evaporation method, a sputtering method, or a spin coating method can be employed for forming the metal layer 622. The metal layer 622 is preferably formed using a metal material that reacts with a semiconductor material included in the semiconductor region 604 to form a low-resistance metal compound. Examples of such metal materials include titanium, tantalum, tungsten, nickel, cobalt, and platinum.

Next, heat treatment is performed so that the metal layer 622 reacts with the semiconductor material on a surface of the semiconductor region 604. As a result, the metal compound region 624a and the metal compound region 624b which are in contact with the impurity region 620a and the impurity region 620b are formed (see FIG. 11A). Note that when the gate electrode 610 is formed using polycrystalline silicon or the like, a metal compound region is also formed in a region of the gate electrode 610 in contact with the metal layer 622. The above metal compound region has sufficiently high conductivity. The formation of the metal compound regions can properly reduce electric resistance of the source and drain and the like and improve element characteristics of the transistor 660.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal layer 622 is removed after the metal compound regions 624a and 624b are formed.

Figure 11B:
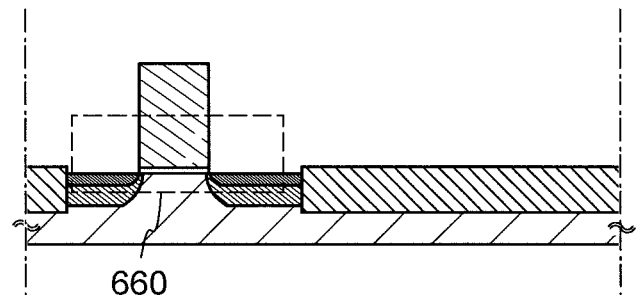

Through the above steps, the transistor 660 using the substrate 600 including a semiconductor material is formed (see FIG. 11B). The thus formed transistor 660 can operate at high speed. Therefore, with use of the transistor 660, the storage element can read data at high speed.

Figure 11C:
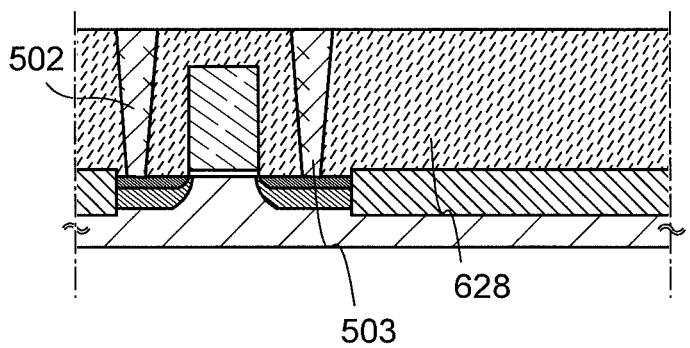

Then, the insulating layer 628 is formed so as to cover the transistor 660 formed in the above steps (see FIG. 11C). The insulating layer 628 can be formed using a material including an inorganic insulating material such as silicon oxide, silicon oxynitride, silicon nitride, or aluminum oxide. It is particularly preferable to use a low dielectric constant (low-k) material for the insulating layer 628 because capacitance due to overlap of electrodes or wirings can be sufficiently reduced. Note that a porous insulating layer with such a material may be employed as the insulating layer 628. A porous insulating layer has a lower dielectric constant than an insulating layer with high density, and thus allows a further reduction in capacitance generated by electrodes or wirings. Moreover, the insulating layer 628 can be fowled using an organic insulating material such as polyimide or acrylic. Note that the insulating layer 628 has a single-layer structure in this embodiment; however, an embodiment of the disclosed invention is not limited to this. The insulating layer 628 may have a stacked structure of two or more layers. For example, a stacked structure including a layer formed using an organic insulating material and a layer formed using an inorganic material may be used.

In the insulating layer 628, opening portions reaching the metal compound region 624a and the metal compound region 624b are formed, and the electrode 502 and the electrode 503 are formed using a conductive layer. The conductive layer can be formed by a PVD method such as a sputtering method, or a CVD method such as a plasma CVD method. As a material for the conductive layer, an element selected from aluminum, chromium, copper, tantalum, titanium, molybdenum, or tungsten; an alloy containing any of these elements as a component; or the like can be used. Further, one or more materials selected from manganese, magnesium, zirconium, beryllium, neodymium, and scandium may be used. The conductive layer can have a single-layer structure or a stacked structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order.

Then, as treatment before formation of the transistor 662 and the capacitor 664, CMP treatment is subjected to a surface of the insulating layer 628 (see FIG. 11C). Instead of CMP treatment, etching treatment or the like can be employed. Note that in order to improve characteristics of the transistor 662, the surfaces of the insulating layer 628, the electrode 502, and the electrode 503 are preferably made as flat as possible. For example, the surface of the insulating layer 628 preferably has a root-mean-square (RMS) roughness of 1 nm or less.

Note that an electrode, a wiring, a semiconductor layer, an insulating layer may be further formed before and after the above steps described with FIGS. 10A to 10E and FIGS. 11A to 11C. In addition, a multilayer wiring structure in which an insulating layer and a conductive layer are stacked may be employed as a wiring structure, so that a highly-integrated storage element can be realized.

<Manufacturing Method of Transistor in Upper Portion>

Next, manufacturing methods of the transistor 662 in an upper portion and the capacitor 664 are described. A manufacturing method of a structure corresponding to that illustrated in FIG. 6 is described with reference to FIGS. 12A to 12D. A manufacturing method of a structure corresponding to that illustrated in FIG. 7 is described with reference to FIGS. 13A to 13D. A manufacturing method of a structure corresponding to that illustrated in FIG. 8 is described with reference to FIGS. 14A to 14D. A manufacturing method of a structure corresponding to that illustrated in FIG. 9 is described with reference to FIGS. 15A to 15D.

First, the manufacturing method of a structure corresponding to that illustrated in FIG. 6 is described with reference to FIGS. 12A to 12D.

Figure 12A:
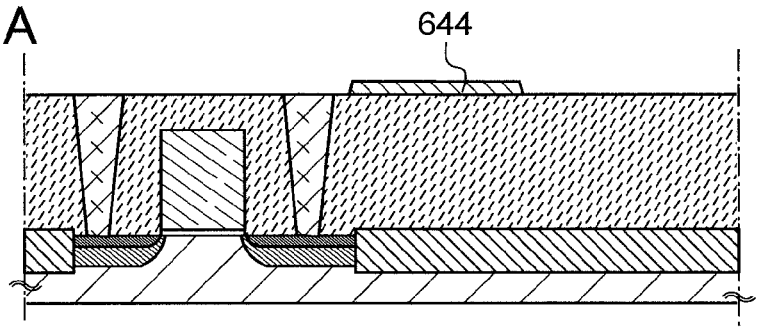
FIGS. 12A to 12D illustrate the method for manufacturing a storage element.

An oxide semiconductor layer is formed over the insulating layer 628, the electrode 502, and the electrode 503, and the oxide semiconductor layer is selectively etched to form the oxide semiconductor layer 644 (see FIG. 12A).

An oxide semiconductor used in the oxide semiconductor layer 644 preferably contains at least indium (In) or zinc (Zn). In particular, In and Zn are preferably contained. As a stabilizer for reducing changes in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, the following oxide can be used: an indium oxide, a tin oxide, a zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an In—Ga—Zn-based oxide means an oxide containing In, Ga, and Zn, and there is no limitation on the composition ratio of In, Ga, and Zn. The In—Ga—Zn-based oxide may contain a metal element other than the In, Ga, and Zn.

For example, an In—Ga—Zn—O-based material with an atomic ratio where In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn—O-based material with an atomic ratio where In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to be appropriate.

For example, with the In—Sn—Zn—O-based material, a high mobility can be relatively easily obtained. Also in the case of using the In—Ga—Zn—O-based material, the mobility can be increased by reducing the defect density in the bulk.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with use of the oxide semiconductor with an amorphous structure, interface scattering can be reduced, and relatively high mobility can be obtained with relative ease.

In an oxide semiconductor having crystallinity, defects in a bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, further preferably less than or equal to 0.1 nm.

Note that, Ra is obtained by expanding, into three dimensions, center line average roughness that is defined by JIS B 0601 so as to be applied to a surface. Ra can be expressed as an "average value of the absolute values of deviations from a reference surface to a designated surface" and is defined by the following formula.

$$Ra = \frac{1}{S_0} \int_{x_2}^{x_1} \int_{y_2}^{y_1} |f(x, y) - Z_0| dx dy \qquad \text{[FORMULA 1]}$$

In the above formula, $S_0$ represents the area of a measurement surface (a rectangular region which is defined by four points represented by coordinates $(x_1,y_1)$, $(x_1,y_2)$, $(x_2,y_1)$, and $(x_2,y_2)$), and $Z_0$ represents the average height of the measurement surface. Ra can be measured using an atomic force microscope (AFM).

As a typical example of the In—Ga—Zn—O-based oxide semiconductor material, one represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), or the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are only examples.

As a target used for forming the oxide semiconductor layer 644 by a sputtering method, a target having a composition ratio expressed by the equation In:Ga:Zn=1:x:y (x is 0 or more, and y is 0.5 to 5 inclusive) is preferable. For example, a target having a composition ratio, In:Ga:Zn=1:1:1 [atomic ratio] (x=1, y=1) (that is, $In_2O_3:Ga_2O_3:ZnO=1:1:2$ [molar ratio]), can be used. Further, it is possible to use a target with a composition ratio, In:Ga:Zn=1:1:0.5 [atomic ratio], a target with a composition ratio, In:Ga:Zn=1:1:2 [atomic ratio], or a target with a composition ratio, In:Ga:Zn=1:0:1 [atomic ratio] (x=0, y=1). The relative density of the metal oxide in the metal oxide target is 80% or higher, preferably 95% or higher, further preferably 99.9% or higher. The use of a metal oxide target having high relative density makes it possible to form the oxide semiconductor layer 644 with a dense structure.

Alternatively, the oxide semiconductor layer 644 can be formed using an In—Sn—Zn-based oxide. An In—Sn—Zn-based oxide can be referred to as ITZO. For ITZO, an oxide target having a composition ratio, In:Sn:Zn=1:2:2, 2:1:3, 1:1:1, or 20:45:35 in an atomic ratio, is used, for example.

The atmosphere in which the oxide semiconductor layer 644 is formed is preferably a rare gas (typically argon) atmosphere, an oxygen atmosphere, or a mixed atmosphere including a rare gas (typically argon) and oxygen. Specifically, it is preferable to use, for example, an atmosphere of a high-purity gas from which an impurity such as hydrogen, water, a hydroxyl group, or a hydride is removed so that the impurity concentration is 1 ppm or lower (preferably the impurity concentration is 10 ppb or lower).

In forming the oxide semiconductor layer 644, for example, an object to be processed is held in a treatment chamber kept under reduced pressure and the object to be processed is heated to a temperature higher than or equal to 100° C. and lower than 550° C., preferably higher than or equal to 200° C. and lower than or equal to 400° C. Alternatively, the temperature of the object in the formation of the oxide semiconductor layer 644 may be room temperature (25° C.±10° C.). Then, moisture in the treatment chamber is removed, a sputtering gas from which hydrogen, water, or the like have been removed is introduced, and the above target is used, so that the oxide semiconductor layer 644 is formed. The oxide semiconductor layer 644 is formed while the object is heated, whereby impurities in the oxide semiconductor layer 644 can be reduced. In addition, damage on the oxide semiconductor layer 644 due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By performing evacuation with use of a cryopump or the like, hydrogen, water, or the like can be removed from the treatment chamber; thus, the concentration of an impurity in the oxide semiconductor layer 644 can be reduced.

The oxide semiconductor layer 644 can be formed under the following conditions, for example: the distance between the object to be processed and the target is 170 mm; the pressure is 0.4 Pa; the direct-current (DC) power is 0.5 kW; and the atmosphere is an oxygen (the proportion of the oxygen flow is 100%) atmosphere, an argon (the proportion of the argon flow is 100%) atmosphere, or a mixed atmosphere of oxygen and argon. Note that a pulse direct-current (DC) power supply is preferably used in the formation of the oxide semiconductor layer because dust (e.g., powdery substances produced at the time of deposition) can be reduced and the film thickness of the oxide semiconductor layer 644 can be uniform.

Note that before the oxide semiconductor layer 644 is formed by a sputtering method, reverse sputtering in which plasma is generated with an argon gas introduced may be performed so that a material attached to a surface where the oxide semiconductor layer is to be formed (e.g., a surface of the insulating layer 628) is removed. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

In this embodiment, the oxide semiconductor layer 644 is formed by a sputtering method using an In—Ga—Zn—O-based metal oxide target. The thickness of the oxide semiconductor layer 644 is greater than or equal to 1 nm and less than or equal to 50 nm, preferably, greater than or equal to 2 nm and less than or equal to 20 nm, further preferably, greater than or equal to 3 nm and less than or equal to 15 nm. However, the appropriate thickness differs depending on an oxide semiconductor material or the like, and thus, the thickness of the oxide semiconductor layer 644 can be selected depending on a material to be used or the like. Note that the surface of the insulating layer 628 is made as flat as possible as described above, whereby even if the oxide semiconductor layer 644 has a small thickness, a cross-sectional of the portion corresponding to the channel formation region of the oxide semiconductor layer 644 can be made flat. By making the cross-sectional shape of the portion corresponding to the channel formation region in the oxide semiconductor layer 644 flat, leakage current of the transistor 662 can be reduced as compared to the case where the cross-sectional shape of the oxide semiconductor layer 644 is not flat.

After formation of the oxide semiconductor layer 644, a heat treatment (first heat treatment) is preferably performed on the oxide semiconductor layer 644. Excessive hydrogen (including water and a hydroxyl group) in the oxide semiconductor layer 644 can be removed by the first heat treatment. The temperature of the first heat treatment is, for example, higher than or equal to 300° C. and lower than 550° C., preferably higher than or equal to 400° C. and lower than or equal to 500° C.

The first heat treatment can be performed in such a manner that, for example, a process object is introduced into an electric furnace in which a resistance heating element or the like is used and heated at 450° C. in a nitrogen atmosphere for an hour. During the heat treatment, the oxide semiconductor layer is not exposed to the atmosphere to prevent the entry of water and hydrogen.

The heat treatment apparatus is not limited to the electric furnace and may be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object.

Note that the inert gas may be switched to a gas including oxygen during the process. This is because defect level in energy gap due to oxygen deficiency can be reduced by performing the first heat treatment in an atmosphere including oxygen. In addition, it is preferable that the oxide semiconductor layer 644 become to contain excessive oxygen. The oxygen excessively contained exists between lattices in the oxide semiconductor layer 644. Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The above heat treatment (first heat treatment) can be referred to as dehydration treatment, dehydrogenation treatment, or the like because of its effect of removing hydrogen, water, and the like. Such heat treatment can also be performed at the following timing: after the formation of the oxide semiconductor layer, after the formation of the gate insulating layer 646 formed later, after the formation of the gate electrode 648, or the like. Such heat treatment may be conducted once or plural times.

The oxide semiconductor layer may be etched either before or after the heat treatment. In view of miniaturization of elements, dry etching is preferably used; however, wet etching may be used. An etching gas and an etchant can be selected as appropriate depending on a material of layers to be etched.

Figure 12B:
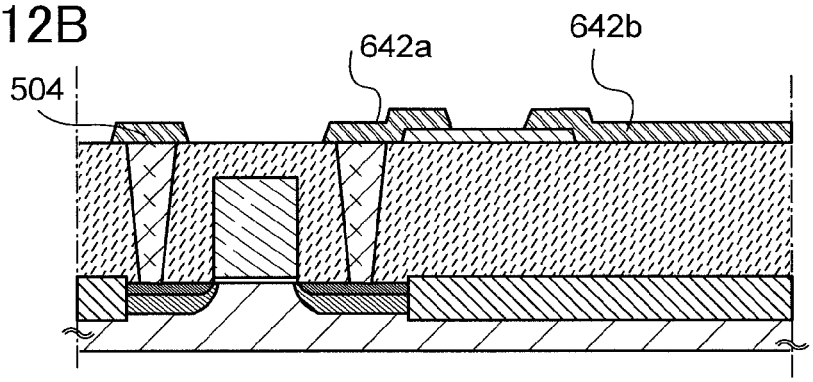

Next, a conductive layer is formed over the oxide semiconductor layer 644 and is selectively etched to form the electrode 642a, the electrode 642b, and the electrode 504 (see FIG. 12B). Note that the electrode 642a is provided to be connected to the electrode 503. The electrode 504 is provided to be connected to the electrode 502.

The conductive layer can be formed by a PVD method such as a sputtering method, or a CVD method such as a plasma CVD method. As a material for the conductive layer, an element selected from aluminum, chromium, copper, tantalum, titanium, molybdenum, or tungsten; an alloy containing any of these elements as a component; or the like can be used. Further, one or more materials selected from manganese, magnesium, zirconium, beryllium, neodymium, and scandium may be used.

The conductive layer can have a single-layer structure or a stacked structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the electrodes 642a and 642b having a tapered shape.

Alternatively, the conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

Although either dry etching or wet etching may be performed as the etching of the conductive layer, dry etching with high controllability is preferably used for miniaturization. Further, the etching may be performed so that end portions of the electrodes 642a and 642b are to be formed have a tapered shape. The taper angle can be, for example, greater than or equal to 30° and less than or equal to 60°.

The channel length (L) of the transistor 662 in the upper portion is determined by a distance between a lower end portion of the electrode 642a and a lower end portion of the electrode 642b. When light exposure is performed to form a mask used for forming a transistor with a channel length (L) of less than 25 nm, it is preferable to use extreme ultraviolet light with a short wavelength of several nanometers to several tens of nanometers. In the light exposure with extreme ultraviolet light, the resolution is high and the focal depth is large. Accordingly, the channel length (L) of the transistor 662 formed later can be less than 2 μm, preferably greater than or equal to 10 nm and less than or equal to 350 nm (0.35 μm), whereby the operation speed of the circuit can be increased.

The electrode 642b is to be one of a pair of electrodes of the capacitor 664.

Note that an insulating layer functioning as a base of the transistor 662 may be provided over the insulating layer 628. The insulating layer can be formed by a PVD method, a CVD method, or the like.

Figure 12C:
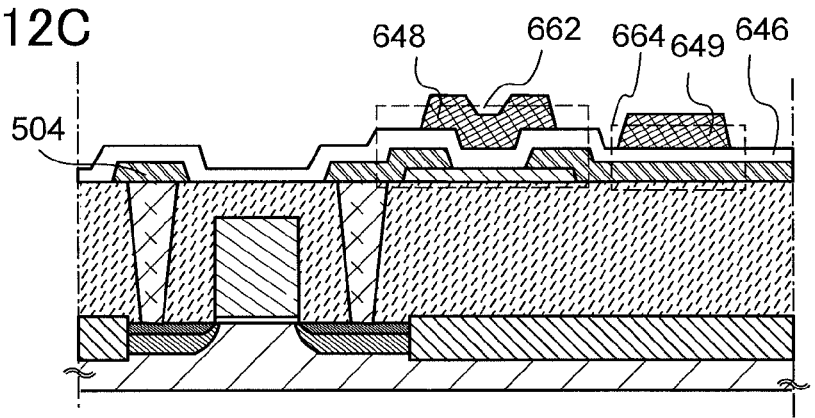

Next, the gate insulating layer 646 is formed to cover the electrode 642a, the electrode 642b, the electrode 504, and the oxide semiconductor layer 644 (see FIG. 12C).

The gate insulating layer 646 can be formed by a CVD method, a sputtering method, or the like. The gate insulating layer 646 is preferably formed by a method in which hydrogen is sufficiently reduced because the gate insulating layer 646 is to be in contact with the oxide semiconductor layer 644. The gate insulating layer 646 preferably includes silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 646 may have a single-layer structure or a stacked structure. There is no particular limitation on the thickness of the gate insulating layer 646, but in the case where the storage element is miniaturized, the gate insulating layer 646 is formed thin. For example, in the case of using silicon oxide as the gate insulating layer 646, the thickness of the gate insulating layer 646 can be greater than or equal to 1 nm and less than or equal to 100 nm, preferably greater than or equal to 10 nm and less than or equal to 50 nm.

When the gate insulating layer 646 is thin as in the above description, a problem of gate leakage of the transistor 662 due to a tunneling effect or the like is caused. In order to solve the problem of gate leakage, it is preferable that the gate insulating layer 646 be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. By using a high-k material for the gate insulating layer 646, the thickness thereof can be increased for suppression of gate leakage where favorable electric characteristics are maintained. For example, the relative permittivity of hafnium oxide is approximately 15, which is much higher than that of silicon oxide which is 3 to 4. With such a material, the gate insulating layer 646 where the equivalent oxide thickness is less than 15 nm, preferably 2 nm to 10 nm, can be easily formed. Note that a stacked structure of a film containing a high-k material and a film containing any one of silicon oxide, silicon nitride, silicon oxynitride, silicon nitride oxide, aluminum oxide, and the like may be employed.

After formation of the gate insulating layer 646, a second heat treatment is preferably performed in an oxygen atmosphere. The temperature of the heat treatment is set in the range of 200° C. to 450° C., preferably 250° C. to 350° C. By the second heat treatment, oxygen is supplied to the oxide semiconductor layer 644.

Note that in this embodiment, the second heat treatment is performed after the gate insulating layer 646 is formed; the timing of the second heat treatment is not limited thereto. For example, the second heat treatment may be performed after the gate electrode 648 is formed. Alternatively, the second heat treatment may be performed following the first heat treatment, the first heat treatment may double as the second heat treatment, or the second heat treatment may double as the first heat treatment.

Instead of performing the second heat treatment in an oxygen atmosphere, a layer containing oxygen is formed as an insulating layer (e.g., the gate insulating layer 646) adjacent to the oxide semiconductor layer 644, and then a heat treatment is performed in a nitrogen atmosphere or the like, whereby oxygen is supplied from the insulating layer to the oxide semiconductor layer 644.

Further, instead of performing the second heat treatment in an oxygen atmosphere, oxygen may be added to the oxide semiconductor layer 644 by doping.

As described above, after the dehydration treatment or dehydrogenation treatment, oxygen is supplied to the oxide semiconductor layer 644, whereby defect level in the energy gap due to oxygen deficiency in the oxide semiconductor layer 644 can be reduced. Note that it is preferable that the oxide semiconductor layer 644 be made to contain oxygen excessively. Oxygen contained excessively exists between lattices in the oxide semiconductor layer 644.

The gate insulating layer 646 functions as a dielectric layer of the capacitor 664.

Note that an insulating layer (corresponding to, for example, the gate insulating layer 646 and the insulating layer 628 in the structure illustrated in FIG. 6 and FIG. 7, and the gate insulating layer 646 and the insulating layer 650 in the structures illustrated in FIG. 8 and FIG. 9) in contact with the oxide semiconductor layer 644 is preferably formed using an insulating material including a Group 13 element and oxygen. Many of oxide semiconductor materials include a Group 13 element, and an insulating material including a Group 13 element works well with an oxide semiconductor. By using such an insulating material for an insulating layer in contact with the oxide semiconductor, the condition of an interface between the oxide semiconductor and the insulating layer can keep favorable.

An insulating material including a Group 13 element refers to an insulating material including one or more Group 13 elements. As the insulating material containing a Group 13 element, gallium oxide, aluminum oxide, aluminum gallium oxide, and gallium aluminum oxide can be given, for example. Here, aluminum gallium oxide refers to a material in which the amount of aluminum (at. %) is larger than that of gallium (at. %), and gallium aluminum oxide refers to a material in which the amount of gallium (at. %) is larger than or equal to that of aluminum (at. %).

For example, in the case where an insulating layer is formed to be in contact with the oxide semiconductor layer 644 containing gallium, a material containing gallium oxide may be used for the insulating layer, so that favorable characteristics can be kept at the interface between the oxide semiconductor layer 644 and the insulating layer. For example, when the oxide semiconductor layer 644 and the insulating layer containing gallium oxide are provided in contact with each other, pileup of hydrogen at the interface between the oxide semiconductor layer 644 and the insulating layer can be reduced. Note that a similar effect can be obtained in the case where an element in the same group as a constituent element of the oxide semiconductor is used in the insulating layer. For example, it is effective to form the insulating layer with use of a material including aluminum oxide. Note that aluminum oxide is impermeable property to water. Thus, it is preferable to use a material including aluminum oxide in terms of preventing entry of water to the oxide semiconductor layer 644.

Further, it is preferable to perform a heat treatment in an oxygen atmosphere or oxygen doping so that part or the whole of the insulating layer which is in contact with the oxide semiconductor layer 644 is made to contain oxygen whose proportion is higher than the stoichiometry of the insulating material of the insulating layer. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating layer in contact with the oxide semiconductor layer 644 is formed using gallium oxide, the composition of gallium oxide can be set to be $Ga_2O_x$ ($X=3+\alpha$, $0<\alpha<1$) by heat treatment in an oxygen atmosphere or oxygen doping.

In the case where the insulating layer in contact with the oxide semiconductor layer 644 is formed using aluminum oxide, the composition of aluminum oxide can be set to be $Al_2O_x$ ($X=3+\alpha$, $0<\alpha<1$) by heat treatment in an oxygen atmosphere or oxygen doping.

In the case where the insulating layer in contact with the oxide semiconductor layer 644 is formed using gallium aluminum oxide (or aluminum gallium oxide), the composition of gallium aluminum oxide (or aluminum gallium oxide) can be set to be $Ga_XAl_{2-X}O_{3+\alpha}$ ($0<X<2$, $0<\alpha<1$) by heat treatment in an oxygen atmosphere or oxygen doping.

By oxygen doping, an insulating layer which includes a region where the proportion of oxygen is higher than the stoichiometry of the insulating material of the insulating layer can be formed. When such an insulating layer is in contact with the oxide semiconductor layer, oxygen that exists excessively in the insulating layer is supplied to the oxide semiconductor layer, and oxygen deficiency in the oxide semiconductor layer or at the interface between the oxide semiconductor layer and the insulating layer is reduced. Thus, the oxide semiconductor layer can be an i-type or substantially i-type oxide semiconductor.

The insulating layer including a region where the proportion of oxygen is higher than the stoichiometry of the insulating material may be applied to either of the insulating layers (the insulating layer positioned over the oxide semiconductor layer and the insulating layer positioned below the oxide semiconductor layer) in contact with the oxide semiconductor layer 644; however, it is preferable to apply such an insulating layer to both of the insulating layers. The above-described effect can be enhanced with a structure where the semiconductor layer 644 is sandwiched between the insulating layers which each include a region where the proportion of oxygen is higher than the stoichiometry by providing the insulating layers to be in contact with the semiconductor layer 644 and to be located on the upper side and the lower side of the oxide semiconductor layer.

The insulating layers provided on the upper side and the lower side of the oxide semiconductor layer may include the same constituent elements or different constituent elements. For example, the insulating layers on the upper side and the lower side may be both formed of gallium oxide whose composition is $Ga_2O_X$ ($X=3+\alpha$, $0<\alpha<1$). Alternatively, one of the insulating layers on the upper side and the lower side may be formed of $Ga_2O_x$ ($X=3+\alpha$, $0<\alpha<1$) and the other may be formed of aluminum oxide whose composition is $Al_2O_x$ ($x=3+\alpha$, $0<\alpha<1$).

The insulating layer in contact with the oxide semiconductor layer 644 may be formed by stacking insulating layers each of which includes a region where the proportion of oxygen is higher than the stoichiometry. For example, the insulating layer on the upper side of the oxide semiconductor layer 644 may be formed as follows: gallium oxide whose composition is $Ga_2O_x$ ($X=3+\alpha$, $0<\alpha<1$) is formed and gallium aluminum oxide (aluminum gallium oxide) whose composition is $Ga_XAl_{2-X}O_{3+\alpha}$ ($0<X<2$, $0<\alpha<1$) may be formed thereover. Note that the insulating layer on the lower side of the oxide semiconductor layer 644 may be formed by stacking insulating layers each of which includes a region where the proportion of oxygen is higher than the stoichiometry.

Further, both of the insulating layers on the upper side and the lower side of the oxide semiconductor layer 644 may be formed by stacking insulating layers each of which includes a region where the proportion of oxygen is higher than the stoichiometry.

Next, the gate electrode 648 and the electrode 649 are formed over the gate insulating layer 646 (see FIG. 12C).

The gate electrode 648 and the electrode 649 can be formed in such a manner that a conductive layer is formed over the gate insulating layer 646 and then etched selectively. The conductive layer to be the gate electrode 648 and the electrode 649 can be formed by a PVD method such as a sputtering method, or a CVD method such as a plasma CVD method. The details of materials and the like are similar to those of the electrode 642a, the electrode 642b, and the like; thus, the description thereof can be referred to.

Further, the electrode 649 functions as the other electrode of a pair of electrodes of the capacitor 664.

Through the above steps, the transistor 662 including the highly-purified oxide semiconductor layer 644 and the capacitor 664 are completed (see FIG. 12C). By the above manufacturing method, the oxide semiconductor layer 644 from which the hydrogen concentration is sufficiently reduced is highly purified, and oxygen is sufficiently supplied thereto, so that defect level in the energy gap due to oxygen deficiency can be reduced. The thus formed oxide semiconductor layer 644 is an intrinsic (i-type) or substantially intrinsic oxide semiconductor, and such an oxide semiconductor layer 644 is used for the channel formation region, whereby the transistor 662 can have excellent off-state current characteristics.

Figure 12D:
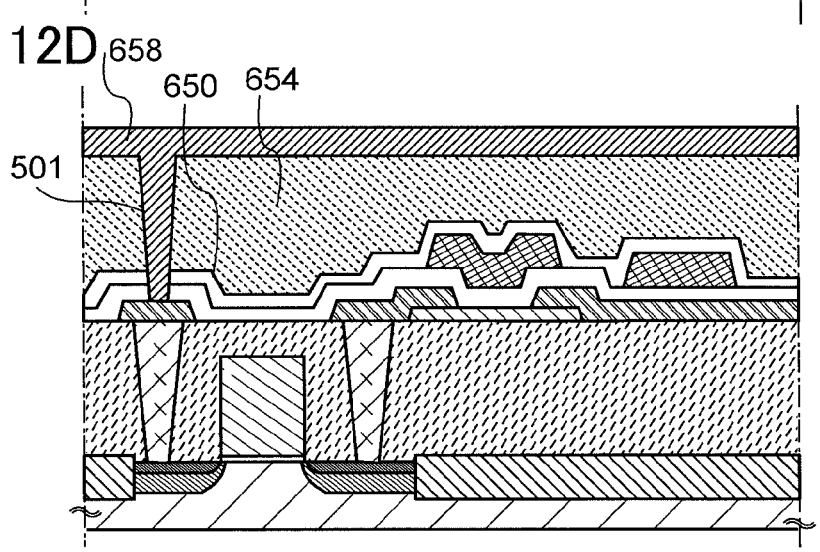

Next, the insulating layer 650 and the insulating layer 654 are formed over the gate insulating layer 646, the gate electrode 648, and the electrode 649 (see FIG. 12D). The insulating layer 650 and the insulating layer 654 can be formed by a PVD method, a CVD method, or the like. The insulating layer 650 and the insulating layer 654 can be formed so as to have a single-layer structure or a stacked structure using a material including an inorganic insulating material such as silicon oxide, silicon oxynitride, silicon nitride, hafnium oxide, or aluminum oxide.

Note that the insulating layer 654 is preferably formed using a low dielectric constant material or a low dielectric constant structure (such as a porous structure). The dielectric constant of the insulating layer 654 is reduced, whereby the capacitance generated between wirings or electrodes can be reduced, which results in higher speed operation.

Note that the insulating layer 654 is preferably formed so as to have a flat surface. This is because a flat surface of the insulating layer 654 makes it possible to form an electrode, a wiring, or the like preferably over the insulating layer 654 even in the case where, for example, the storage element is miniaturized. The insulating layer 654 can be planarized using a method such as CMP (chemical mechanical polishing).

Next, the opening portion 501 reaching the electrode 504 is formed in the insulating layer 650 and the insulating layer 654. Then, the wiring 658 is formed (see FIG. 12D). The wiring 658 is formed in such a manner that a conductive layer is formed by a PVD method including a sputtering method or a CVD method such as a plasma CVD method and then the conductive layer is patterned. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used. The details are similar to those of the electrodes 642a and 642b. Note that an electrode may be formed in the opening portion 501 and the wiring 658 is formed so as to be connected to the electrode.

Through the above steps, the storage element having the structure illustrated in FIG. 6 can be manufactured.

Next, a manufacturing method of a structure corresponding to that illustrated in FIG. 7 is described with reference to FIGS. 13A to 13D.

A difference between the manufacturing method illustrated in FIGS. 12A to 12D and the manufacturing method illustrated in FIGS. 13A to 13D is formation methods of the oxide semiconductor layer 644 and the electrode 642. In the manufacturing method illustrated in FIGS. 13A to 13D, the manufacturing method except for the formation methods of the oxide semiconductor layer 644 and the electrode 642 is similar to the manufacturing method illustrated in FIGS. 12A to 12D; thus, the description thereof is omitted.

Figure 13A:
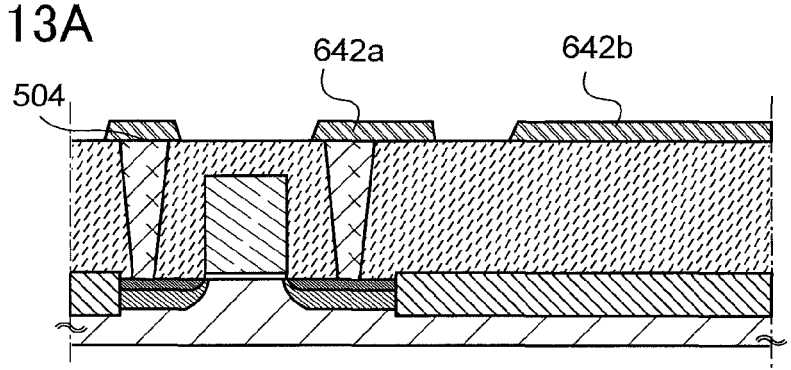
FIGS. 13A to 13D illustrate the method for manufacturing a storage element.

A conductive layer is formed over the electrode 502, the electrode 503, and the insulating layer 628 and selectively etched, so that the electrode 642a, the electrode 642b, and the electrode 504 are formed (see FIG. 13A). The conductive layer can be formed using the material and method which are similar to those of the conductive layer used for forming the electrode 642a, the electrode 642b, and the electrode 504; thus, the description of the conductive layer is omitted.

Figure 13B:
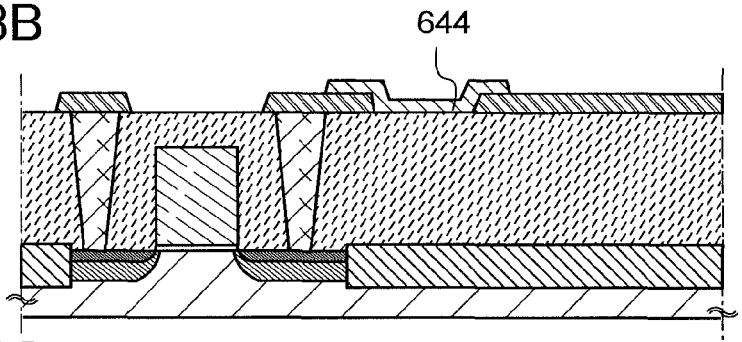

Next, the oxide semiconductor layer 644 is formed over the electrode 642a, the electrode 642b, and the electrode 504 (see FIG. 13B). The oxide semiconductor layer 644 can be formed using the material and method which are similar to those used for forming the oxide semiconductor layer 644 in the manufacturing method illustrated in FIGS. 12A to 12D; thus, the description thereof is omitted.

Figure 13C:
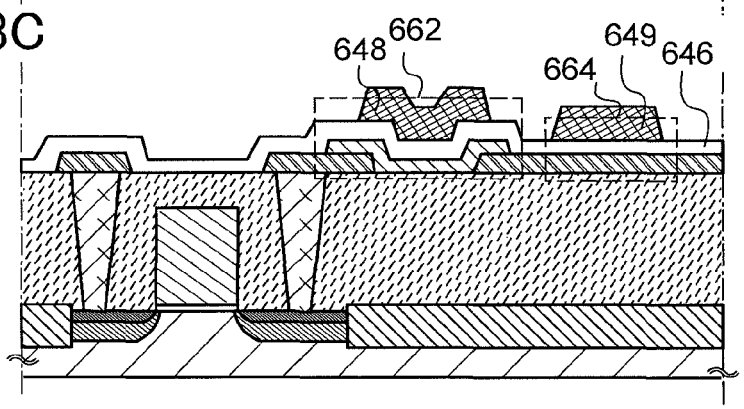
Figure 13D:
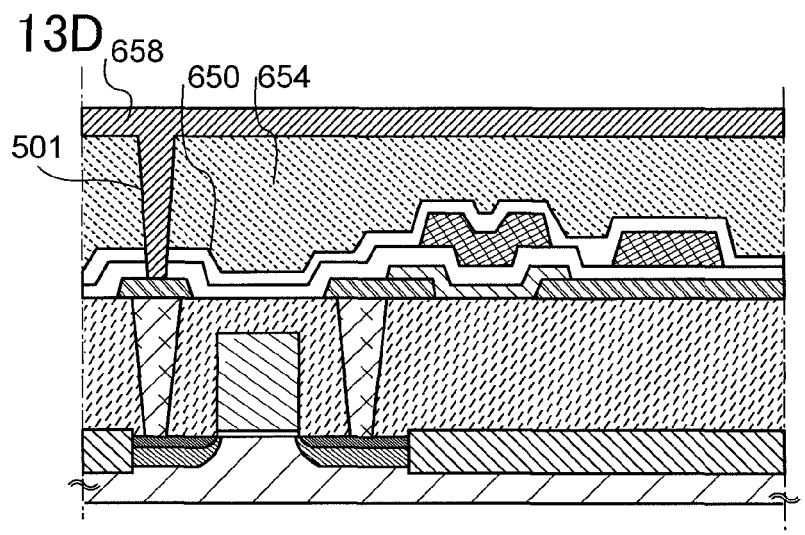

Next, the gate insulating layer 646 is formed so as to cover the electrode 642a, the electrode 642b, the electrode 504, and the oxide semiconductor layer 644 (see FIG. 13C). The following manufacturing steps are similar to those illustrated in FIGS. 12A to 12D; thus, description thereof is omitted.

Through the above steps, the storage element having the structure illustrated in FIG. 7 can be manufactured.

Next, a manufacturing method of a structure corresponding to that illustrated in FIG. 8 is described with reference to FIGS. 14A to 14D.

A difference between the manufacturing method illustrated in FIGS. 12A to 12D and the manufacturing method illustrated in FIGS. 14A to 14D is formation methods of the gate electrode 648, the electrode 649, the electrode 504, and the gate insulating layer 646. The other part of the method in the manufacturing method illustrated in FIGS. 14A to 14D is similar to the manufacturing method illustrated in FIGS. 12A to 12D; thus, the description thereof is omitted.

Figure 14A:
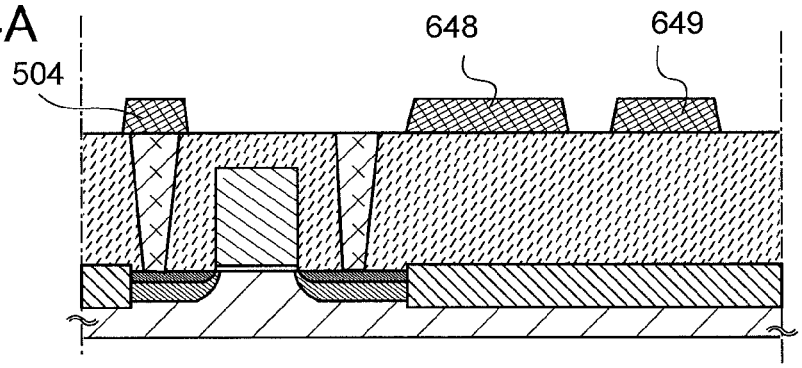
FIGS. 14A to 14D illustrate the method for manufacturing a storage element.

A conductive layer is formed over the electrode 502, the electrode 503, and the insulating layer 628, and selectively etched, so that the gate electrode 648, the electrode 649, and the electrode 504 are formed (see FIG. 14A). The conductive layer can be formed using the material and method which are similar to those of the conductive layer used for forming the gate electrode 648 and the electrode 649; thus, the description of the conductive layer is omitted.

Figure 14B:
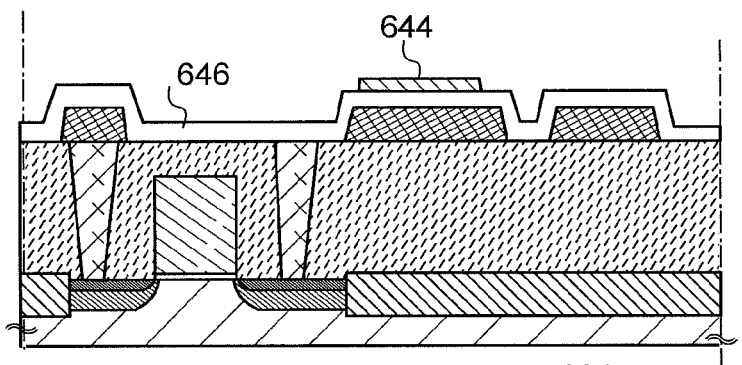

Then, the gate insulating layer 646 is formed so as to cover the gate electrode 648, the electrode 649, and the electrode 504 (see FIG. 14B). The gate insulating layer 646 can be formed using the material and method which are similar to those used for forming the gate insulating layer 646 in the manufacturing method illustrated in FIGS. 12A to 12D; thus, description thereof is omitted.

Then, the oxide semiconductor layer 644 is formed over the gate insulating layer 646 (see FIG. 14B). The oxide semiconductor layer 644 can be formed using the material and method which are similar to those used for forming the oxide semiconductor layer 644 in the manufacturing method illustrated in FIGS. 12A to 12D; thus, description thereof is omitted.

Figure 14C:
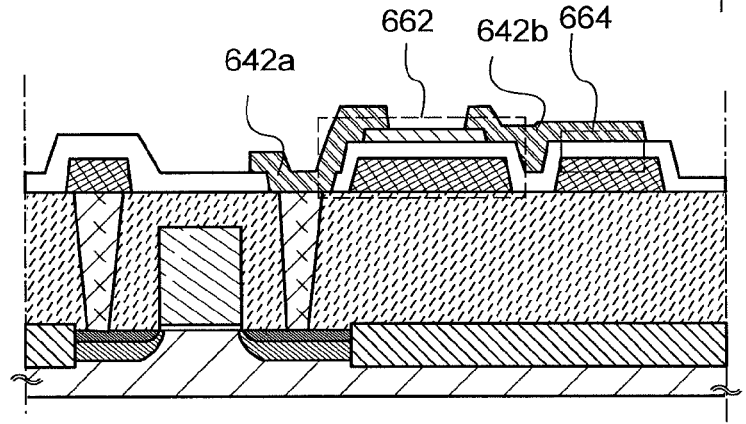
Figure 14D:
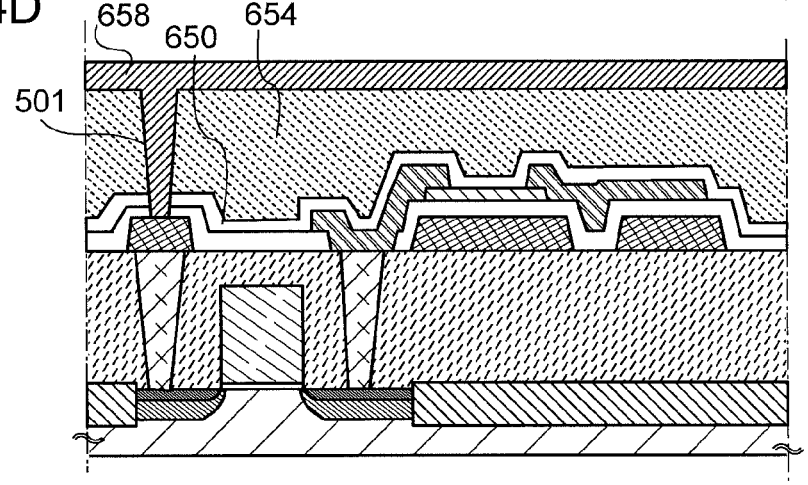

Then, a conductive layer is formed over the oxide semiconductor layer 644, and selectively etched, so that the electrodes 642a and 642b are formed (see FIG. 14C). The conductive layer can be formed using the material and method which are similar to those of the conductive layer used for forming the electrodes 642a and 642b in the manufacturing method illustrated in FIGS. 12A to 12D; thus, description thereof is omitted.

The following manufacturing steps are similar to those illustrated in FIGS. 12A to 12D; thus, description thereof is omitted.

Through the above steps, the storage element illustrated in FIG. 8 can be manufactured.

Next, a manufacturing method of a structure corresponding to that illustrated in FIG. 9 is described with reference to FIGS. 15A to 15D.

A difference between the manufacturing method illustrated in FIGS. 14A to 14D and the manufacturing method illustrated in FIGS. 15A to 15D is formation methods of the oxide semiconductor layer 644 and the electrode 642. In the manufacturing method illustrated in FIGS. 15A to 15D, the manufacturing method except for formation of the oxide semiconductor layer 644 and the electrode 642 is similar to the manufacturing method illustrated in FIGS. 14A to 14D; thus, the description thereof is omitted.

Figure 15A:
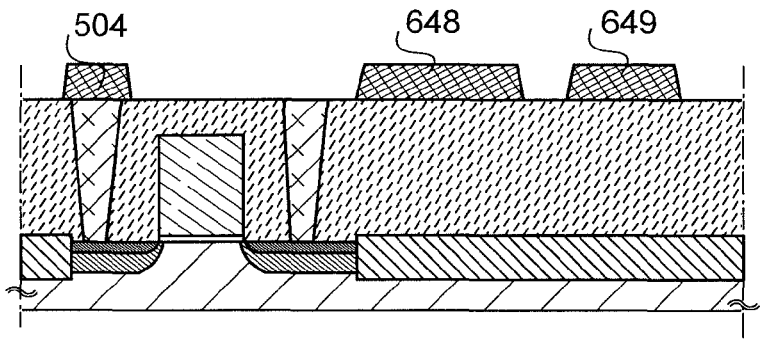
FIGS. 15A to 15D illustrate the method for manufacturing a storage element.
Figure 15B:
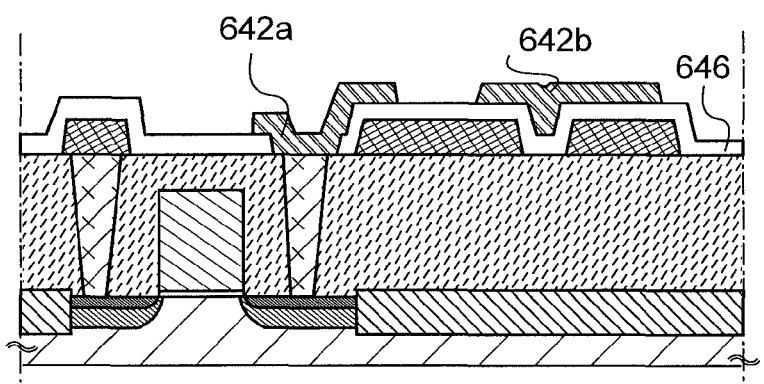

A conductive layer is formed over the gate insulating layer 646 and selectively etched, so that the electrode 642a and the electrode 642b are formed (see FIG. 15B). The conductive layer can be formed using the material and method which are similar to those of the conductive layer used for forming the electrodes 642a and 642b in the manufacturing method illustrated in FIGS. 14A to 14D; description thereof is omitted.

Figure 15C:
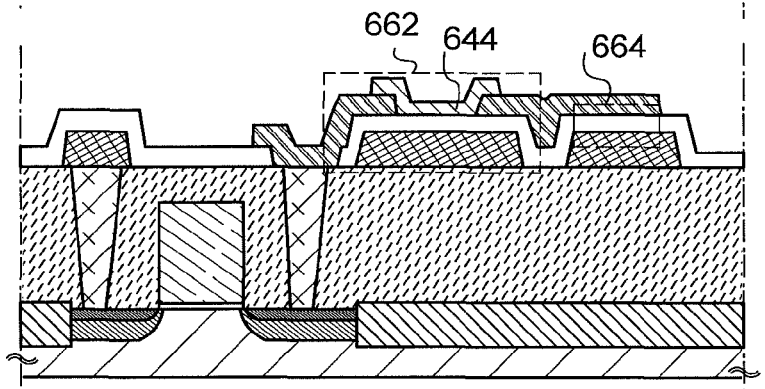
Figure 15D:
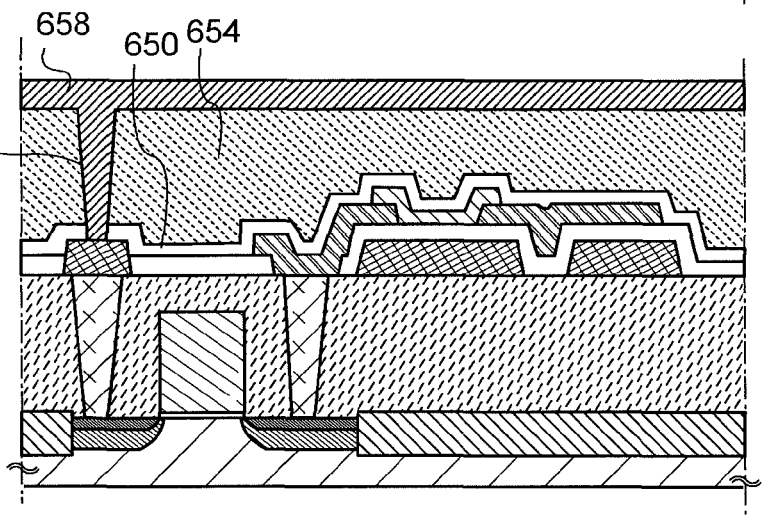

Then, the oxide semiconductor layer 644 is formed over the electrodes 642a and 642b (see FIG. 15C). The oxide semiconductor layer 644 can be formed using the material and method which are similar to those used for forming the oxide semiconductor layer 644 in the manufacturing method illustrated in FIGS. 14A to 14D; description thereof is omitted.

The following manufacturing steps are similar to those illustrated in FIGS. 14A to 14D; thus, description thereof is omitted.

Through the above steps, the storage element having the structure illustrated in FIG. 9 can be manufactured.

Note that before or after the above steps described in FIGS. 12A to 12D, FIGS. 13A to 13D, FIGS. 14A to 14D, and FIGS. 15A to 15D, a step for forming an additional electrode, wiring, semiconductor layer, or insulating layer may be performed. For example, a multilayer wiring structure in which an insulating layer and a conductive layer are stacked may be employed as a wiring structure, so that a highly-integrated storage element can be realized.

The methods and structures described in this embodiment can be combined as appropriate with any of the methods and structures described in the other embodiments.

Embodiment 7

Figure 16A:
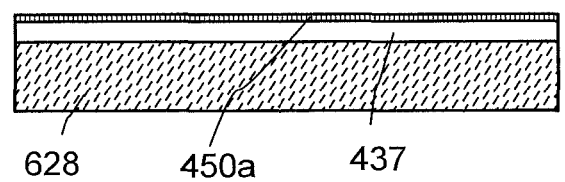
FIGS. 16A to 16C illustrate a method for manufacturing a storage element.
Figure 16B:
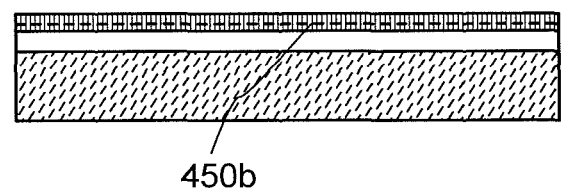

An embodiment of the oxide semiconductor layer 644 of the transistor 662 will be described with reference to FIGS. 16A to 16C.

The oxide semiconductor layer of this embodiment has a structure including a first crystalline oxide semiconductor layer and a second crystalline oxide semiconductor layer which is stacked over the first crystalline oxide semiconductor layer and is thicker than the first crystalline oxide semiconductor layer.

An insulating layer 437 is formed over the insulating layer 628. In this embodiment, an oxide insulating layer with a thickness greater than or equal to 50 nm and less than or equal to 600 nm is formed as the insulating layer 437 by a PCVD method or a sputtering method. As the oxide insulating layer, a single layer selected from a silicon oxide film, a gallium oxide film, an aluminum oxide film, a silicon nitride film, a silicon oxynitride film, an aluminum oxynitride film, and a silicon nitride oxide film or a stack of any of these films can be used.

Next, a first oxide semiconductor film with a thickness greater than or equal to 1 nm and less than or equal to 10 nm is formed over the insulating layer 437. The first oxide semiconductor layer is formed by a sputtering method, and the substrate temperature in the film formation by a sputtering method is set to be higher than or equal to 200° C. and lower than or equal to 400° C.

In this embodiment, the first oxide semiconductor film is formed to a thickness of 5 nm in an oxygen atmosphere, an argon atmosphere, or an atmosphere including argon and oxygen under conditions where a target for an oxide semiconductor (a target for an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, a first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 16A).

Depending on the substrate temperature at the time of deposition or the temperature of the first heat treatment, the deposition and the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer or the layers at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced.

Next, a second oxide semiconductor film with a thickness more than 10 nm is formed over the first crystalline oxide semiconductor layer 450a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the second oxide semiconductor film formed over and in contact with the surface of the first crystalline oxide semiconductor layer and so-called orderliness can be obtained.

In this embodiment, the second oxide semiconductor film is formed to a thickness of 25 nm in an oxygen atmosphere, an argon atmosphere, or an atmosphere including argon and oxygen under conditions where a target for an oxide semiconductor (a target for an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Then, a second heat treatment is performed under a condition where the atmosphere of a chamber in which the substrate is set is a nitrogen atmosphere or a dry air. The temperature of the second heat treatment is higher than or equal to 400° C. and lower than or equal to 750° C. By the second heat treatment, a second crystalline oxide semiconductor layer 450b is formed (see FIG. 16B). The second heat treatment can be performed in a nitrogen atmosphere, an oxygen atmosphere, or a mixed atmosphere of nitrogen and oxygen. By the second heat treatment, crystal growth proceeds in the thickness direction with use of the first crystalline oxide semiconductor layer 450a as a nucleus, that is, crystal growth proceeds from the bottom to the inside; thus, the second crystalline oxide semiconductor layer 450b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 16C:
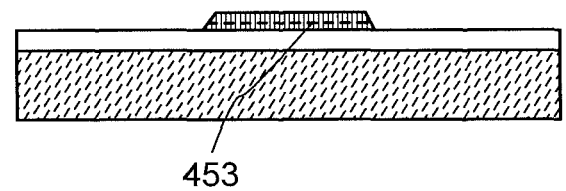

Next, the stack of the oxide semiconductor layers, the first crystalline oxide semiconductor layer 450a and the second crystalline oxide semiconductor layer 450b, is processed into an oxide semiconductor layer 453 formed of a stack of island-shaped oxide semiconductor layers (see FIG. 16C). In the drawing, the interface between the first crystalline oxide semiconductor layer 450a and the second crystalline oxide semiconductor layer 450b is indicated by a dotted line for description of the stack of oxide semiconductor layers. However, a definite interface does not exist. The interface is illustrated for easy description.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an ink-jet method.

For the etching of the stack of the oxide semiconductor layers, either dry etching or wet etching may be employed. Needless to say, both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor comprise an oxide including a crystal with c-axis alignment (also referred to as C-Axis Aligned Crystal (CAAC)), which has neither a single crystal structure nor an amorphous structure. The first crystalline oxide semiconductor layer and the second crystalline oxide semiconductor layer partly include a crystal grain boundary.

Note that each of the first and second crystalline oxide semiconductor layers can be formed using an oxide semiconductor described in any of the above embodiments.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

The oxide semiconductor layer 453 formed of the stack of oxide semiconductor layers formed by the above method can be used as the oxide semiconductor layer 644 illustrated in FIG. 6 to FIG. 9.

In the transistor including the stack of oxide semiconductor layer of this embodiment as the oxide semiconductor layer 644, current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with use of a stack of a first crystalline oxide semiconductor layer and a second crystalline oxide semiconductor layer, like the oxide semiconductor layer 453, the transistor can have stable electric characteristics and high reliability.

This embodiment can be combined as appropriate with any of the other embodiments.

Embodiment 8

In this embodiment, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the directions of the a-axis or the b-axis varies in the a-b plane (the crystal rotates on the c-axis).

In a broad sense, an oxide including CAAC means a non-single crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 19A to 19E, FIGS. 20A to 20C, and FIGS. 21A to 21C. In FIGS. 19A to 19E, FIGS. 20A to 20C, and FIGS. 21A to 21C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 19A to 19E, O surrounded by a circle represents tetracoordinate O and O surrounded by a double circle represents tricoordinate O.

Figure 19A:
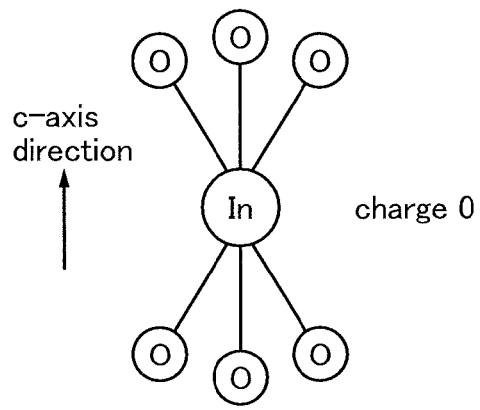
FIGS. 19A to 19E illustrate structures of oxide materials.

FIG. 19A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 19A is actually an octahedral structure, but is illustrated as a planar structure for simplicity. Note that three tetracoordinate O atoms exist in each of an upper half and a lower half in FIG. 19A. In the small group illustrated in FIG. 19A, electric charge is 0.

Figure 19D:
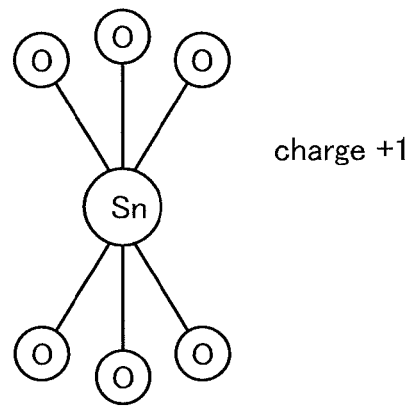
Figure 19B:
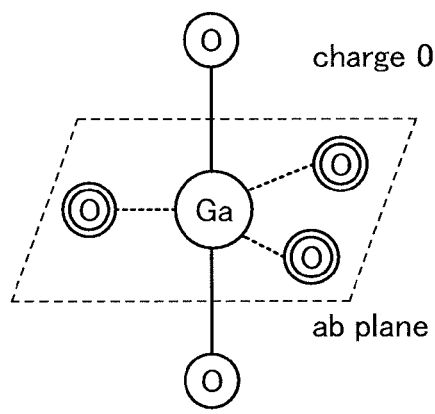

FIG. 19B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One of tetracoordinate O atom exists in an upper half and the other tetracoordinate O atom exists in a lower half in FIG. 19B. The structure illustrated in FIG. 19B can be employed using an In atom because an In atom can have five ligands. In the small group illustrated in FIG. 19B, electric charge is 0.

Figure 19E:
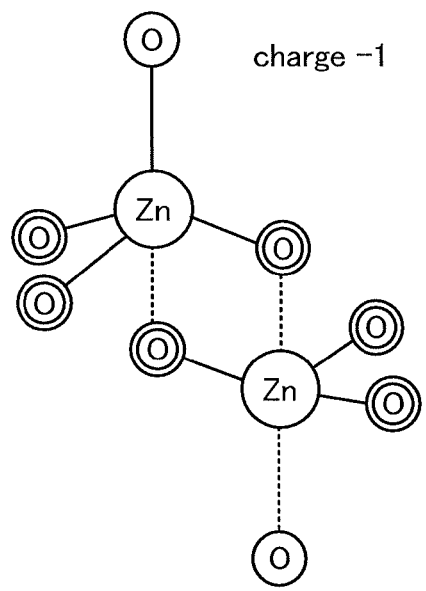
Figure 19C:
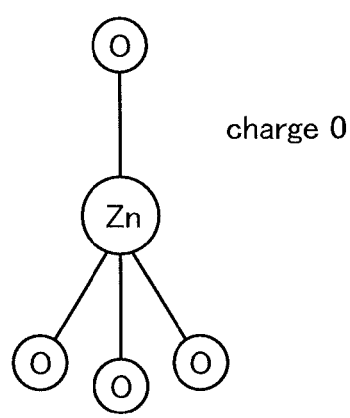

FIG. 19C illustrates a structure including one tetracoordinate Zn atom and four tetracoordinate O atoms proximate to the Zn atom. In FIG. 19C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 19C. In the small group illustrated in FIG. 19C, electric charge is 0.

FIG. 19D illustrates a structure including one hexacoordinate Sn atom and six tetracoordinate O atoms proximate to the Sn atom. In FIG. 19D, three tetracoordinate O atoms exist in an upper half and the other three tetracoordinate O atoms exist in a lower half. In the small group illustrated in FIG. 19D, electric charge is +1.

FIG. 19E illustrates a small group including two Zn atoms. In FIG. 19E, one tetracoordinate O atom exists in each of an upper half and a lower half. In the small group illustrated in FIG. 19E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 19A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be fanned in a different manner by combining a plurality of small groups so that the total electric charge of the layered structure is 0.

FIG. 20A illustrates a model of a medium group included in a layered structure of an In—Sn—Zn—O-based material. FIG. 20B illustrates a large group including three medium groups. Note that FIG. 20C illustrates an atomic arrangement in the case where the layered structure in FIG. 20B is observed from the c-axis direction.

In FIG. 20A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 20A, one tetracoordinate O atom existing in each of an upper half and a lower half with respect to an In atom is denoted by circled 1. FIG. 20A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 20A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge of a small group including a Sn atom is +1. Therefore, electric charge of −1, which cancels +1, is needed to form a layered structure including a Sn atom. As a structure having electric charge of −1, the small group including two Zn atoms as illustrated in FIG. 19E can be given. For example, with one small group including two Zn atoms, electric charge of one small group including a Sn atom can be cancelled, so that the total electric charge of the layered structure can be 0.

When the large group illustrated in FIG. 20B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following materials: a four-component metal oxide such as an In—Sn—Ga—Zn-based oxide material; a three-component metal oxide such as an In—Ga—Zn-based oxide material (also referred to as IGZO), an In—Al—Zn-based oxide material, a Sn—Ga—Zn-based oxide material, an Al—Ga—Zn-based oxide material, a Sn—Al—Zn-based oxide material, an In—Hf—Zn-based oxide material, an In—La—Zn-based oxide material, an In—Ce—Zn-based oxide material, an In—Pr—Zn-based oxide material, an In—Nd—Zn-based oxide material, an In—Pm—Zn-based oxide material, an In—Sm—Zn-based oxide material, an In—Eu—Zn-based oxide material, an In—Gd—Zn-based oxide material, an In—Tb—Zn-based oxide material, an In—Dy—Zn-based oxide material, an In—Ho—Zn-based oxide material, an In—Er—Zn-based oxide material, an In—Tm—Zn-based oxide material, an In—Yb—Zn-based oxide material, or an In—Lu—Zn-based oxide material; a two-component metal oxide such as an In—Zn-based oxide material, a Sn—Zn-based oxide material, an Al—Zn-based oxide material, a Zn—Mg-based oxide material, a Sn—Mg-based oxide material, an In—Mg-based oxide material, or an In—Ga-based oxide material; and the like.

Figures 21A, 21B, 21C:
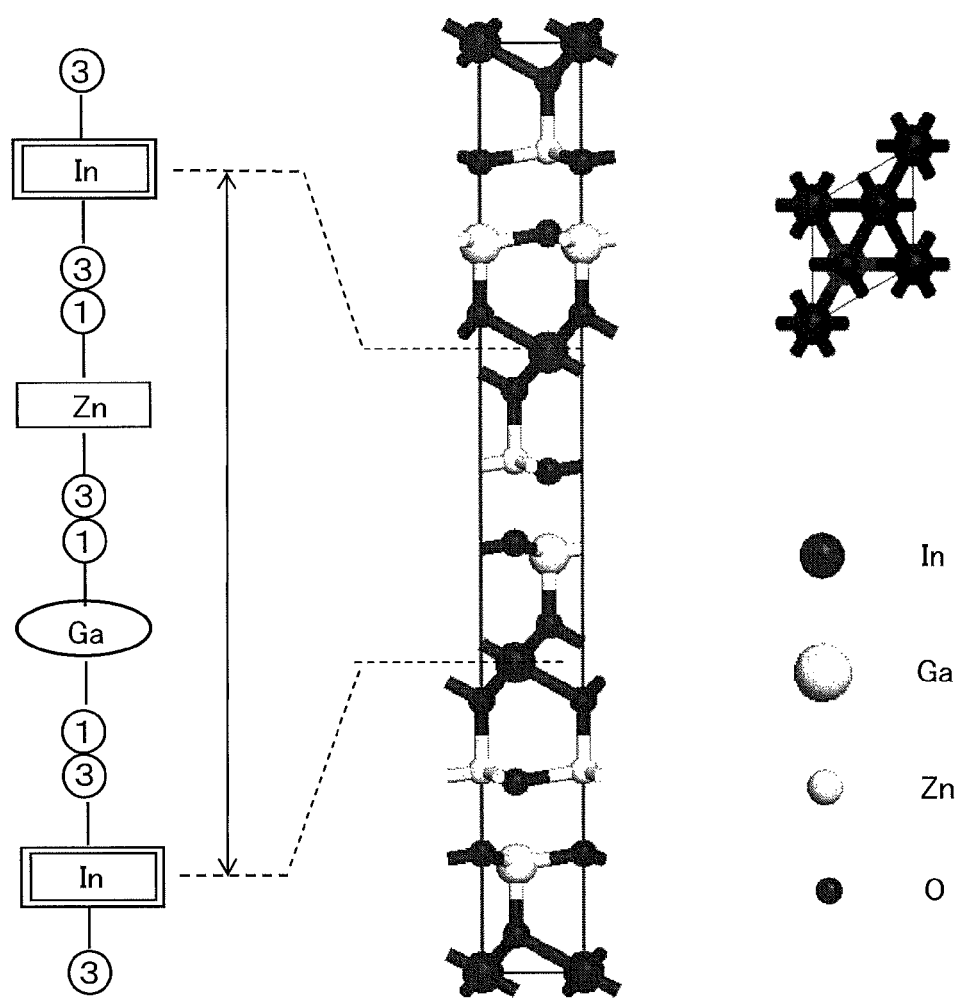
FIGS. 21A to 21C illustrate a structure of an oxide material.

As an example, FIG. 21A illustrates a model of a medium group included in a layered structure of an In—Ga—Zn—O-based material.

In the medium group included in the layered structure of the In—Ga—Zn—O-based material in FIG. 21A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 21B illustrates a large group including three medium groups. Note that FIG. 21C illustrates an atomic arrangement in the case where the layered structure in FIG. 21B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 21A but also a medium group in which the arrangement of the In atom, the Ga atom, and the Zn atom is different from that in FIG. 21A.

This embodiment can be combined as appropriate with any of the other embodiments.

Embodiment 9

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[Formula 3]}$$

Here, e represents the elementary charge, N represents the average defect density per unit area in a channel, ε represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W\mu V_g V_d C_{ox}}{L} \exp\left(-\frac{E}{kT}\right) \qquad \text{[Formula 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \qquad \text{[Formula 5]}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times 10^{12}/cm^2$.

On the basis of the defect density obtained in this manner, or the like, $\mu_0$ can be calculated to be 120 cm$^2$/Vs from Formula 2 and Formula 3. The measured mobility of an In—Sn—Zn oxide including a defect is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{G}\right) \qquad \text{[Formula 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 22:
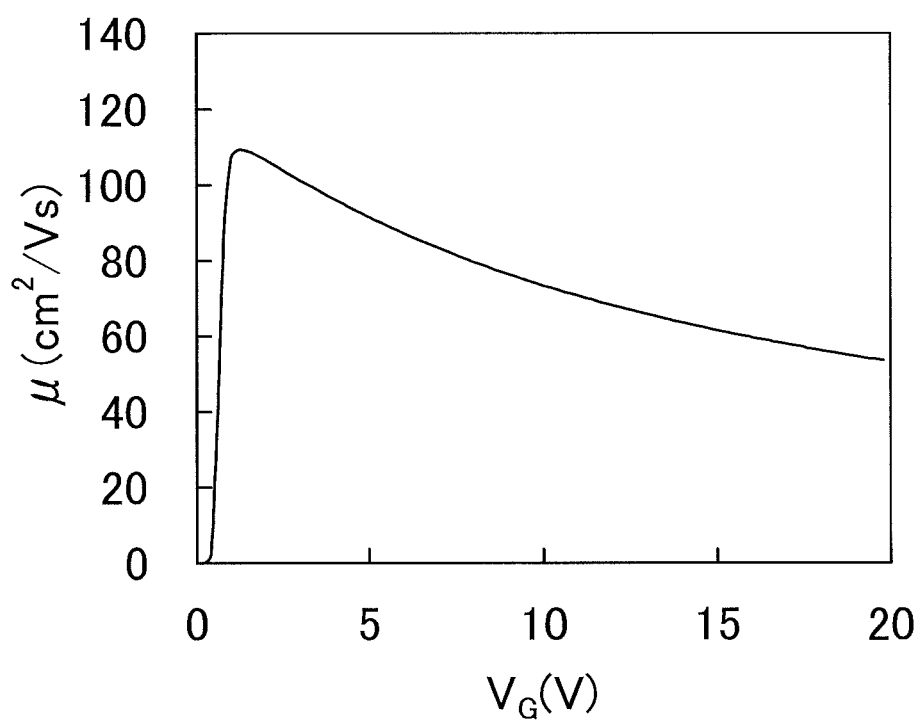
FIG. 22 shows dependence of mobility on gate voltage obtained by calculation.

Calculation results of the mobility $\mu_2$ of a transistor whose channel includes an ideal oxide semiconductor without a defect inside the semiconductor are shown in FIG. 22. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 22, the mobility has a peak of 100 cm$^2$/Vs or more at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 23A to 23C, FIGS. 24A to 24C, and FIGS. 25A to 25C. FIGS. 26A and 26B illustrate cross-sectional structures of the transistors used for the calculation. The transistors illustrated in FIGS. 26A and 26B each include a semiconductor region 8103a and a semiconductor region 8103c which have n$^+$-type conductivity in an oxide semiconductor layer. The resistivities of the semiconductor region 8103a and the semiconductor region 8103c are $2\times 10^{-3}$ Ωcm.

The transistor illustrated in FIG. 26A is formed over a base insulating layer 8101 and an embedded insulator 8102 which is embedded in the base insulating layer 8101 and formed of aluminum oxide. The transistor includes the semiconductor region 8103a, the semiconductor region 8103c, an intrinsic semiconductor region 8103b serving as a channel formation region therebetween, and a gate electrode 8105. The width of the gate electrode 8105 is 33 nm.

A gate insulating layer 8104 is formed between the gate electrode 8105 and the semiconductor region 8103b. In addition, a sidewall insulator 8106a and a sidewall insulator 8106b are formed on both side surfaces of the gate electrode 8105, and an insulator 8107 is formed over the gate electrode 8105 so as to prevent a short circuit between the gate electrode 8105 and another wiring. The sidewall insulator has a width of 5 nm. A source 8108a and a drain 8108b are provided in contact with the semiconductor region 8103a and the semiconductor region 8103c, respectively. Note that the channel width of this transistor is 40 nm.

The transistor of FIG. 26B is the same as the transistor of FIG. 26A in that it is formed over the base insulating layer 8101 and the embedded insulator 8102 formed of aluminum oxide and that it includes the semiconductor region 8103a, the semiconductor region 8103c, the intrinsic semiconductor region 8103b provided therebetween, the gate electrode 8105 having a width of 33 nm, the gate insulating layer 8104, the sidewall insulator 8106a, the sidewall insulator 8106b, the insulator 8107, the source 8108a, and the drain 8108b.

The transistor illustrated in FIG. 26A is different from the transistor illustrated in FIG. 26B in the conductivity type of semiconductor regions under the sidewall insulator 8106a and the sidewall insulator 8106b. In the transistor illustrated in FIG. 26A, the semiconductor regions under the sidewall insulator 8106a and the sidewall insulator 8106b are part of the semiconductor region 8103a and the semiconductor region 8103c having n$^+$-type conductivity, whereas in the transistor illustrated in FIG. 26B, the semiconductor regions under the sidewall insulator 8106a and the sidewall insulator 8106b are part of the intrinsic semiconductor region 8103b. In other words, in the semiconductor layer of FIG. 26B, a region having a width of $L_{off}$ which overlaps with neither the semiconductor region 8103a (the semiconductor region 8103c) nor the gate electrode 8105 is provided. This region is called an offset region, and the width $L_{off}$ is called an offset length.

As is seen from the drawing, the offset length is equal to the width of the sidewall insulator 8106*a* (the sidewall insulator 8106*b*).

Figure 23A:
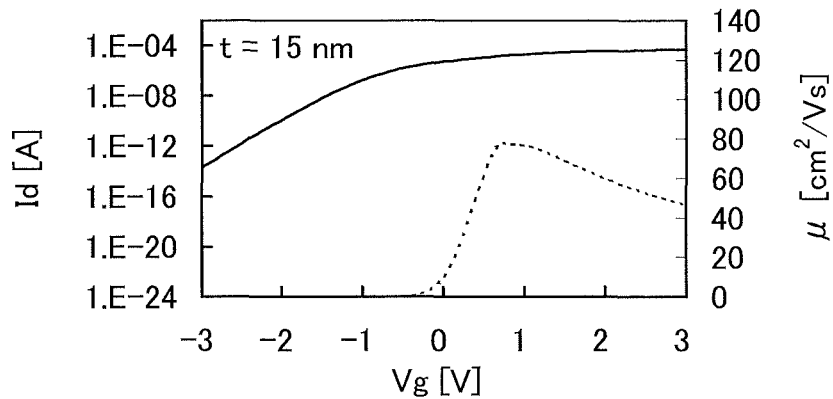
FIGS. 23A to 23C show gate voltage dependence of drain current and mobility obtained by calculation.
Figure 23B:
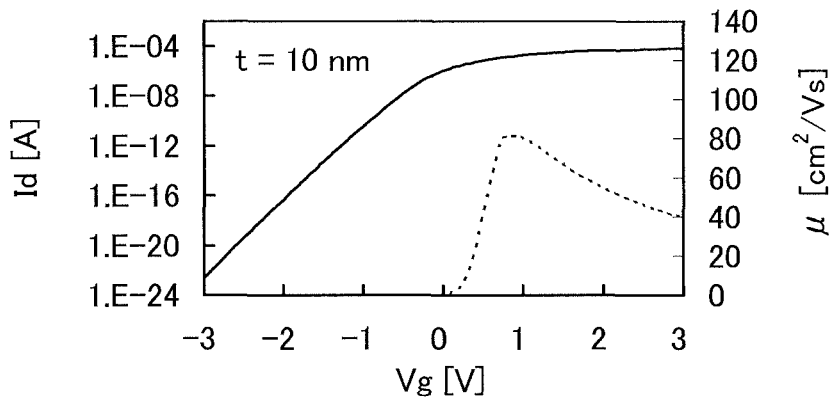
Figure 23C:
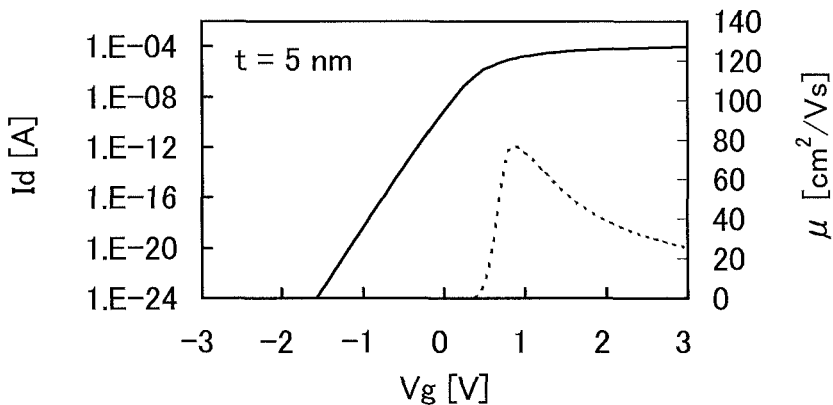

The other parameters used in calculation are as described above. For the calculation, device simulation software Sentaurus Device manufactured by Synopsys, Inc. was used. FIGS. 23A to 23C show the gate voltage ($V_g$: a potential difference between the gate and the source) dependence of the drain current ($I_d$, a solid line) and the mobility ($\mu$, a dotted line) of the transistor having the structure illustrated in FIG. 26A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 23A shows the transistor characteristics in the case where the thickness of the gate insulating layer is 15 nm, FIG. 23B shows the transistor characteristics in the case where the thickness of the gate insulating layer is 10 nm, and FIG. 23C shows the transistor characteristics in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility $\mu$ and the drain current $I_d$ (on-state current) in an on state. The graphs show that the drain current exceeds 10 $\mu$A, which is needed in a storage element and the like, at a gate voltage of around 1 V.

Figure 24A:
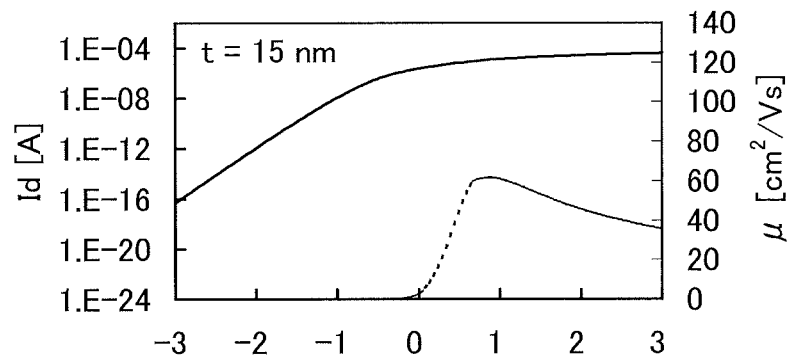
FIGS. 24A to 24C show gate voltage dependence of drain current and mobility obtained by calculation.
Figure 24B:
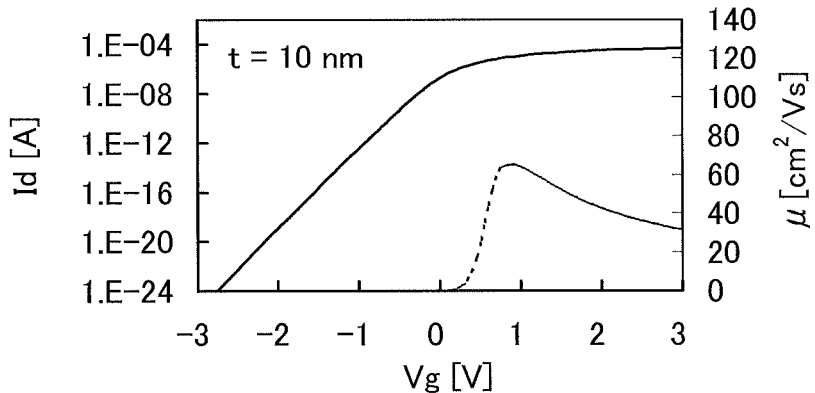
Figure 24C:
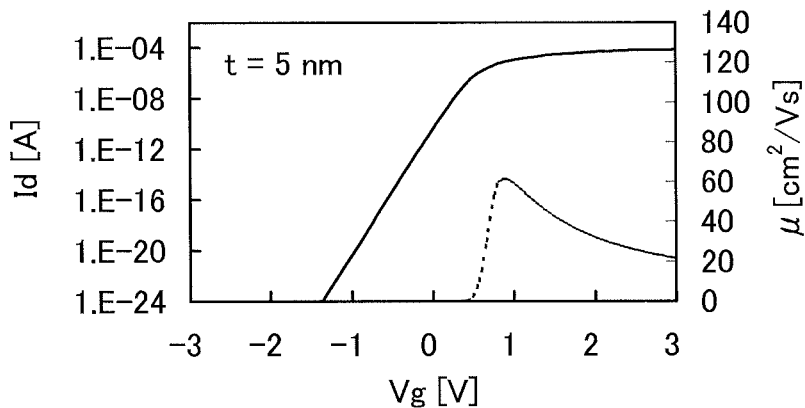

FIGS. 24A to 24C show the gate voltage $V_g$ dependence of the drain current $I_d$ (a solid line) and the mobility $\mu$ (a dotted line) of the transistor having the structure illustrated in FIG. 26B where the offset length $L_{off}$ is 5 nm. The drain current $I_d$ is obtained by calculation under the assumption that the drain voltage is +1 V and the mobility $\mu$ is obtained by calculation under the assumption that the drain voltage is +0.1 V. FIG. 24A shows the transistor characteristics in the case where the thickness of the gate insulating layer is 15 nm, FIG. 24B shows the transistor characteristics in the case where the thickness of the gate insulating layer is 10 nm, and FIG. 24C shows the transistor characteristics in the case where the thickness of the gate insulating layer is 5 nm.

Figure 25A:
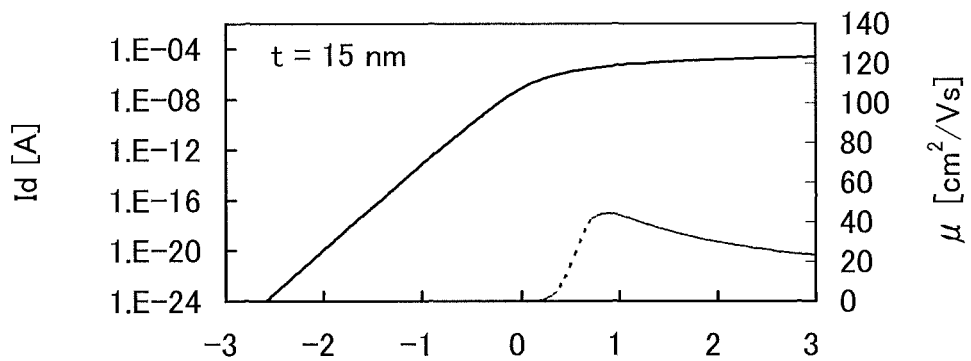
FIGS. 25A to 25C show gate voltage dependence of drain current and mobility obtained by calculation.
Figure 25B:
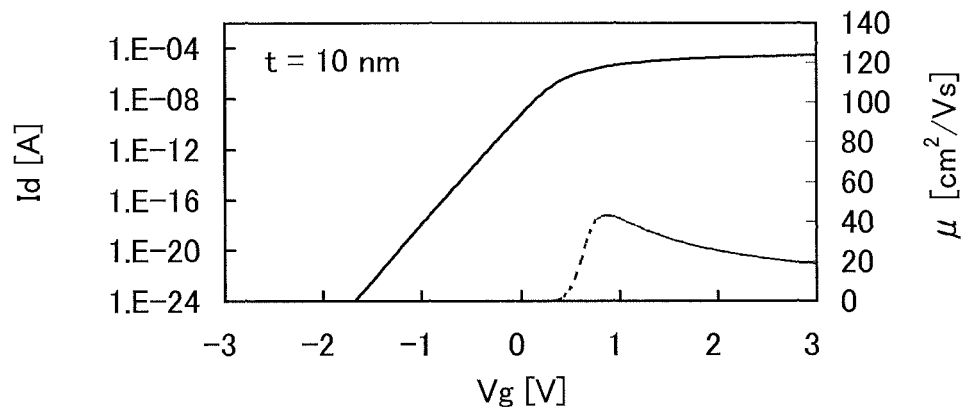
Figure 25C:
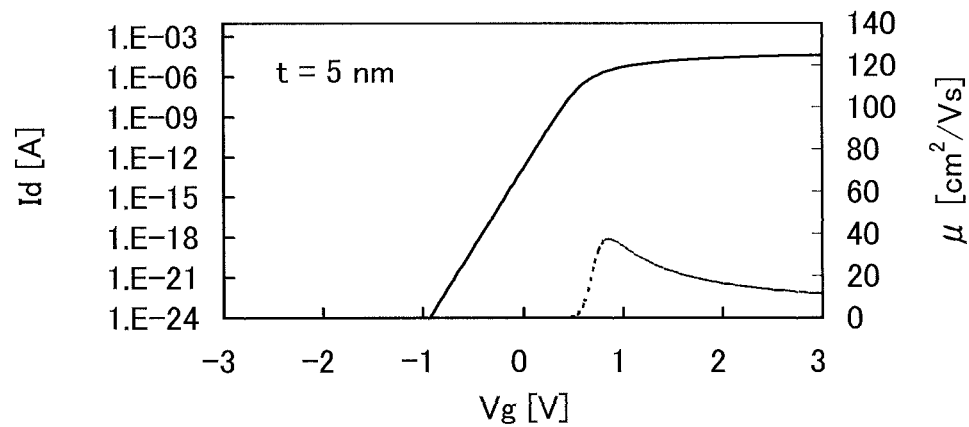
Figure 26A:
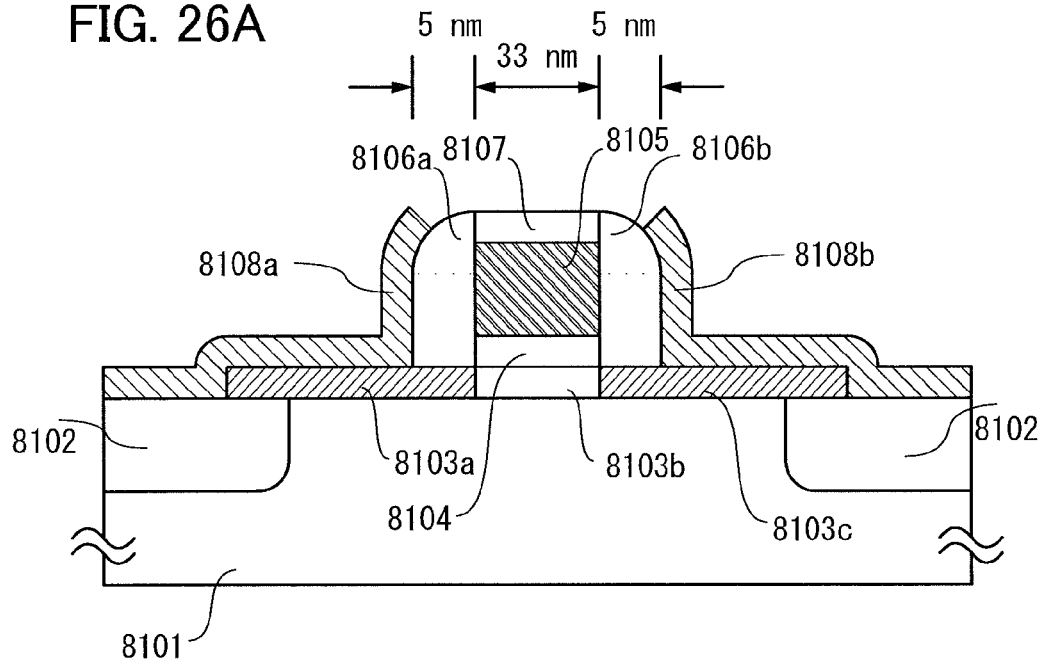
FIGS. 26A and 26B illustrate cross-sectional structures of transistors used for calculation.
Figure 26B:
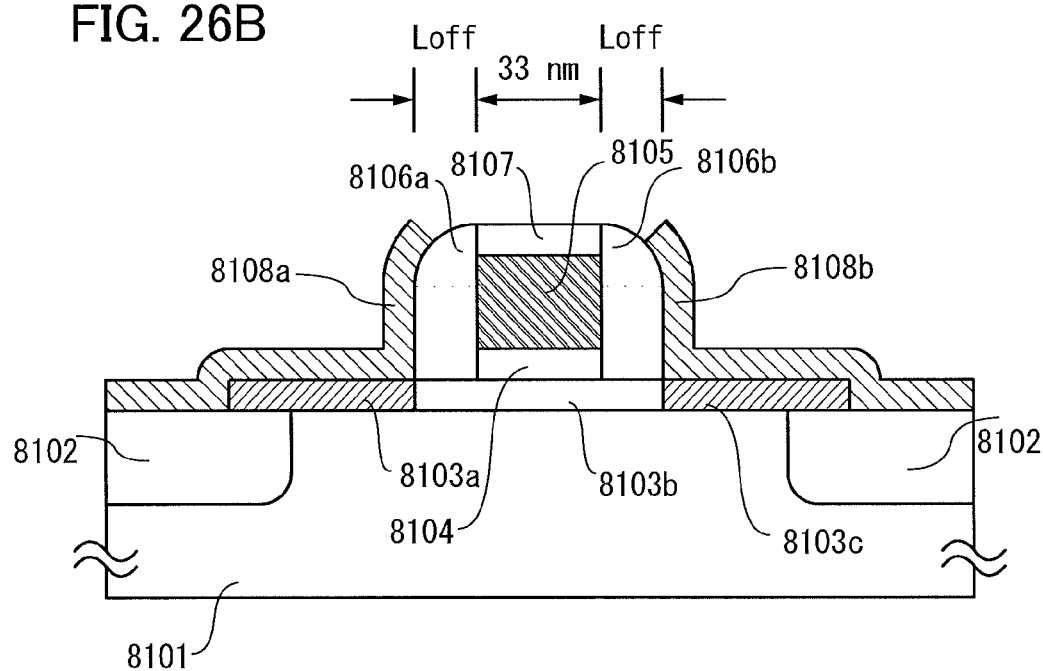

Further, FIGS. 25A to 25C show the gate voltage dependence of the drain current $I_d$ (a solid line) and the mobility $\mu$ (a dotted line) of the transistor having the structure illustrated in FIG. 26B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 25A shows the transistor characteristics in the case where the thickness of the gate insulating layer is 15 nm, FIG. 25B shows the transistor characteristics in the case where the thickness of the gate insulating layer is 10 nm, and FIG. 25C shows the transistor characteristics in the case where the thickness of the gate insulating layer is 5 nm.

In either of the structures, as the gate insulating layer is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 23A to 23C, approximately 60 cm$^2$/Vs in FIGS. 24A to 24C, and approximately 40 cm$^2$/Vs in FIGS. 25A to 25C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 $\mu$A, which is needed in a storage element and the like, at a gate voltage of around 1 V.

This embodiment can be combined as appropriate with any of the other embodiments.

Embodiment 10

In this embodiment, as an example of a transistor in which a channel is formed in an oxide semiconductor layer, a transistor in which an oxide semiconductor containing In, Sn, and Zn as main components is used as an oxide semiconductor will be described in detail. A transistor in which an oxide semiconductor containing In, Sn, and Zn as main components is used as a channel formation region can have favorable characteristics by depositing the oxide semiconductor while heating a substrate or by performing heat treatment after an oxide semiconductor film is formed. Note that a main component refers to an element included in a composition at 5 atomic % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 27A:
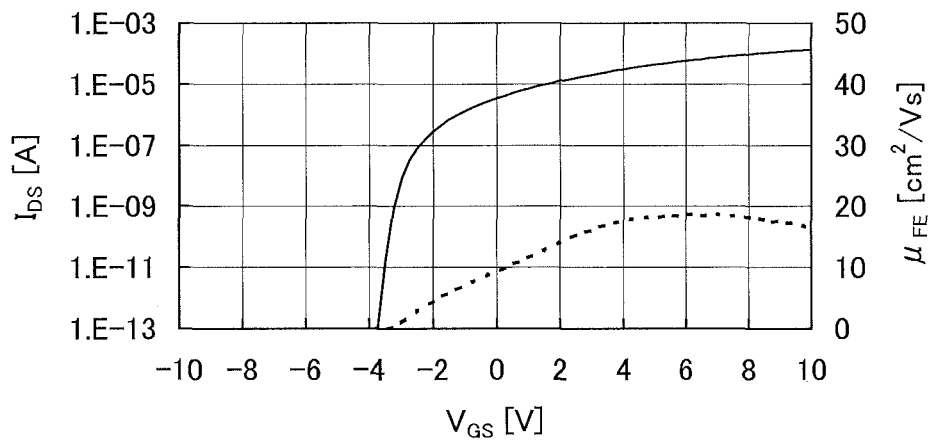
FIGS. 27A to 27C are graphs showing characteristics of transistors each including an oxide semiconductor film.
Figure 27B:
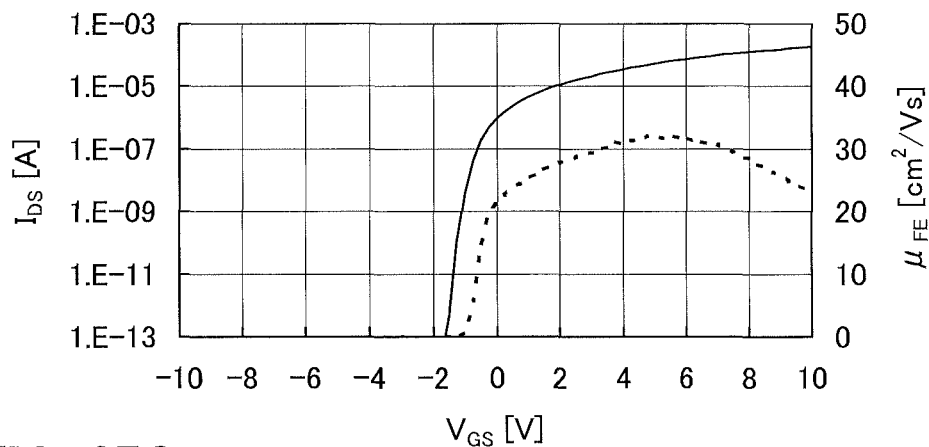
Figure 27C:
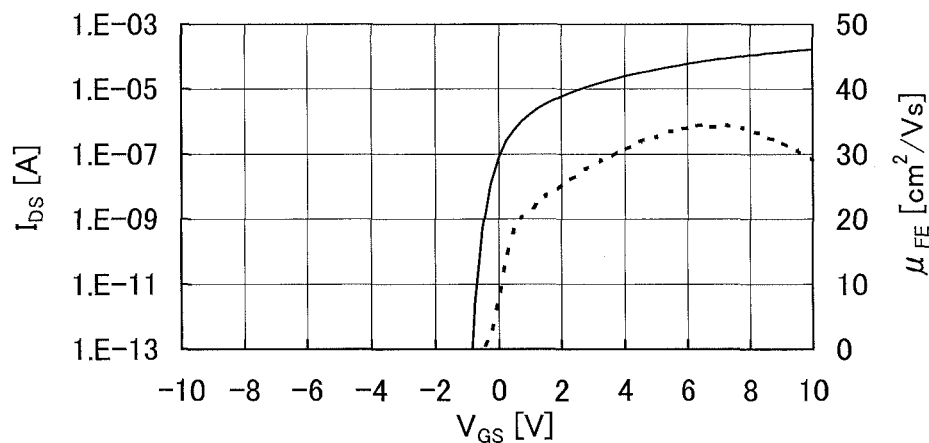

As an example, FIGS. 27A to 27C each show characteristics of a transistor in which an oxide semiconductor film containing In, Sn, and Zn as main components and having a channel length L of 3 $\mu$m and a channel width W of 10 $\mu$m, and a gate insulating layer with a thickness of 100 nm are used. Note that $V_d$ was set to 10 V.

FIG. 27A shows characteristics of a transistor whose oxide semiconductor film containing In, Sn, and Zn as main components is formed by a sputtering method without heating a substrate intentionally. The field-effect mobility obtained in this case is 18.8 cm$^2$/Vsec. On the other hand, when the oxide semiconductor film containing In, Sn, and Zn as main components is fowled while heating the substrate intentionally, the field-effect mobility can be improved. FIG. 27B shows characteristics of a transistor whose oxide semiconductor film containing In, Sn, and Zn as main components is formed while heating a substrate at 200° C. The field-effect mobility in this case is 32.2 cm$^2$/Vsec.

The field-effect mobility can be further improved by performing heat treatment after formation of the oxide semiconductor film containing In, Sn, and Zn as main components. FIG. 27C shows characteristics of a transistor whose oxide semiconductor film containing In, Sn, and Zn as main components is formed by sputtering at 200° C. and then subjected to heat treatment at 650° C. The field-effect mobility obtained in this case is 34.5 cm$^2$/Vsec.

The intentional heating of the substrate is expected to have an effect of reducing moisture taken into the oxide semiconductor film during the film formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 27A and 27B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_{ds}$ of 10 V. Note that $V_{ds}$ refers to a drain voltage (a potential difference between a drain and a source). Then, the substrate temperature was set to 150° C. and $V_{ds}$ was set to 0.1 V. After that, 20 V of $V_g$ was applied so that the intensity of an electric field applied to gate insulating layers was 2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a positive BT test.

In a similar manner, first, $V_g$-$I_d$ characteristics of the transistors were measured at a substrate temperature of 25° C. and $V_{ds}$ of 10 V. Then, the substrate temperature was set at 150° C. and $V_{ds}$ was set to 0.1 V. After that, −20 V of $V_g$ was applied so that the intensity of an electric field applied to the gate insulating layers was −2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a negative BT test.

Figure 28A:
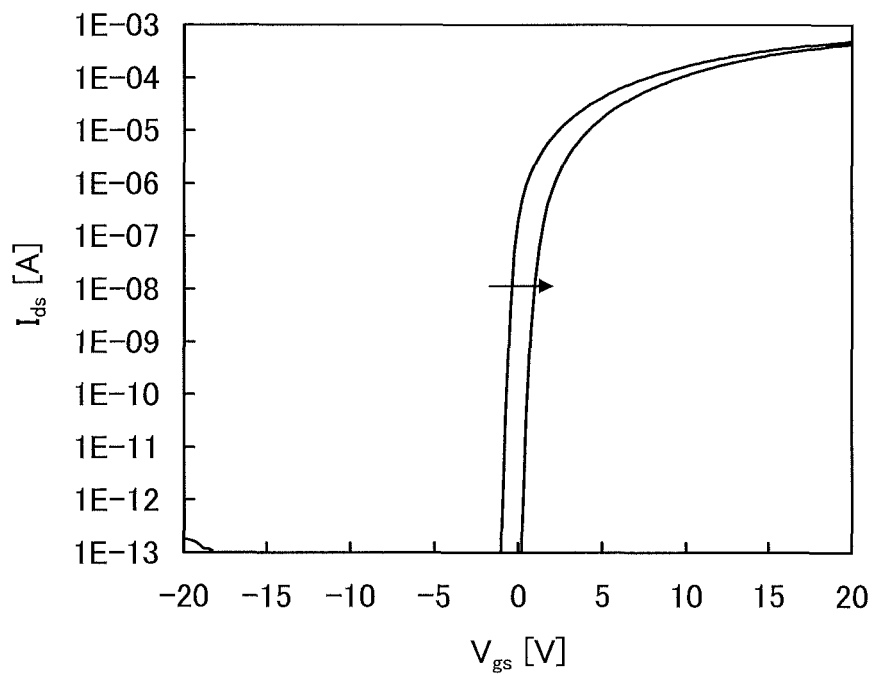
FIGS. 28A and 28B are graphs showing $V_g$-$I_d$ characteristics after a BT test of a transistor of Sample 1.
Figure 28B:
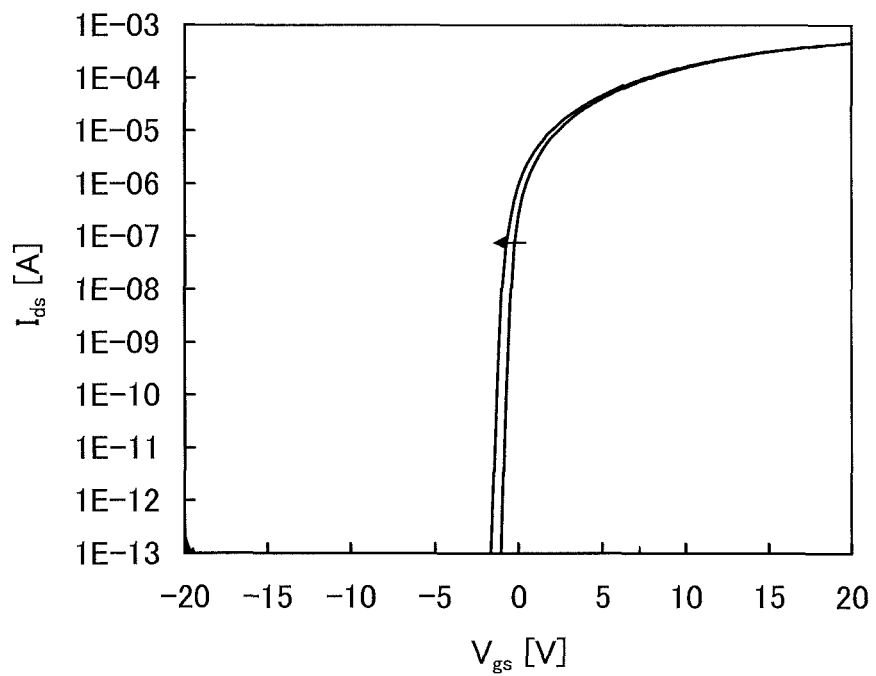
Figure 29A:
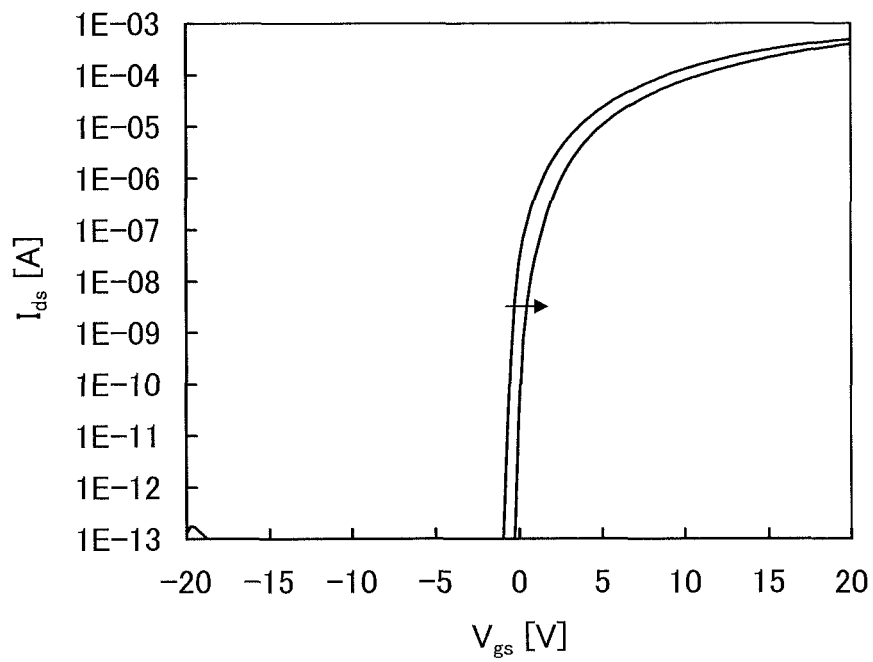
FIGS. 29A and 29B are graphs showing $V_g$-$I_d$ characteristics after a BT test of a transistor of Sample 2.
Figure 29B:
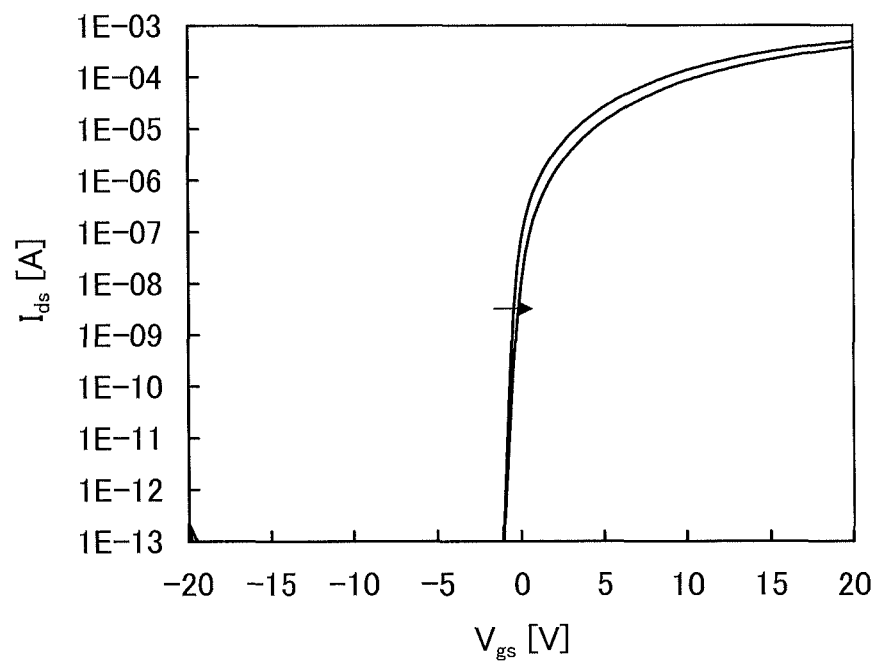

FIGS. 28A and 28B show a result of the positive BT test of Sample 1 and a result of the negative BT test of Sample 1, respectively. FIGS. 29A and 29B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1\times10^{16}$/cm$^3$ and lower than or equal to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target in which a composition ratio of In, Sn, and Zn is 1:1:1, without heating a substrate intentionally, is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. For the XRD analysis, an X-ray diffractometer D8 ADVANCE manufactured by Bruker AXS was used, and an out-of-plane method was employed.

Sample A and Sample B were prepared and the XRD analysis was performed thereon. A method for manufacturing Sample A and Sample B will be described below.

An In—Sn—Zn—O film with a thickness of 100 nm was formed over a In—Znuartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio: In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 30:
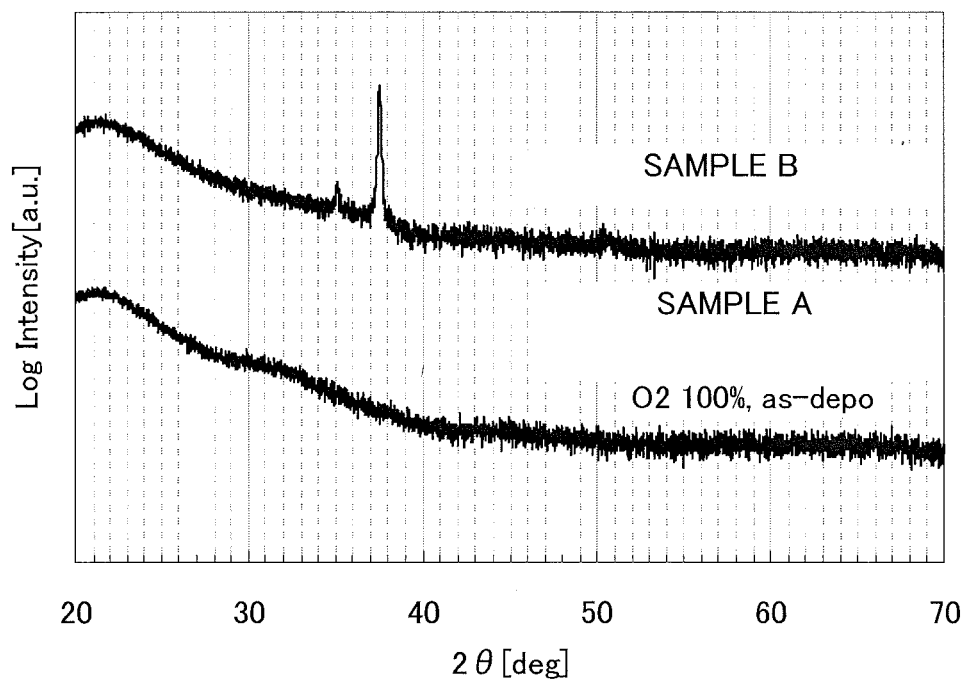
FIG. 30 shows XRD spectra of Sample A and Sample B.

FIG. 30 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current is used to indicate current per micrometer of a channel width.

Figure 31:
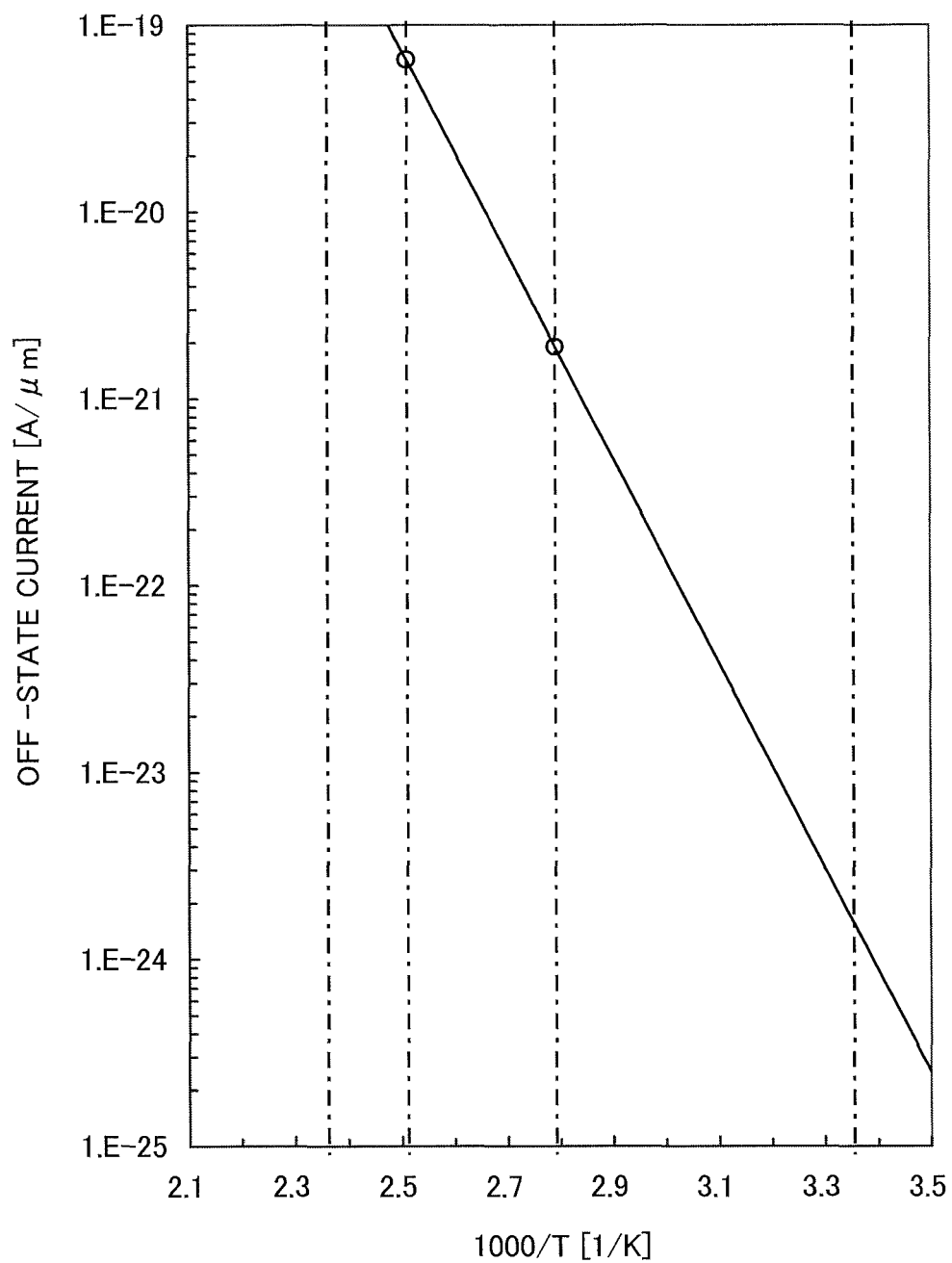
FIG. 31 is a graph showing a relation between the off-state current and the substrate temperature in measurement of a transistor.

FIG. 31 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 31, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/m) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor containing In, Sn, and Zn as main components by heat treatment, a film which does not contain moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement had a channel length L of 3 μm, a channel width W of 10 μm, $L_{ov}$ of 0 μm, and dW of 0 μm. Note that $V_{ds}$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as $L_{ov}$ and the width of a portion of the pair of electrodes, which does not overlap with an oxide semiconductor film, is referred to as dW.

Figure 32:
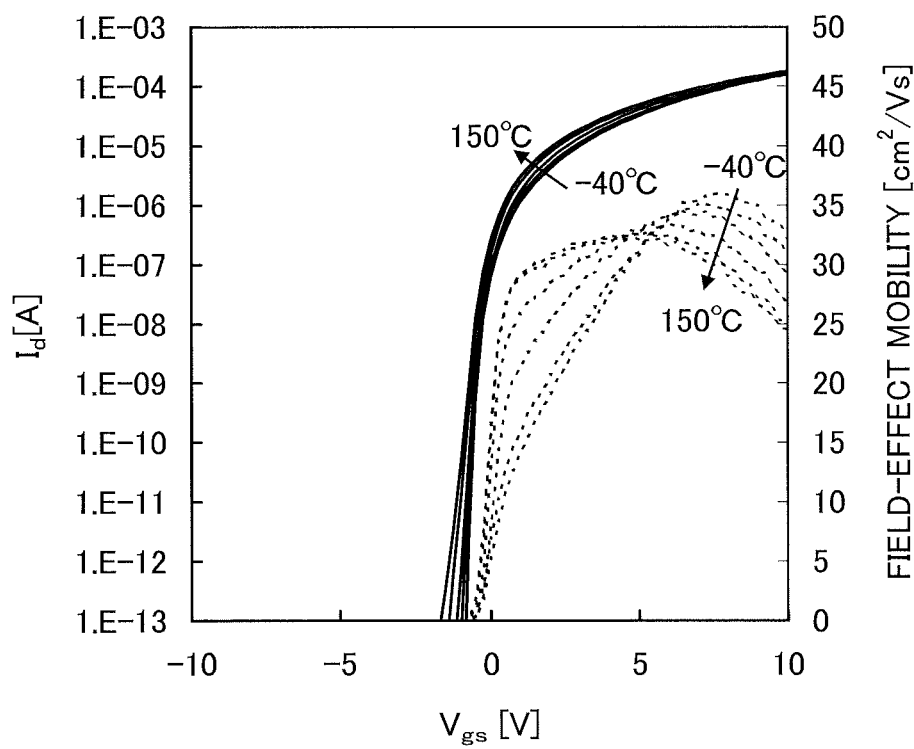
FIG. 32 is a graph showing $V_g$ dependence of $I_d$ and field-effect mobility.
Figure 33A:
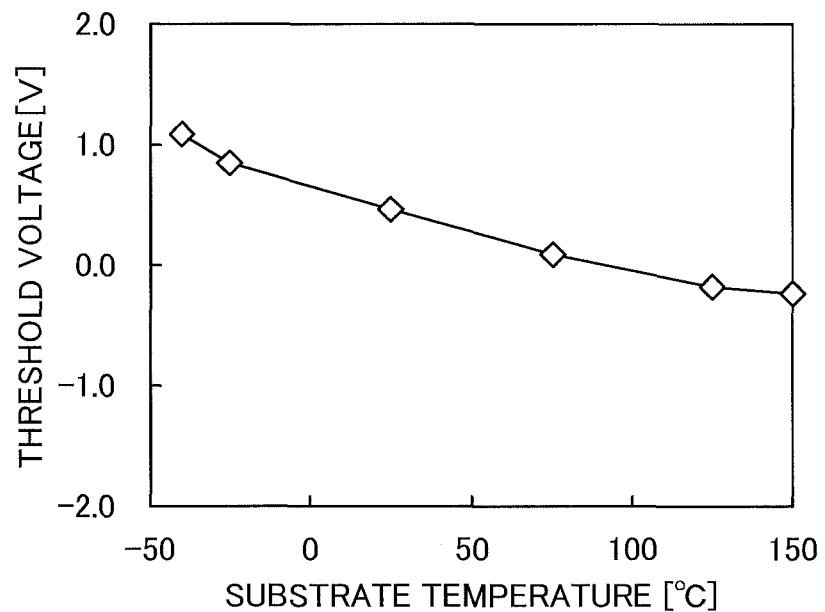
FIG. 33A is a graph showing a relation between the threshold voltage and the substrate temperature.

FIG. 32 shows the $V_g$ dependence of $I_d$ (a solid line) and field-effect mobility (a dotted line). FIG. 33A shows a relation between the substrate temperature and the threshold voltage, and FIG. 33B shows a relation between the substrate temperature and the field-effect mobility.

From FIG. 33A, it is found that the threshold voltage gets lower as the substrate temperature increases. Note that the threshold voltage is decreased from 1.09 V to −0.23 V in the range from −40° C. to 150° C.

Figure 33B:
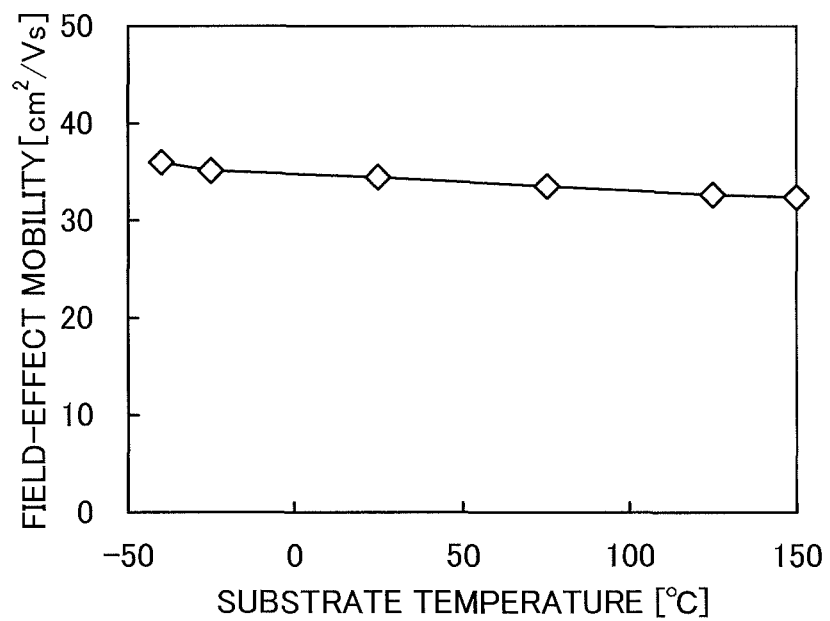
FIG. 33B is a graph showing a relation between the field-effect mobility and the substrate temperature.

From FIG. 33B, it is found that the field-effect mobility gets lower as the substrate temperature increases. Note that the field-effect mobility is decreased from 36 $cm^2$/Vs to 32 $cm^2$/Vs in the range from −40° C. to 150° C. Thus, it is found that variation in electric characteristics is small in the above temperature range.

In a transistor in which such an oxide semiconductor containing In, Sn, and Zn as main components is used as a channel formation region, a field-effect mobility of 30 $cm^2$/Vsec or higher, preferably 40 $cm^2$/Vsec or higher, further preferably 60 $cm^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

This embodiment can be combined as appropriate with any of the above-described embodiments.

Example 1

In this example, an example of a transistor including an In—Sn—Zn—O film as an oxide semiconductor layer in which a channel is formed will be described with reference to FIGS. 34A and 34B and the like.

Figure 34A:
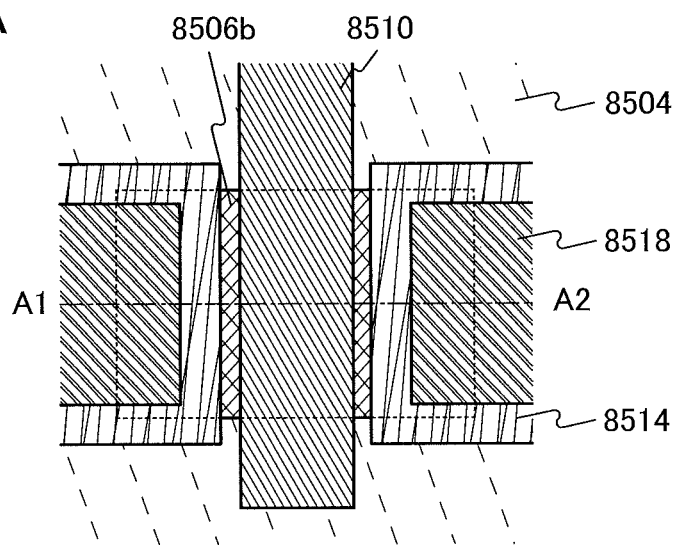
FIGS. 34A and 34B are a top view and a cross-sectional view of a transistor.
Figure 34B:
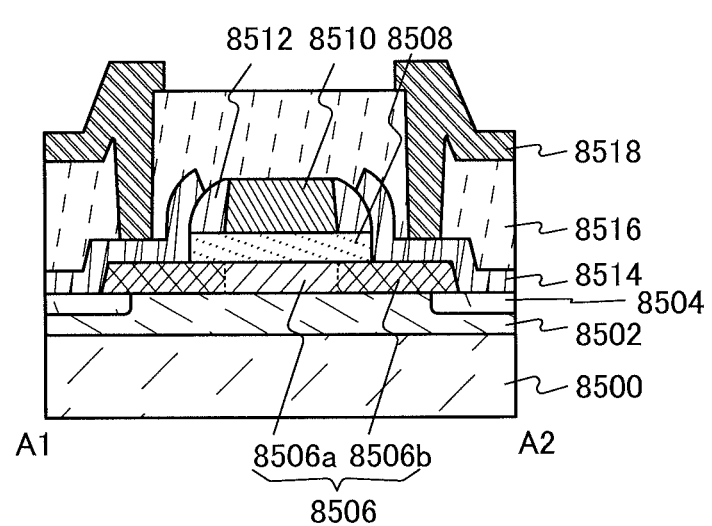

FIGS. 34A and 34B are a top view and a cross-sectional view of a coplanar transistor having a top-gate top-contact structure. FIG. 34A is the top view of the transistor. FIG. 34B illustrates cross section A1-A2 along dashed-dotted line A-B in FIG. 34A.

The transistor illustrated in FIG. 34B includes a substrate 8500; a base insulating layer 8502 provided over the substrate 8500; a protective insulating film 8504 provided in the periphery of the base insulating layer 8502; an oxide semiconductor layer 8506 provided over the base insulating layer 8502 and the protective insulating film 8504 and including a high-resistance region 8506a and low-resistance regions 8506b; a gate insulating layer 8508 provided over the oxide semiconductor layer 8506; a gate electrode 8510 provided to overlap with the oxide semiconductor layer 8506 with the gate insulating layer 8508 positioned therebetween; a sidewall insulating film 8512 provided in contact with a side surface of the gate electrode 8510; a pair of electrodes 8514 provided in contact with at least the low-resistance regions 8506*b*; an interlayer insulating film 8516 provided to cover at least the oxide semiconductor layer 8506, the gate electrode 8510, and the pair of electrodes 8514; and a wiring 8518 provided to be connected to at least one of the pair of electrodes 8514 through an opening formed in the interlayer insulating film 8516.

Although not illustrated, a protective film may be provided to cover the interlayer insulating film 8516 and the wiring 8518. With the protective film, a minute amount of leakage current generated by surface conduction of the interlayer insulating film 8516 can be reduced and thus the off-state current of the transistor can be reduced.

This example can be combined as appropriate with any of the above-described embodiments.

Example 2

In this embodiment, another example of a transistor in which an In—Sn—Zn—O film, which is different from that of the above example, is used as an oxide semiconductor layer will be described with reference to FIGS. 35A and 35B.

Figure 35A:
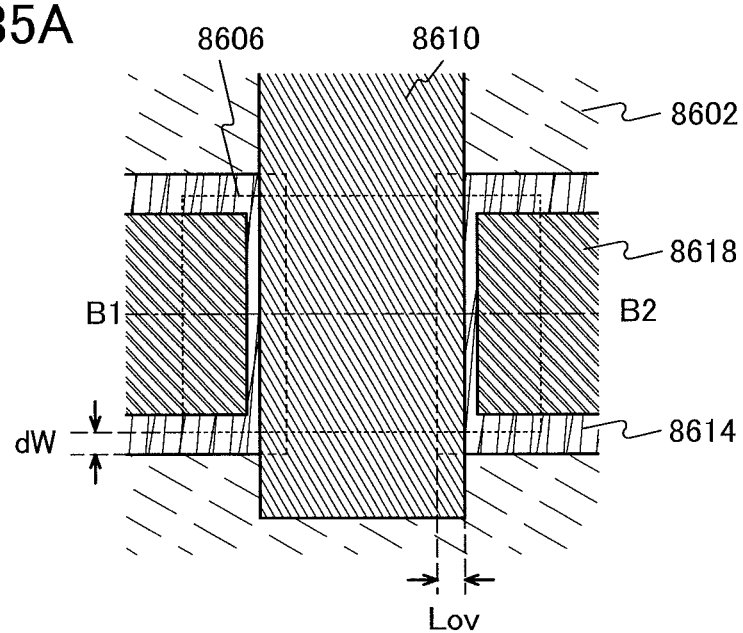
FIGS. 35A and 35B are a top view and a cross-sectional view of a transistor.
Figure 35B:
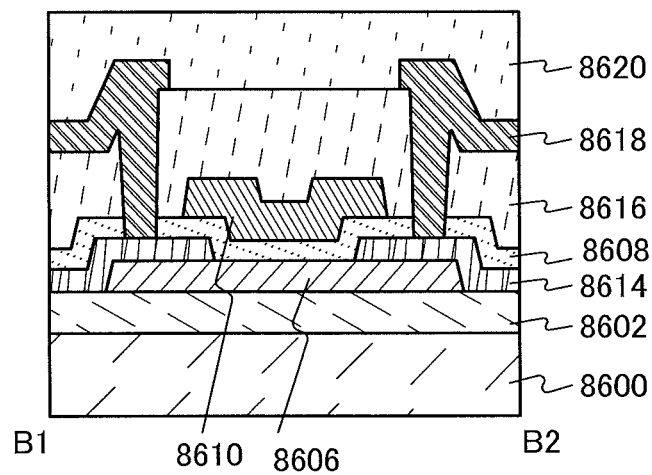

FIGS. 35A and 35B are a top view and a cross-sectional view which illustrates a structure of a transistor manufactured in this example. FIG. 35A is the top view of the transistor. FIG. 35B is a cross-sectional view along dashed-dotted line B1-B2 in FIG. 35A.

The transistor illustrated in FIG. 35B includes a substrate 8600; a base insulating layer 8602 provided over the substrate 8600; an oxide semiconductor layer 8606 provided over the base insulating layer 8602; a pair of electrodes 8614 in contact with the oxide semiconductor layer 8606; a gate insulating layer 8608 provided over the oxide semiconductor layer 8606 and the pair of electrodes 8614; a gate electrode 8610 provided to overlap with the oxide semiconductor layer 8606 with the gate insulating layer 8608 positioned therebetween; an interlayer insulating film 8616 provided to cover the gate insulating layer 8608 and the gate electrode 8610; wirings 8618 connected to the pair of electrodes 8614 through openings formed in the interlayer insulating film 8616; and a protective film 8620 provided to cover the interlayer insulating film 8616 and the wirings 8618.

As the substrate 8600, a glass substrate can be used. As the base insulating layer 8602, a silicon oxide film can be used. As the oxide semiconductor layer 8606, an In—Sn—Zn—O film can be used. As the pair of electrodes 8614, a tungsten film can be used. As the gate insulating layer 8608, a silicon oxide film can be used. The gate electrode 8610 can have a stacked structure of a tantalum nitride film and a tungsten film. The interlayer insulating film 8616 can have a stacked structure of a silicon oxynitride film and a polyimide film. The wirings 8618 can each have a stacked structure in which a titanium film, an aluminum film, and a titanium film are formed in this order. As the protective film 8620, a polyimide film can be used.

Note that in the transistor having the structure illustrated in FIG. 35A, the width of a portion where the gate electrode 8610 overlaps with one of the pair of electrodes 8614 is referred to as $L_{ov}$. Similarly, the width of a portion of the pair of electrodes 8614, which does not overlap with the oxide semiconductor layer 8606, is referred to as dW.

This example can be combined as appropriate with any of the above-described embodiments.

Example 3

With use of a signal processing circuit according to one embodiment of the present invention, a highly reliable electronic device and an electronic device with low power consumption can be provided. In particular, when to a portable electronic device which has difficulty in continuously receiving power, a signal processing circuit with low power consumption according to one embodiment of the present invention is added as a component of the device, an advantage in increasing the continuous operation time can be obtained.

The signal processing circuit according to one embodiment of the present invention can be used for display devices, personal computers, or image reproducing devices provided with recording media (typically, devices which reproduce the content of recording media such as digital versatile discs (DVDs) and have displays for displaying the reproduced images). Other than the above, as an electronic device which can employ the signal processing circuit according to one embodiment of the present invention, mobile phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are shown in FIGS. 18A to 18F.

Figure 18A:
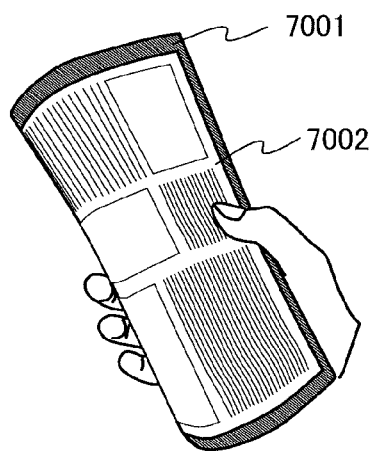
FIGS. 18A to 18F each illustrate a structure of an electronic device.

FIG. 18A illustrates an e-book reader including a housing 7001, a display portion 7002, and the like. The signal processing circuit according to one embodiment of the present invention can be used for an integrated circuit used for controlling driving of the e-book reader. With use of the signal processing circuit according to one embodiment of the present invention for the integrated circuit for controlling driving of the e-book reader, the e-book reader can reduce power consumption. When a flexible substrate is used, the signal processing circuit can have flexibility, whereby a user-friendly e-book reader which is flexible and lightweight can be provided.

Figure 18B:
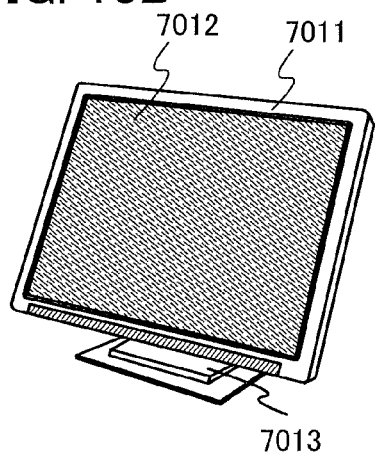

FIG. 18B illustrates a display device including a housing 7011, a display portion 7012, a supporting base 7013, and the like. The signal processing circuit according to one embodiment of the present invention can be used for an integrated circuit used for controlling driving of the display device. With use of the signal processing circuit according to one embodiment of the present invention for the integrated circuit for controlling driving of the display device, the display device can reduce power consumption. The display device includes in its category, any information display device for personal computers, TV broadcast reception, advertisement, and the like.

Figure 18C:
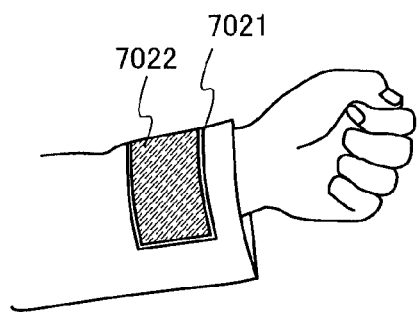

FIG. 18C illustrates a display device including a housing 7021, a display portion 7022, and the like. The signal processing circuit according to one embodiment of the present invention can be used for an integrated circuit used for controlling driving of the display device. With use of the signal processing circuit according to one embodiment of the present invention for the integrated circuit for controlling driving of the display device, the display device can reduce power consumption. Moreover, with use of a flexible substrate, the signal processing circuit can have flexibility. Thus, a user-friendly display device which is flexible and lightweight can be provided. Accordingly, as illustrated in FIG. 18C, such a display device can be used while being fixed to fabric or the like, and an application range of the display device is dramatically widened.

Figure 18D:
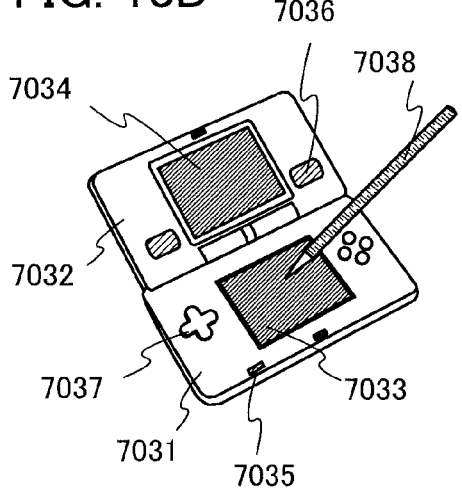

FIG. 18D illustrates a portable game machine including a housing 7031, a housing 7032, a display portion 7033, a display portion 7034, a microphone 7035, speakers 7036, operation keys 7037, a stylus 7038, and the like. The signal processing circuit according to one embodiment of the present invention can be used for an integrated circuit used for controlling driving of the portable game machine. With use of the signal processing circuit according to one embodiment of the present invention for the integrated circuit for controlling driving of the portable game machine, the portable game machine can reduce power consumption. Although the portable game machine illustrated in FIG. 18D has the two display portions 7033 and 7034, the number of display portions included in the portable game machines is not limited thereto.

Figure 18E:
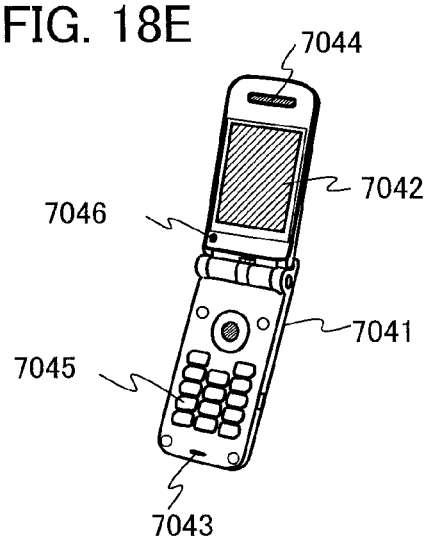

FIG. 18E illustrates a mobile phone including a housing 7041, a display portion 7042, an audio-input portion 7043, an audio-output portion 7044, operation keys 7045, a light-receiving portion 7046, and the like. Light received in the light-receiving portion 7046 is converted into electrical signals, whereby external images can be loaded. The signal processing circuit according to one embodiment of the present invention can be used for an integrated circuit used for controlling driving of the mobile phone. With use of the signal processing circuit according to one embodiment of the present invention for the integrated circuit for controlling driving of the mobile phone, the mobile phone can reduce power consumption.

Figure 18F:
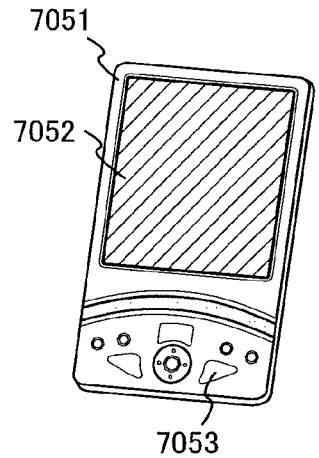

FIG. 18F illustrates a portable information terminal including a housing 7051, a display portion 7052, operation keys 7053, and the like. In the portable information terminal illustrated in FIG. 18F, a modem may be incorporated in the housing 7051. The signal processing circuit according to one embodiment of the present invention can be used for an integrated circuit used for controlling driving of the portable information terminal. With use of the signal processing circuit according to one embodiment of the present invention for the integrated circuit for controlling driving of the portable information terminal, a portable information terminal can reduce power consumption.

This example can be combined as appropriate with any of the above-described embodiments and examples.

This application is based on Japanese Patent Application serial no. 2010-189214 and filed with Japan Patent Office on Aug. 26, 2010 and Japanese Patent Application serial no. 2011-113178 filed with Japan Patent Office on May 20, 2011, the entire contents of which are hereby incorporated by reference.

What is claimed is:

1. A signal processing circuit comprising:
an arithmetic circuit; and
a storage device configured to store data from the arithmetic circuit, the storage device comprising a storage element,
the storage element comprising an input terminal, an output terminal, a first inverter, a second inverter, a first selection transistor, a second selection transistor, a first transistor, a second transistor, a first capacitor, and a second capacitor,
wherein each of the first transistor and the second transistor comprises an oxide semiconductor layer including a channel,
wherein an input terminal of the first inverter is electrically connected to the input terminal of the storage element via the first selection transistor and the second transistor,
wherein of an output terminal of the first inverter is electrically connected to the output terminal of the storage element via the second selection transistor,
wherein the output terminal of the first inverter is electrically connected to an input terminal of the second inverter via the first transistor,
wherein an output terminal of the second inverter is electrically connected to the input terminal of the first inverter via the second transistor,
wherein an electrode of the first capacitor is electrically connected to the input terminal of the second inverter, and
wherein an electrode of the second capacitor is electrically connected to the input terminal of the first inverter.

2. The signal processing circuit according to claim 1, wherein the first inverter and the second inverter are an inverter or a clocked inverter.

3. The signal processing circuit according to claim 1, wherein the oxide semiconductor layer comprises an In—Ga—Zn—O-based oxide semiconductor.

4. The signal processing circuit according to claim 2, wherein the oxide semiconductor layer comprises an In—Ga—Zn—O-based oxide semiconductor.

5. A method for driving a signal processing circuit comprising a storage element, the storage element comprising a first inverter, a second inverter, a first selection transistor, a second selection transistor, a first transistor, a second transistor, a first capacitor, and a second capacitor, wherein each of the first transistor and the second transistor comprises an oxide semiconductor layer including a channel, wherein an input terminal of the first inverter is electrically connected to the input terminal of the storage element via the first selection transistor and the second transistor, wherein an output terminal of the first inverter is electrically connected to the output terminal of the storage element via the second selection transistor, wherein the output terminal of the first inverter is electrically connected to an input terminal of the second inverter via the first transistor, wherein an output terminal of the second inverter is electrically connected to the input terminal of the first inverter via the second transistor, wherein an electrode of the first capacitor is electrically connected to the input terminal of the second inverter, and wherein an electrode of the second capacitor is electrically connected to the input terminal of the first inverter, the method comprising the steps of:
supplying a potential of data to an input terminal of the first inverter via the first selection transistor and the second transistor;
outputting a potential of an output terminal of the first inverter as an output signal via the second selection transistor;
supplying a potential of the output terminal of the first inverter to an input terminal of the second inverter via the first transistor;
supplying a potential of an output terminal of the second inverter to the input terminal of the first inverter via the second transistor; and
turning off the first transistor and the second transistor, before stopping the supply of the power-supply voltage to the first inverter and the second inverter.

6. The method for driving a signal processing circuit according to claim 5, wherein the first transistor and the second transistor are controlled so that when one of the first transistor and the second transistor is in an on state, the other is in an on state.

7. The method for driving a signal processing circuit according to claim 5,
wherein the first transistor and the second transistor have the same conductivity type, and
wherein a first control signal input to a gate of the first transistor and a second control signal input to a gate of the second transistor are the same signal.

8. The method for driving a signal processing circuit according to claim 6,
wherein the first transistor and the second transistor have the same conductivity type, and
wherein a first control signal input to a gate of the first transistor and a second control signal input to a gate of the second transistor are the same signal.

9. A storage device comprising:
a storage element comprising an input terminal, an output terminal, a first inverter, a second inverter, a first selection transistor, a second selection transistor, a first transistor, a second transistor, a first capacitor, and a second capacitor,
wherein each of the first transistor and the second transistor comprises an oxide semiconductor layer including a channel,
wherein an input terminal of the first inverter is electrically connected to the input terminal of the storage element via the first selection transistor and the second transistor,
wherein an output terminal of the first inverter is electrically connected to the output terminal of the storage element via the second selection transistor,
wherein the output terminal of the first inverter is electrically connected to an input terminal of the second inverter via the first transistor,
wherein an output terminal of the second inverter is electrically connected to the input terminal of the first inverter via the second transistor,
wherein an electrode of the first capacitor is electrically connected to the input terminal of the second inverter, and
wherein an electrode of the second capacitor is electrically connected to the input terminal of the first inverter.

10. The storage device according to claim 9, wherein the first inverter and the second inverter are an inverter or a clocked inverter.

11. The storage device according to claim 9, wherein the oxide semiconductor layer comprises an In—Ga—Zn—O-based oxide semiconductor.

12. The storage device according to claim 10, wherein the oxide semiconductor layer comprises an In—Ga—Zn—O-based oxide semiconductor.

* * * * *

UNITED STATES PATENT AND TRADEMARK OFFICE
CERTIFICATE OF CORRECTION

PATENT NO. : 8,787,073 B2  Page 1 of 1
APPLICATION NO. : 13/215302
DATED : July 22, 2014
INVENTOR(S) : Shunpei Yamazaki and Jun Koyama It is certified that error appears in the above-identified patent and that said Letters Patent is hereby corrected as shown below:

In the Specification

Column 17, line 57 – replace "$10^{19}/cm^3$" with --$10^{10}/cm^3$--;

Column 23, line 43 – replace "fowled" with --formed--;

Column 39, line 39 – replace "O" with --0--;

Column 39, line 49 – replace "O" with --0--;

Column 39, line 57 – replace "O" with --0--;

Column 40, line 38 – replace "fanned" with --formed--;

Column 40, line 40 – replace "O" with --0--;

Column 42, line 58 – replace "£" with --ε--;

Column 46, line 38 – replace "fowled" with --formed--;

Column 48, line 38 – replace "$2\times10^{2o}/cm^3$" with --$2\times10^{20}/cm^3$--;

Column 48, line 60 – replace "In—Znuartz" with --quartz--;

Column 50, line 7 – after "$L_{ov}$" insert --,--; and

In the Claims

Column 53, line 62, claim 1 – after "wherein" delete "of".

Signed and Sealed this
Ninth Day of June, 2015

Michelle K. Lee
*Director of the United States Patent and Trademark Office*